US012648316B2

(12) United States Patent
Zhang et al.

(10) Patent No.: US 12,648,316 B2
(45) Date of Patent: Jun. 2, 2026

(54) DISPLAY SUBSTRATE AND DISPLAY APPARATUS INCLUDING TWO DISPLAY REGIONS

(71) Applicants: Beijing BOE Technology Development Co., Ltd., Beijing (CN); BOE Technology Group Co., Ltd., Beijing (CN)

(72) Inventors: Yuxin Zhang, Beijing (CN); Lili Du, Beijing (CN); Jingquan Wang, Beijing (CN); Xueguang Hao, Beijing (CN); Xinguo Li, Beijing (CN)

(73) Assignees: Beijing BOE Technology Development Co., Ltd., Beijing (CN); BOE Technology Group Co., Ltd, Beijing (CN)

( * ) Notice: Subject to any disclaimer, the term of this patent is extended or adjusted under 35 U.S.C. 154(b) by 447 days.

(21) Appl. No.: 18/034,076

(22) PCT Filed: Apr. 19, 2022

(86) PCT No.: PCT/CN2022/087752
§ 371 (c)(1),
(2) Date: Apr. 27, 2023

(87) PCT Pub. No.: WO2023/201537
PCT Pub. Date: Oct. 26, 2023

(65) Prior Publication Data
US 2024/0324372 A1      Sep. 26, 2024

(51) Int. Cl.
*H10K 59/131* (2023.01)
*H10K 59/121* (2023.01)
(Continued)

(52) U.S. Cl.
CPC ..... *H10K 59/1315* (2023.02); *H10K 59/1213* (2023.02); *H10K 59/65* (2023.02); *H10K 59/88* (2023.02)

(58) Field of Classification Search
CPC .......... H10K 59/1315; H10K 59/1213; H10K 59/65; H10K 59/88; H10D 86/60;
(Continued)

(56) References Cited

U.S. PATENT DOCUMENTS 10,714,557 B2 * 7/2020 Lee ...................... H10K 59/131
11,004,874 B2 * 5/2021 Zhou ...................... H10D 86/60
(Continued)

FOREIGN PATENT DOCUMENTS

CN 208386618 U 1/2019
CN 110211972 A 9/2019
(Continued)

OTHER PUBLICATIONS

European Search Report for 22937775.9 Mailed Dec. 23, 2024.

*Primary Examiner* — Tan N Tran

(74) *Attorney, Agent, or Firm* — Ling Wu; Stephen Yang; Ling and Yang Intellectual Property

(57) ABSTRACT

A display substrate includes a base substrate (100), multiple first pixel circuits (11), multiple second active pixel circuits (12), multiple first light-emitting elements (13), multiple second light-emitting elements (14) and at least one first data line (21). The first data line (21) includes a first sub-data line (211) and a second sub-data line (212). The first sub-data (Continued)

line (211) is electrically connected with the multiple first pixel circuits (11) arranged along a first direction (D1), and the second sub-data line (212) is electrically connected with the multiple second active pixel circuits (12) arranged along the first direction (D1). The first sub-data line (211) and the second sub-data line (212) are electrically connected through a first transfer line (214), and the first transfer line (214) is located in a peripheral region (BB) and between a signal access region (B14) and a display region (AA).

19 Claims, 33 Drawing Sheets

(51) Int. Cl.
   *H10K 59/65*        (2023.01)
   *H10K 59/88*        (2023.01)
(58) Field of Classification Search
   CPC ......... H10D 86/441; G09G 2300/0413; G09G 2300/0861; G09G 3/3233; G09G 2300/0426; G09G 2300/0819; G09G 2300/0842
   See application file for complete search history.

(56) References Cited

U.S. PATENT DOCUMENTS

| | | | | |
|---|---|---|---|---|
| 2018/0101044 | A1* | 4/2018 | Oka | G02F 1/1339 |
| 2021/0083023 | A1 | 3/2021 | Zheng et al. | |
| 2022/0069047 | A1 | 3/2022 | Yang et al. | |
| 2022/0123088 | A1 | 4/2022 | Shi et al. | |
| 2022/0123094 | A1 | 4/2022 | Qiu et al. | |
| 2022/0320251 | A1 | 10/2022 | Cai et al. | |
| 2022/0376028 | A1 | 11/2022 | Huang et al. | |
| 2023/0337492 | A1 | 10/2023 | Feng et al. | |

FOREIGN PATENT DOCUMENTS

| | | | | |
|---|---|---|---|---|
| CN | 110993652 | A | | 4/2020 |
| CN | 210429820 | U | | 4/2020 |
| CN | 111326560 | A | * | 6/2020 |
| CN | 111725287 | A | | 9/2020 |
| CN | 113160742 | A | | 7/2021 |
| CN | 113178473 | A | | 7/2021 |
| CN | 113488600 | A | | 10/2021 |
| CN | 113745274 | A | | 12/2021 |
| CN | 113764462 | A | | 12/2021 |
| WO | 2021147160 | A1 | | 7/2021 |
| WO | 2021239112 | A1 | | 12/2021 |

* cited by examiner

DISPLAY SUBSTRATE AND DISPLAY APPARATUS INCLUDING TWO DISPLAY REGIONS

CROSS-REFERENCE TO RELATED APPLICATION

The present application is a U.S. National Phase Entry of International Application No. PCT/CN2022/087752 having an international filing date of Apr. 19, 2022, the content of which is incorporated into this application by reference.

TECHNICAL FIELD

The present disclosure relates to, but is not limited to, the field of display technology, in particular to a display substrate and a display apparatus.

BACKGROUND

An Organic Light Emitting Diode (OLED) and a Quantum dot Light Emitting Diode (QLED) are active light emitting display devices and have advantages of self-illumination, a wide viewing angle, a high contrast ratio, low power consumption, an extremely high response speed, lightness and thinness, bendability, and a low cost, etc. An under display camera technology is a brand-new technology proposed to increase a screen-to-body ratio of a display apparatus.

SUMMARY

The following is a summary of subject matters described herein in detail. The summary is not intended to limit the protection scope of claims.

Embodiments of the present disclosure provide a display substrate and a display apparatus.

In one aspect, an embodiment of the present disclosure provides a display substrate. The display substrate includes a base substrate, multiple first pixel circuits, multiple second active pixel circuits, multiple first light-emitting elements, multiple second light-emitting elements, and at least one first data line. The base substrate includes a display region and a peripheral region located on a periphery of the display region. The display region includes a first display region and a second display region and the first display region is located on at least one side of the second display region. The peripheral region includes a signal access region located on a side of the display region along a first direction. Multiple first pixel circuits, multiple second active pixel circuits, and multiple first light-emitting elements are located in the first display region. Multiple second light-emitting elements are located in the second display region. At least one first pixel circuit of the multiple first pixel circuits is electrically connected with at least one first light-emitting element of the multiple first light-emitting elements, and the at least one first pixel circuit is configured to drive the at least one first light-emitting element to emit light. At least one second active pixel circuit of the multiple second active pixel circuits is electrically connected with at least one second light-emitting element of the multiple second light-emitting elements, and the at least one second active pixel circuit is configured to drive the at least one second light-emitting element to emit light. At least one first data line includes a first sub-data line and a second sub-data line. The first sub-data line is electrically connected with multiple first pixel circuits arranged along the first direction, and the second sub-data line is electrically connected with multiple second active pixel circuits arranged along the first direction. The first sub-data line and the second sub-data line are electrically connected through a first transfer line, and the first transfer line is located in the peripheral region and between the signal access region and the display region.

In some exemplary implementations, the first transfer line extends along a second direction, and the second direction intersects with the first direction.

In some exemplary implementations, the peripheral region further includes: a first trace lead-out region, a bending region, and a second trace lead-out region located on a side of the signal access region close to the display region. The first trace lead-out region, the bending region, and the second trace lead-out region are sequentially disposed along a side away from the display region, and the first transfer line is located in the first trace lead-out region or the second trace lead-out region.

In some exemplary implementations, the at least one first data line further includes a third sub-data line. The third sub-data line is located on a side of the second display region away from the signal access region in the first direction; the third sub-data line is electrically connected with multiple first pixel circuits arranged along the first direction. The third sub-data line is electrically connected with the second sub-data line through a second transfer line.

In some exemplary implementations, the first pixel circuits with which the third sub-data line is electrically connected is in a same column as the first pixel circuits with which the first sub-data line is electrically connected.

In some exemplary implementations, the second transfer line is located in the first display region; or, the second transfer line is located in a second bezel region, and the second bezel region is located on a side of the display region away from the signal access region in the first direction.

In some exemplary implementations, the display substrate further includes multiple dummy pixel circuits located in the first display region. A second sub-data line of the at least one first data line is at least partially overlapped with the multiple dummy pixel circuits, and multiple second active pixel circuits electrically connected with the second sub-data line and the multiple dummy pixel circuits overlapped with the second sub-data line are sequentially arranged along the first direction.

In some exemplary implementations, the second sub-data line of the at least one first data line includes a first trace and a second trace, the first trace is electrically connected with the second trace, the second trace is located on a side of the first trace away from the base substrate, and an orthographic projection of the first trace on the base substrate is overlapped with an orthographic projection of the second trace on the base substrate.

In some exemplary implementations, the display substrate further includes at least one fourth data line, and the fourth data line includes a fourth sub-data line and a fifth sub-data line. The fourth sub-data line is electrically connected with multiple first pixel circuits arranged along the first direction and the fifth sub-data line is electrically connected with multiple second active pixel circuits arranged along the first direction. The fourth sub-data line and the fifth sub-data line of the fourth data line are electrically connected through a third transfer line and the third transfer line is located in the first display region.

In some exemplary implementations, the display substrate includes multiple fourth data lines, and multiple third transfer lines electrically connected with the multiple fourth data lines have a same length.

In some exemplary implementations, the third transfer line extends along a second direction and the second direction intersects with the first direction.

In some exemplary implementations, at least one third transfer line includes a first connection part and an extension part, a first end of the first connection part is electrically connected with the fourth sub-data line, a second end of the first connection part is electrically connected with the fifth sub-data line, and one end of the extension part is electrically connected with the second end of the first connection part.

In some exemplary implementations, the third transfer line is electrically connected with a first pixel circuit closest to the second display region in the multiple first pixel circuits electrically connected with the fourth sub-data line.

In some exemplary implementations, at least two third transfer lines in the first direction are arranged between two adjacent rows of pixel circuits in the first display region.

In some exemplary implementations, in the first display region at least one row of pixel circuits is arranged between two adjacent third transfer lines in the first direction.

In some exemplary implementations, lengths of multiple third transfer lines are gradually increased along a direction away from a side of the second display region in the first direction.

In some exemplary implementations, the second display region has a first center line in the second direction, and a first sub-data line close to the first center line is electrically connected with a second sub-data line close to the second display region; or, a first sub-data line close to the first center line is electrically connected with a second sub-data line away from the second display region; the second direction intersects with the first direction.

In some exemplary implementations, the first transfer line is located on a side of the first data line away from the base substrate.

In some exemplary implementations, the display substrate further includes a multiplexing circuit. The multiplexing circuit is configured to transmit data signals to the first sub-data line and the second sub-data line in a time division manner.

In another aspect, an embodiment of the present disclosure provides a display apparatus. The display apparatus includes the aforementioned mentioned display substrate and a photosensitive sensor located on a side of a non-display surface of the display substrate, wherein an orthographic projection of the photosensitive sensor on the display substrate is overlapped with the first display region of the display substrate.

Other aspects may be understood upon reading and understanding the drawings and detailed description.

BRIEF DESCRIPTION OF DRAWINGS

Accompanying drawings are used for providing further understanding of technical solutions of the present disclosure, constitute a part of the specification, and together with the embodiments of the present disclosure, are used for explaining the technical solutions of the present disclosure but not to constitute limitations on the technical solutions of the present disclosure. Shapes and sizes of one or more components in the drawings do not reflect true scales, and are only intended to schematically describe contents of the present disclosure.

DETAILED DESCRIPTION

Figure 1:
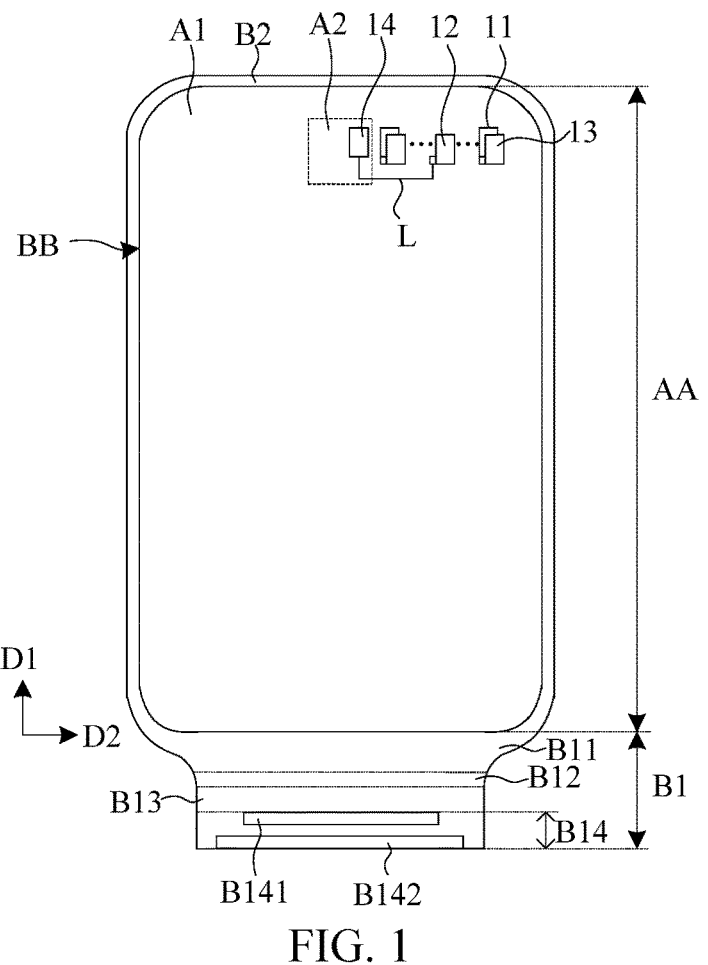
FIG. 1 is a schematic diagram of a display substrate according to at least one embodiment of the present disclosure.

Embodiments of the present disclosure will be described below in combination with the drawings in detail. Implementations may be implemented in a plurality of different forms. Those of ordinary skills in the art may easily understand such a fact that manners and contents may be transformed into other forms without departing from the purpose and scope of the present disclosure. Therefore, the present disclosure should not be explained as being limited to contents described in following implementations only. Embodiments in the present disclosure and features in the embodiments may be combined randomly with each other without conflict.

In the drawings, a size(s) of one or more constituent elements, a thickness of a layer, or a region is sometimes exaggerated for clarity. Therefore, an implementation of the present disclosure is not necessarily limited to a dimension, and a shape(s) and a size(s) of one or more components in the drawings do not reflect a true proportion. In addition, the drawings schematically illustrate ideal examples, and an implementation of the present disclosure is not limited to shapes, numerical values, or the like shown in the drawings.

Ordinal numerals such as "first", "second", and "third" in the specification are set to avoid confusion of constituent elements, but not to set a limit in quantity. In the present disclosure, "a plurality of" represents two or more than two.

In the specification, for convenience, wordings indicating orientation or positional relationships, such as "middle", "upper", "lower", "front", "back", "vertical", "horizontal", "top", "bottom", "inside", and "outside", are used for illustrating positional relationships between constituent elements with reference to the drawings, and are merely for facilitating the description of the specification and simplifying the description, rather than indicating or implying that a referred apparatus or element must have a particular orientation and be constructed and operated in the particular orientation. Therefore, they cannot be understood as limitations on the present disclosure. The positional relationships between the constituent elements are changed as appropriate according to a direction where the constituent elements are described. Therefore, appropriate replacements may be made according to situations without being limited to the wordings described in the specification.

In the specification, unless otherwise specified and defined explicitly, terms "mount", "mutually connect", and "connect" should be understood in a broad sense. For example, it may be a fixed connection, a detachable connection, or an integrated connection; it may be a mechanical connection or a connection; it may be a direct connection, an indirect connection through an intermediate component, or communication inside two components. Those of ordinary skills in the art may understand meanings of the above-mentioned terms in the present disclosure according to situations.

In the specification, "electrical connection" includes a case that constituent elements are connected together through an element with a certain electrical effect. The "element having some electrical effect" is not particularly limited as long as electrical signals between the connected constituent elements may be transmitted. Examples of the "element having some electrical effect" not only include an electrode and a wiring, but further include a switch element such as a transistor, a resistor, an inductor, a capacitor, another element with a plurality of functions, etc.

In the specification, a transistor refers to an element which at least includes three terminals, i.e., a gate, a drain, and a source. The transistor has a channel region between the drain electrode (drain electrode terminal, drain region, or drain) and the source electrode (source electrode terminal, source region, or source), and a current may flow through the drain electrode, the channel region, and the source electrode. In the specification, the channel region refers to a region through which a current mainly flows.

In the specification, a first electrode may be a drain electrode and a second electrode may be a source electrode, or, a first electrode may be a source electrode and a second electrode may be a drain electrode. In a case that transistors with opposite polarities are used, or in a case that a direction of a current changes during work of a circuit, or the like, functions of the "source electrode" and the "drain electrode" may sometimes be exchangeable. Therefore, the "source electrode" and the "drain electrode" may be exchangeable in the specification. In addition, a gate electrode may also be referred to as a control electrode.

In the specification, "parallel" refers to a state in which an angle formed by two straight lines is −10° or more and 10° or less, and thus also includes a state in which the angle is −5° or more and 5° or less. In addition, "perpendicular" refers to a state in which an angle formed by two straight lines is 80° or more and 100° or less, and thus also includes a state in which the angle is 85° or more and 95° or less.

A "light transmission rate" in the present disclosure refers to an ability of light to pass through a medium, and is a percentage of the luminous flux passing through a transparent or translucent body to its incident luminous flux.

In the present disclosure, "about" and "substantially" refer to a case that a boundary is not defined strictly and a process and measurement error within a range is allowed. In the present disclosure, "substantially the same" is a case where values differ by less than 10%.

An embodiment of the present disclosure provides a display substrate. The display substrate includes a base substrate, multiple first pixel circuits, multiple second active pixel circuits, multiple first light-emitting elements, multiple second light-emitting elements, and at least one first data line. The base substrate includes a display region and a peripheral region located on a periphery of the display region. The display region includes a first display region and a second display region, wherein the first display region is located on at least one side of the second display region. The peripheral region includes a signal access region located on a side of the display region along the first direction. The multiple first pixel circuits, the multiple second active pixel circuits, and the multiple first light-emitting elements are located in the first display region. The multiple second light-emitting elements are located in the second display region. At least one first pixel circuit of the multiple first pixel circuits is electrically connected with at least one first light-emitting element of the multiple first light-emitting elements, and at least one first pixel circuit is configured to drive at least one first light-emitting element to emit light. At least one second active pixel circuit of the multiple second active pixel circuits is electrically connected with at least one second light-emitting element of the multiple second light-emitting elements, and at least one second active pixel circuit is configured to drive at least one second light-emitting element to emit light. At least one first data line includes a first sub-data line and a second sub-data line. The first sub-data line is electrically connected with multiple first pixel circuits arranged along a first direction, and the second sub-data line is electrically connected with multiple second active pixel circuits arranged along the first direction. The first sub-data line and the second sub-data line are electrically connected through a first transfer line, and the first transfer line is located on the peripheral region and between the signal access region and the display region.

In the display substrate provided by the embodiment, by disposing the first transfer line connected with the first data line on the peripheral region and between the signal access region and the display region, a large number of traces can be avoided to be concentratively disposed in the display region, thereby improving the light transmission rate of the second display region and preventing diffraction and glare phenomena.

In some exemplary implementations, the first transfer line may extend along a second direction. Herein, the second direction may intersect with the first direction. For example, the second direction may be perpendicular to the first direction.

In some exemplary implementations, the peripheral region may further include a first trace lead-out region, a bending region, and a second trace lead-out region located on a side of the signal access region close to the display region, the first trace lead-out region, the bending region, and the second trace lead-out region may be sequentially disposed along a side away from the display region. The first transfer line may be located on the first trace lead-out region or the second trace lead-out region. In some examples, multiple first transfer lines may be all located on the first trace lead-out region, or all located on the second trace lead-out region, or part of the multiple first transfer line is located on the first trace lead-out region and part of the multiple first transfer line is located on the second trace lead-out region. However, the embodiment is not limited thereto.

In some exemplary implementations, at least one first data line may further include a third sub-data line. The third sub-data line is located on a side of the second display region away from the signal access region in the first direction. The third sub-data line may be electrically connected with the multiple first pixel circuits arranged along the first direction. The third sub-data line may be electrically connected with the second sub-data line by a second transfer line. In some examples, a first pixel circuit electrically connected with the third sub-data line and a first pixel circuit electrically connected with the first sub-data line may be located in a same column. In this example, the first data line is partitioned by the second display region into a first sub-data line and a third sub-data line. In some examples, the second transfer line may be located on the first display region. In some other examples, the peripheral region may further include a second bezel region located on a side of the display region away from the signal access region in a first direction; the second transfer line may be located on the second bezel region. However, this embodiment is not limited thereto.

In some exemplary implementations, the display substrate may further include multiple dummy pixel circuits located on the first display region. A second sub-data line of at least one first data line may be at least partially overlapped with multiple dummy pixel circuits, and multiple second active pixel circuits electrically connected with the second sub-data line and multiple dummy pixel circuits overlapped with the second sub-data line may be sequentially arranged along the first direction. However, this embodiment is not limited thereto.

In some exemplary implementations, the second sub-data line of at least one first data line may include a first trace and a second trace. The first trace is electrically connected with the second trace. The second trace may be located on a side of the first trace away from the base substrate, and an orthographic projection of the first trace on the base substrate is overlapped with an orthographic projection of the second trace on the base substrate. In this example, the second sub-data line may employ a double-layer trace to reduce trace resistance. However, this embodiment is not limited thereto.

In some exemplary implementations, the display substrate may further include at least one fourth data line. The fourth data line may include a fourth sub-data line and a fifth sub-data line. The fourth sub-data line may be electrically connected with multiple first pixel circuits arranged along the first direction, and the fifth sub-data line may be electrically connected with multiple second active pixel circuits arranged along the first direction. A fourth sub-data line and a fifth sub-data line of the fourth data line may be electrically connected by a third transfer line. The third transfer line may be located on the first display region. In this example, using the third transfer line to connect the fourth sub-data line and the fifth sub-data line of the second data line, using the first transfer line to connect the first sub-data line and the second sub-data line of the first data line, and the disposition positions of the first transfer line and the third transfer line are different, so that a large number of traces can be avoided to be concentratively disposed in the display region, thereby improving the display effect of the display region, avoiding the influence on the light transmission rate of the second display region, and preventing diffraction and glare phenomena.

In some exemplary implementations, the display substrate may include multiple fourth data lines, and multiple third transfer lines electrically connected with the multiple fourth data lines may have a same length. By disposing the third transfer line with the approximately same length, it can be ensured that the loads of the fourth data lines are approximately the same, and the consistency of signal transmission of the fourth data lines can be ensured. In some examples, the third transfer line may extend along the second direction. However, this embodiment is not limited thereto. For example, the third transfer line may be formed by connecting line segments extending along different directions.

In some exemplary implementations, the at least one third transfer line may include a first connection part and an extension part. A first end of the first connection part is electrically connected with the fourth sub-data line, a second end of the first connection part is electrically connected with the fifth sub-data line, and an end of the extension part is electrically connected with the second end of the first connection part. In this example, by extending the first connection part of the third transfer line, it can be ensured that the lengths of the multiple third transfer lines are approximately the same.

In some exemplary implementations, the third transfer line may be electrically connected with a first pixel circuit closest to the second display region among the multiple first pixel circuits electrically connected with the fourth sub-data line. This example is not only beneficial to the arrangement of the third transfer line, but also beneficial to the transmission consistency of the data signal.

In some exemplary implementations, in a first display region, at least two third transfer lines in a first direction are arranged between two adjacent rows of pixel circuits. In this example, multiple third transfer lines may be arranged between two adjacent rows of pixel circuits. In some other examples, in the first display region, at least one row of pixel circuits is arranged between two adjacent third transfer lines in the first direction. However, this embodiment is not limited thereto.

In some exemplary implementations, the second display region has a first center line in the second direction, and a first sub-data line close to the first center line is electrically connected with a second sub-data line close to the second display region. Alternatively, a first sub-data line close to the first center line is electrically connected with a second sub-data line away from the second display region. In this example, there may be no other first sub-data lines between the first sub-data line close to the first center line and the first center line. There may be no other second sub-data lines between the second sub-data line close to the second display region and the second display region.

In some exemplary implementations, the first transfer line may be located on a side of the first data line away from the base substrate. However, this embodiment is not limited thereto. For example, the first transfer line may be located on a side of the first data line close to the base substrate.

In some exemplary implementations, the display substrate may further include a multiplexing circuit. The multiplexing circuit may be configured to transmit the data signal to the first sub-data line and the second sub-data line in a time division manner. For example, a multiplexing circuit may be electrically connected with a first sub-data line and a second sub-data line of a first data line and configured to transmit the data signal to the first sub-data line and the second sub-data line of the first data line in a time division manner. However, this embodiment is not limited thereto. In some other examples, a multiplexing circuit may be electrically connected with first sub-data lines and second sub-data lines of multiple first data lines.

Solutions of this embodiment will be described below through some examples.

FIG. 1 is a schematic diagram of a display substrate according to at least one embodiment of the present disclosure. In some exemplary implementations, as shown in FIG. 1, the display substrate of this embodiment may include a display region AA and a peripheral region BB located on a periphery of the display region AA. The peripheral region BB may be a non-display region. The display region AA may include a first display region A1 and a second display region A2. For example, hardware such as a photosensitive sensor (for example, a camera) may be disposed on a side of the display substrate, and an orthographic projection of the photosensitive sensor on the display substrate may be overlapped with the second display region A2. The second display region A2 may be a transmissive display region, and the second display region A2 may also be referred to as an Under Display Camera (UDC) region. The first display region A1 may be a normal display region. For example, the first display region A1 is opaque and may be used only for display. The display substrate of the embodiment may lay a solid foundation for the realization of the true full screen.

In some exemplary implementations, as shown in FIG. 1, the display region AA may be rectangular, e.g., a rounded rectangle. The second display region A2 may be rectangular, e.g., a rounded rectangle. However, this embodiment is not limited thereto. For example, the second display region A2 may be of a shape of a circle, an ellipse, other quadrilaterals, pentagons or hexagons, or the like.

In some exemplary implementations, as shown in FIG. 1, the first display region A1 may be located on at least one side of the second display region A2. For example, the first display region A1 may surround the second display region A2. That is, the second display region A2 may be surrounded by the first display region A1. In some other examples, the second display region A2 may be disposed at another position, for example, it may be located at the middle of the top of the base substrate, or at an upper left corner position or an upper right corner position of the base substrate. However, this embodiment is not limited thereto.

In some exemplary implementations, as shown in FIG. 1, the display region AA of the display substrate may include a base substrate, and multiple sub-pixels on the base substrate. At least one sub-pixel may include a pixel circuit and a light-emitting element. The pixel circuit may be configured to drive the connected light-emitting element. For example, the pixel circuit may be configured to provide a drive current to drive the light-emitting element to emit light. The pixel circuit may include multiple transistors and at least one capacitor. For example, the pixel circuit may be of a 3T1C (i.e., three transistors and one capacitor) structure, a 7T1C (i.e., seven transistors and one capacitor) structure, a 5T1C (i.e., five transistors and one capacitor) structure, an 8T1C (i.e., eight transistors and one capacitor) structure or an 8T2C (i.e., eight transistors and two capacitors) structure. In some examples, the light-emitting element may be an Organic Light Emitting Diode (OLED), and the light-emitting element emits red light, green light, blue light, or white light, etc. when driven by a pixel circuit corresponding to the light-emitting element. A color of light emitted from the light-emitting element may be determined as required. In some examples, the light-emitting element may include an anode, a cathode, and an organic light-emitting layer disposed between the anode and the cathode. The anode of the light-emitting element may be electrically connected with a corresponding pixel circuit. However, this embodiment is not limited thereto.

In some exemplary implementations, a pixel unit in the display region AA may include three sub-pixels, wherein the three sub-pixels may be a red sub-pixel, a green sub-pixel, and a blue sub-pixel respectively. However, this embodiment is not limited thereto. In some examples, one pixel unit may include four sub-pixels, which may be a red sub-pixel, a green sub-pixel, a blue sub-pixel, and a white sub-pixel respectively.

In some exemplary implementations, a shape of the light-emitting element may be a rectangle, a rhombus, a pentagon, or a hexagon. When the pixel unit includes three sub-pixels, light-emitting elements of the three sub-pixels may be arranged side by side horizontally, side by side vertically, or in a manner like a Chinese character "w". When the pixel unit includes four sub-pixels, light-emitting elements of the four sub-pixels may be arranged side by side horizontally, side by side vertically, or in a manner to form a square. However, this embodiment is not limited thereto.

In some exemplary implementations, as shown in FIG. 1, the first display region A1 is disposed with multiple first light-emitting elements 13 and multiple pixel circuits, and the second display region A2 may be disposed with multiple second light-emitting elements 14. The multiple pixel circuits of the second display region A1 may include multiple first pixel circuits 11 and multiple second pixel circuits 12. The multiple second pixel circuit may include multiple second active pixel circuits 12 and multiple dummy pixel circuits. At least one first pixel circuit 11 of the first display region A1 is electrically connected with at least one first light-emitting element 13, and at least one first pixel circuit 11 is configured to drive at least one first light-emitting element 13 to emit light. An orthographic projection of at least one first pixel circuit 11 of the first display region A1 on the base substrate may be at least partially overlapped with an orthographic projection of at least one first light-emitting element 13 on the base substrate. For example, the first pixel circuit 11 and the first light-emitting element 13 may have a one-to-one correspondence. At least one second active pixel circuit 12 in the first display region A1 and at least one second light-emitting element 14 in the second display region A2 may be electrically connected through a transparent conductive line L, and at least one second active pixel circuit 12 may be configured to drive at least one second light-emitting element 14 to emit light. An orthographic projection of the second active pixel circuit 12 on the base substrate is not overlapped with an orthographic projection of the second light-emitting element 14 on the base substrate. The dummy pixel circuit can be beneficial to improve the uniformity of the components of multiple film layers in the etching process. For example, the dummy pixel circuit may have a same structure as the first pixel circuit 11 and the second active pixel circuit 12 in a row or in a column in which it is located except that it is not connected with any light-emitting element. In this example, the light-emitting element is only disposed in the second display region A2, and the pixel circuit for driving the light-emitting element of the second display region A2 is disposed in the first display region A1, which can improve the light transmission rate of the second display region A2.

In some exemplary implementations, as shown in FIG. 1, one end of the transparent conductive line L is electrically connected with the second active pixel circuits 12, and the other end of the transparent conductive line L is electrically connected with the second light-emitting element 14. The transparent conductive line L may extend from the first display region A1 to the second display region A2. For example, the transparent conductive line L may extend from the first display region A1 to the second display region A2 along the first direction D1; alternatively, the transparent conductive line L may first extend along the second direction D2 in the first display region A1, and then extend to the second display region A2 along the first direction D1. However, this embodiment is not limited thereto.

In some exemplary implementations, the transparent conductive line L may be made of a transparent conductive material, for example, may be made of a conductive oxide material, such as, Indium tin Oxide (ITO). However, this embodiment is not limited thereto. In some examples, the transparent conductive lines L may be arranged in a transparent conductive layer; alternatively, multiple transparent conductive lines L may be arranged in two or three transparent conductive layers. Each transparent conductive line L may be connected with a second active pixel circuit 12 and a second light-emitting element 14; alternatively, a second active pixel circuit 12 and a second light-emitting element 14 may be connected by multiple transparent conductive lines L that are sequentially electrically connected.

In some exemplary implementations, a light transmission rate of the first display region A1 may be smaller than a light transmission rate of the second display region A2. In some examples, a density of the second light-emitting elements 14 in the second display region A2 may be less than or equal to a density of the first light-emitting elements 13 in the first display region A1 in order to improve the display effect. In some examples, a resolution of the first display region A1 may be smaller than or equal to a resolution of the second display region A2. However, this embodiment is not limited thereto.

In some exemplary implementations, the display substrate may employ a full compression solution. All the first pixel circuits throughout the first display region A1 can be compressed to increase the space for arranging the second pixel circuits throughout the first display region A1. For example, in the full compression solution, a single column of pixel circuits may be reserved for driving the light-emitting elements of the second display region A2. In this column of pixel circuits, a second pixel circuit electrically connected with the transparent conductive line may be an active pixel circuit (i.e., a second active pixel circuit), and a second pixel circuit not electrically connected with the transparent conductive line may be a dummy pixel circuit. The dummy pixel circuit is not electrically connected. In some other examples, the second pixel circuit may be arranged by compressing the first pixel circuits in only part of the first display region A1 on left and right sides of the second display region A2. For example, the first display region A1 may include a transition region located on left and right sides of the second display region A2, and the second active pixel circuit may be arranged in the transition region. However, this embodiment is not limited thereto. In some other examples, the second pixel circuit may be located on the peripheral region, thereby forming an external solution of the pixel circuits.

Figure 2:
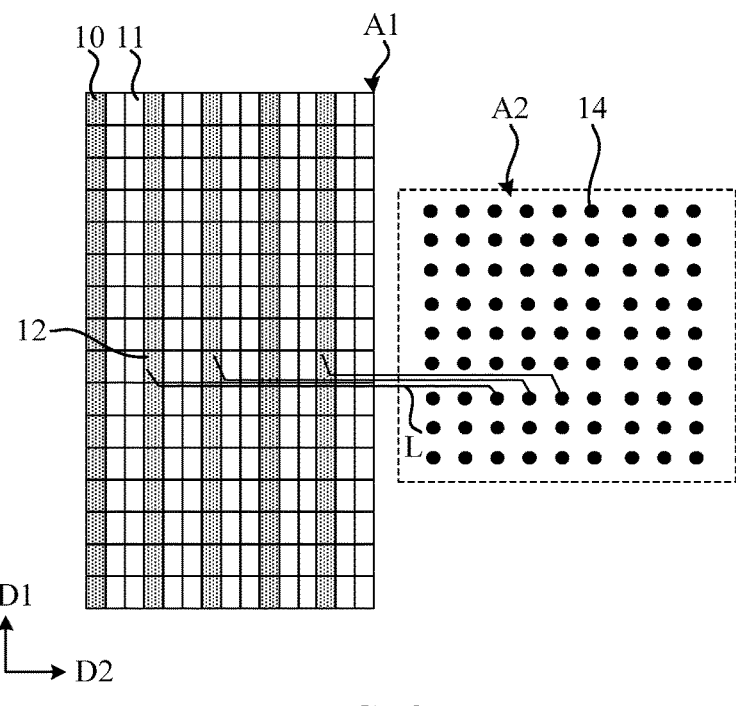
FIG. 2 is a schematic diagram of a connection between a second light-emitting element and a second active pixel circuit according to at least one embodiment of the present disclosure.

FIG. 2 is a schematic diagram of a connection between a second light-emitting element and a second active pixel circuit according to at least one embodiment of the present disclosure. In some examples, as shown in FIG. 2, multiple pixel circuits of the first display region A1 may be arranged in an array. Multiple pixel circuits arranged sequentially along the second direction D2 may be referred to as a row of pixel circuits, and multiple pixel circuits arranged sequentially along the first direction D1 may be referred to as a column of pixel circuits. Herein, the first direction D1 may intersect with the second direction D2, for example, the first direction D1 may be perpendicular to the second direction D2.

In some exemplary implementations, as shown in FIG. 2, at least one second pixel circuit 10 may be disposed between multiple first pixel circuits 11 arranged along the second direction D2. The second pixel circuits 10 may be arranged between multiple columns of first pixel circuits 11. For example, a column of second pixel circuits 10 may be disposed between every M columns of first pixel circuits 11. Compared with the first display region in which only the first pixel circuits are disposed, the original M columns of the first pixel circuits may be compressed along the second direction D2, thereby newly adding an arrangement space for a column of the second pixel circuits 10, and space occupied by the original M columns of pixel circuits and space occupied by the compressed (M+1) columns of pixel circuits may be the same. Herein, M is a positive integer greater than or equal to 2. In this example, as shown in FIG. 2, M may be 2, that is, the arrangement space of a column of second pixel circuits may be newly added by compressing the original two columns of first pixel circuits along the second direction D2, and the space occupied by the two columns of pixel circuits before compression and the space occupied by the three columns of pixel circuits after compression may be the same. In some other examples, M may be 4 or may be 8. However, this embodiment is not limited thereto. In some other examples, the first pixel circuits may be compressed along the first direction D1 for newly adding an arrangement space for the second pixel circuits. For example, the original Q rows of first pixel circuits may be compressed along the first direction D1, thereby newly adding an arrangement space for a row of second pixel circuits, and the space occupied by the Q rows of pixel circuits before compression and the space occupied by the (Q+1) rows of pixel circuits after compression may be the same. Q may be an integer greater than 1. In some other examples, the first pixel circuits may be compressed along both the first direction D1 and the second direction D2, thereby newly adding an arrangement space for second pixel circuits.

In some exemplary implementations, a column of second pixel circuits 10 may include multiple second active pixel circuits and multiple dummy pixel circuits, or, may include multiple dummy pixel circuits. The second active pixel circuits may be located on the first display region A1 on a periphery of the second display region A2, and the remaining second pixel circuits in the first display region A1 may all be dummy pixel circuits.

In some exemplary implementations, as shown in FIG. 1, the second light-emitting element 14 and the second active pixel circuit 12 connected with the second light-emitting element 14 may be located in a same row. That is, the drive signal of the second light-emitting element 14 comes from the second active pixel circuit 12 in the same row. For example, pixel circuits of a same row of sub-pixels are electrically connected with a same gate line. However, this embodiment is not limited thereto. For example, the second light-emitting element and the second active pixel circuit electrically connected thereto may not be in a same row.

In some exemplary implementations, as shown in FIG. 1, the peripheral region BB may include a first bezel region B1 and a second bezel region B2 located on opposite sides of the display region AA in the first direction D1. For example, the first bezel region B1 may be the lower bezel region of the display substrate, and the second bezel region B2 may be the upper bezel region of the display substrate. The first bezel region B1 may include a first trace lead-out region B11, a bending region B12, a second trace lead-out region B13, and a signal access region B14 disposed sequentially along a side away from the display region AA in the first direction D1. The first trace lead-out region B11 may communicate with two bezel regions (for example, a left bezel region and a right bezel region) disposed oppositely to each other along the second direction D2. The bending region B12 may be configured to make the second trace lead-out region B13 and the signal access region B14 be bent to a back of the display region AA.

In some exemplary implementations, as shown in FIG. 1, the signal access region B14 may include a drive IC region B141 and a bonding pin region B142 disposed sequentially along a side away from the display region AA in the first direction D1. A drive integrated circuit (IC) may be bonded and connected to the drive IC region B141. For example, the drive IC may be bonded and connected to the drive IC region B141 through an anisotropic conductive film or otherwise. A length of the drive IC in the second direction D2 may be smaller than a length of the signal access region B14 in the second direction D2. The drive IC may generate a drive signal required for driving sub-pixels, and may provide the drive signal to the sub-pixels in the display region AA. For example, the drive signal may be a data signal that drives the luminance of the sub-pixels. In some examples, the drive IC may be a display drive integrated circuit, or may be a touch and display drive integrated circuit. The bonding pin region B142 may be disposed with a pad including multiple pins, a flexible printed circuit (FPC for short) may be bonded and connected to the pad in the bonding pin region B142, so that multiple signal lead lines (for example, a drive control line, a power supply line, etc.) may be connected with external control apparatus through multiple pins.

A partial trace arrangement of the display substrate will be described below by multiple examples. In the following examples, the first display region A1 may employ a solution in which two columns of first pixel circuits are compressed in the second direction D2 to newly add a column of second pixel circuits. In the figure, only part of the second pixel circuits in the first display region A1 on two opposite sides of the second display region A2 in the second direction D2 is shown, the second pixel circuits in the first display region A1 on two opposite sides of the second display region A2 in the first direction D1 may be omitted. In addition, the number of the second light-emitting elements and the number of the pixel circuits in the following examples are only an example and this embodiment is not limited on the number of the second light-emitting elements and the number of the pixel circuits.

Figure 3:
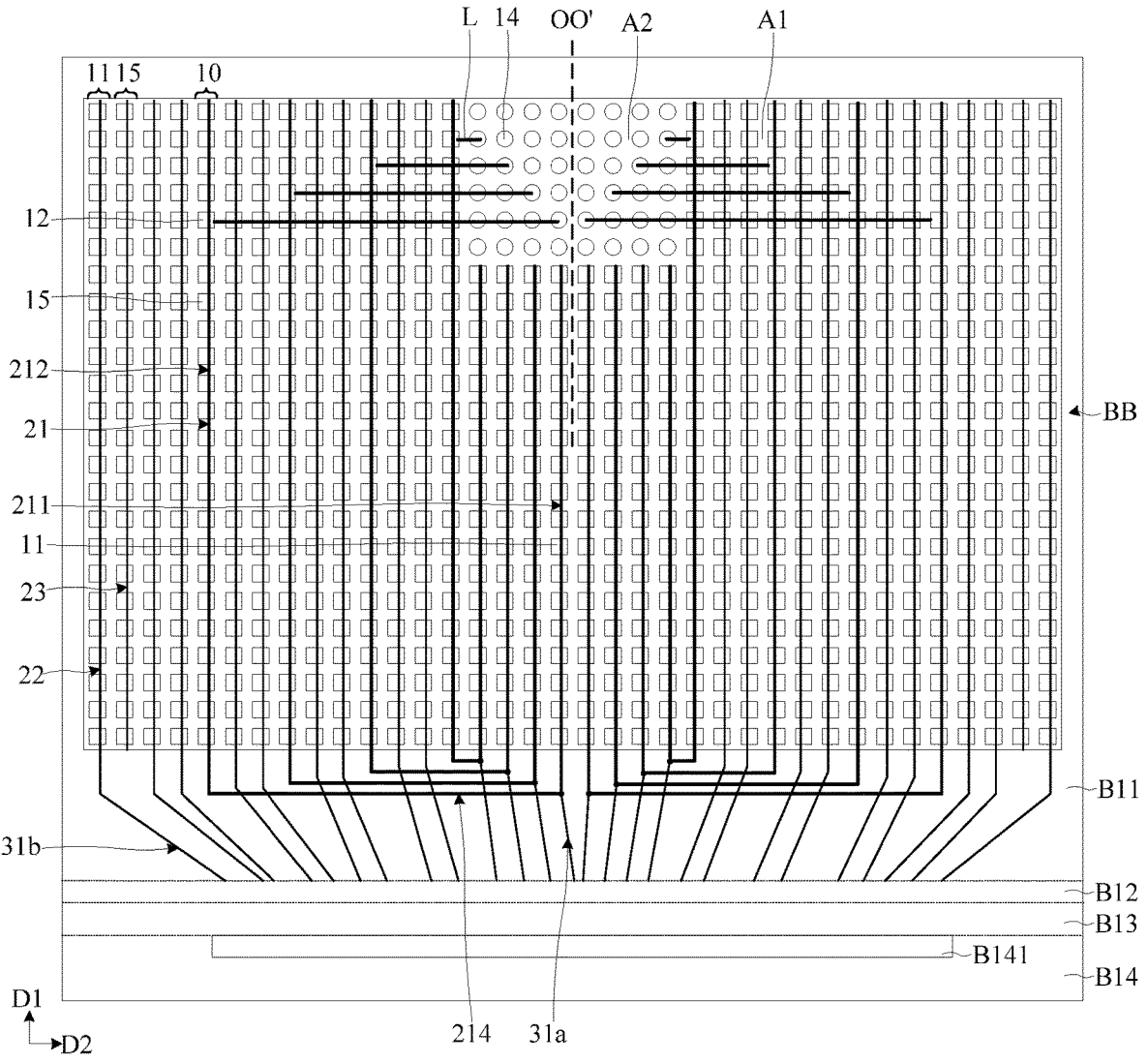
FIG. 3 is a partial trace schematic diagram of a display substrate according to at least one embodiment of the present disclosure.

FIG. 3 is a partial trace schematic diagram of a display substrate according to at least one embodiment of the present disclosure. In some exemplary implementations, as shown in FIG. 3, the first display region A1 surrounds three sides (e.g., left side, right side and lower side) of the second display region A2. The upper side of the second display region A2 may be directly adjacent to the peripheral region BB. The second display region A2 has a first center line OO' in the second direction D2 In the second display region A2, a second light-emitting element 14 close to the first center line OO' of the second display region A2 in the second direction D2 is electrically connected with a second active pixel circuit 12 close to the second display region A2 in the first display region A1 by a transparent conductive line L, and a second light-emitting element 14 close to an edge of the second display region A2 (i.e., away from the first center line OO' of the second display region A2) is electrically connected with a second active pixel circuit 12 away from the second display region A2 in the first display region A1 by a transparent conductive line L. In some examples, the second light-emitting element 14 in the second display region A2 may be electrically connected with the second active pixel circuit 12 in a same row in the first display region A1. However, this embodiment is not limited thereto.

In some exemplary implementations, as shown in FIG. 3, the display substrate may be disposed with multiple first data lines 21. The first data line 21 may include a first sub-data line 211 and a second sub-data line 212 extending along the first direction D1. The first sub-data line 211 may be electrically connected with multiple first pixel circuits 11 located in the first display region A1 on the lower side of the second display region A2 and arranged along the first direction D1. The second sub-data line 212 may be electrically connected with multiple second pixel circuits 10 (e.g., including multiple second active pixel circuits 12) arranged along the first direction D1. For example, the second sub-data line 212 may be electrically connected with multiple second active pixel circuits 12 arranged along the first direction D1, and may also be overlapped with multiple dummy pixel circuits 15 located in a same column as electrically connected second active pixel circuits 12. The first light-emitting element with which the first pixel circuit 11 connected with the first sub-data line 211 is electrically connected may be in a same column as the second light-emitting element 14 with which the second active pixel circuit 12 connected with the second sub-data line 212 is electrically connected. However, this embodiment is not limited thereto.

In some exemplary implementations, as shown in FIG. 3, the first sub-data line 211 and the second sub-data line 212 of the first data line 21 may be electrically connected by a first transfer line 214. The first transfer line 214 may extend along the second direction D2, and is located in the first trace lead-out region B11. The first sub-data line 211 with which the second sub-data line 212 close to the second display region A2 is electrically connected may be located on a side of the first sub-data line 211 away from the first center line OO', the first sub-data line 211 is electrically connected with the second sub-data line 212 away from the second display region A2. In a region on a side of the first center line OO' along the second direction D2, a second sub-data line 212 close to the second display region A2 is electrically connected with a first sub-data line 211 away from the first center line OO', and a second sub-data line 212 away from the second display region A2 is electrically connected with a first sub-data line 211 close to the first center line OO'. Lengths of the multiple first transfer lines 214 connected with the multiple first data lines 21 along the second direction D2 may be gradually increased along a direction away from the display region AA. In this way, overlapping of traces can be reduced.

In some exemplary implementations, as shown in FIG. 3, the first sub-data line 211 and the second sub-data line 212 of the first data line 21 may be of a same layer structure. The first transfer line 214 may be located on a side of the first sub-data line 211 and the second sub-data line 212 away from the base substrate. For example, the first sub-data line 211 and the second sub-data line 212 may be located on a first source-drain metal layer, and the first transfer line 214 may be a second source-drain metal layer. However, this embodiment is not limited thereto. In some other examples, the first transfer line may be located on a side of the first sub-data line and second sub-data line close to the base substrate. For example, the first sub-data line and second sub-data line may be located in a second source-drain metal layer, and the first transfer line may be located in the first source-drain metal layer.

In some exemplary implementations, as shown in FIG. 3, the first sub-data line 211 of the first data line 21 may also extend to the first trace lead-out region B11, and be electrically connected with the first data lead-out line 31a on the first trace lead-out region B11. One end of the first data lead-out line 31a may be electrically connected with the first sub-data line 211, and the other end may extend toward the bending region B12, and may be electrically connected with a drive IC disposed later in the drive IC region B141 through traces disposed in the bending region B12 and the second trace lead-out region B13. The first data lead-out line 31a may be in a same layer structure as the first sub-data line 211, or may be in a same layer structure as the first transfer line 214. However, this embodiment is not limited thereto. For example, the first data lead-out line 31a may be electrically connected with the second sub-data line 212 or the first transfer line 214.

In some exemplary implementations, as shown in FIG. 3, the display substrate may further be disposed with multiple second data lines 22 and multiple third data lines 23 extending along the first direction D1. The second data line 22 may be electrically connected with multiple first pixel circuits 11 (i.e., a column of first pixel circuits 11) arranged along the first direction D1. The second data line 22 may be electrically connected with the first data lead-out line 31b in the first trace lead-out region B11. One end of the first data lead-out line 31b may be electrically connected with the second data line 22, and the other end may extend toward the bending region B12, and may be electrically connected with a drive IC subsequently disposed in the drive IC region B141 through traces disposed in the bending region B12 and the second trace lead-out region B13. The third data line 23 may be electrically connected with multiple dummy pixel circuits 15 (e.g., a column of dummy pixel circuits 15) arranged along the first direction D1. The third data line 23 may be a dummy trace, and does not need to be electrically connected with the first data lead-out line. However, this embodiment is not limited thereto. For example, the third data line may be electrically connected with the first data lead-out line in the first trace lead-out region, but the first data lead-out line may not provide a data signal to the third data line.

In some exemplary implementations, a density of second light-emitting elements 14 of the second display region A2 may be smaller than a density of first light-emitting elements of the first display region A1. Alternatively, a density of second light-emitting elements 14 of the second display region A2 may be equal to a density of first light-emitting elements of the first display region A1. Alternatively, a density of second light-emitting elements 14 of the second display region A2 may be greater than a density of first light-emitting elements of the first display region A1. However, this embodiment is not limited thereto.

In a display substrate provided by the exemplary embodiment, a first transfer line connecting a first sub-data line and a second sub-data line of a first data line is disposed in a first trace lead-out region of a first bezel region, a large number of traces can be avoided to be concentratively disposed in the display region, which can ensure the light transmission rate of the second display region, and prevent diffraction and glare phenomena in the second display region, and thereby improve the display effect.

Figures 4, 5:
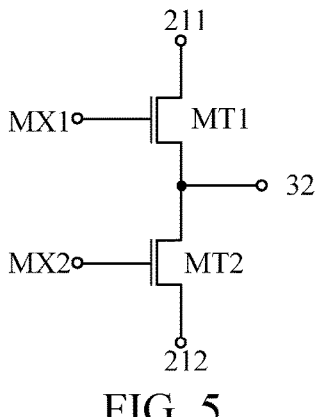
FIG. 4 is another partial trace schematic diagram of a display substrate according to at least one embodiment of the present disclosure.
FIG. 5 is an equivalent circuit diagram of a multiplexing circuit according to at least one embodiment of the present disclosure.

FIG. 4 is another partial trace schematic diagram of a display substrate according to at least one embodiment of the present disclosure. In some exemplary implementations, as shown in FIG. 4, the first trace lead-out region B11 may also be disposed with at least one multiplexing circuit (MUX) 30. The multiplexing circuit 30 may be connected with the first data line 21 of the display region AA. The multiplexing circuit 30 may electrically connect with a first sub-data line 211 and a second sub-data line 212 of the first data line 21. The multiplexing circuit 30 may be configured to transmit the data signal to different sub-data lines in a time division manner, for example, to transmit the data signal to the first sub-data line 211 and the second sub-data line 212 in a time division manner. By disposing the multiplexing circuit, one signal source (for example, a pin of the drive IC) may provide data signals to different sub-data lines in a time division manner, which can greatly reduce the actual quantity of signal sources and simplify the product structure. In this example, the first sub-data line 211 and the second sub-data line 212 of the first data line 21 may be electrically connected through the first transfer line 214. The first transfer line 214 may be located in the first trace lead-out region B11, and may be connected with the multiplexing circuit 30. Other trace structures of the present embodiment may refer to the description of the above embodiment, and will not be repeated here.

FIG. 5 is an equivalent circuit diagram of a multiplexing circuit according to at least one embodiment of the present disclosure. In this example, illustration is made by taking a case in which the multiplexing circuit includes two multiplexing transistors as an example. As shown in FIG. 5, at least one multiplexing circuit 30 may include a first multiplexing transistor MT1 and a second multiplexing transistor MT2. A gate electrode of the first multiplexing transistor MT1 is electrically connected with a first multiplexing control line MX1, a first electrode of the first multiplexing transistor MT1 is electrically connected with a multiplexing data line 32, and a second electrode of the first multiplexing transistor MT1 is electrically connected with the first sub-data line 211. A gate electrode of the second multiplexing transistor MT2 is electrically connected with a second multiplexing control line MX2, a first electrode of the second multiplexing transistor MT2 is electrically connected with a multiplexing data line 32, and a second electrode of the second multiplexing transistor MT2 is electrically connected with the second sub-data line 212. The first multiplexing transistor MT1 may provide the data signal provided by the multiplexing data line 32 to the first sub-data line 211 under the control of the first multiplexing control line MX1. The second multiplexing transistor MT2 may provide the data signal provided by the multiplexing data line 32 to the second sub-data line 212 under the control of the second multiplexing control line MX2. The number of the multiplexing transistors included in the multiplexing circuit 30 may depend on the number of multiplexing data lines 32. First electrodes of all multiplexing transistors of a same multiplexing circuit may be connected with a same multiplexing data line 32, and first electrodes of multiplexing transistors of different multiplexing circuits may be connected with different multiplexing data lines 32. During displaying, a turned-on signal (a signal that enables transistors to turn on) may flow into multiple multiplexing control lines in turn, so that a multiplexing data line 32 may be turned on with multiple different sub-data lines in turn via multiple multiplexing transistors in one multiplexing circuit, thereby providing required data signals to the multiple sub-data lines through a multiplexing data line 32 in a time division manner. That is, control on the multiple sub-data lines is realized by a signal source (i.e., realizing "one-to-many", e.g., one-to-two, one-to-four), so as to simplify a product structure, for example, to reduce the number of drive ICs required.

Figure 6:
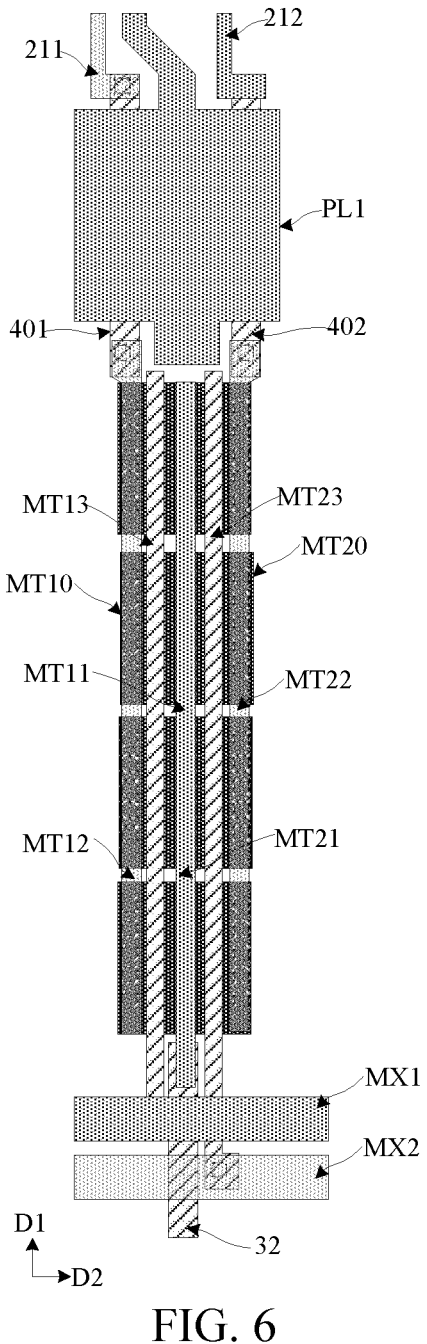
FIG. 6 is an exemplary top view of a multiplexing circuit according to at least one embodiment of the present disclosure.

FIG. 6 is an exemplary top view of a multiplexing circuit according to at least one embodiment of the present disclosure. In some exemplary implementations, as shown in FIG. 6, the first multiplexing transistor MT1 may include an active layer MT10, a gate electrode MT13, a first electrode MT11, and a second electrode MT12. The second multiplexing transistor MT2 may include an active layer MT20, a gate electrode MT23, a first electrode MT21 and a second electrode MT22. The active layer MT10 of the first multiplexing transistor MT1 may include four sub-active layers, and the active layer MT20 of the second multiplexing transistor MT2 may include four sub-active layers. The four sub-active layers of the active layer MT10 and the four sub-active layers of the active layer MT20 may be in one-to-one correspondence, and the sub-active layer of the active layer MT10 and the corresponding sub-active layer of the active layer MT20 may be of an integrated structure. The gate electrode MT13 of the first multiplexing transistor MT1 may be electrically connected with the first multiplexing control line MX1. The gate electrode MT23 of the second multiplexing transistor MT2 may be electrically connected with the second multiplexing control line MX2. The first electrode MT11 of the first multiplexing transistor MT1 and the first electrode MT21 of the second multiplexing transistor MT2 may be of an integrated structure, and may be electrically connected with the first doped region of the active layer MT10 and the first doped region of the active layer MT20, and may also be electrically connected with the multiplexing data line 32. The second electrode MT12 of the first multiplexing transistor MT1 may be electrically connected with the second doped region of the active layer MT10, and may be also electrically connected with the first sub-data line 211 through a first multiplexing connection electrode 401. The second electrode MT22 of the second multiplexing transistor MT2 may be electrically connected with the second doped region of the active layer MT20, and may be also electrically connected with the second sub-data line 212 through a second multiplexing connection electrode 402.

Figure 7:
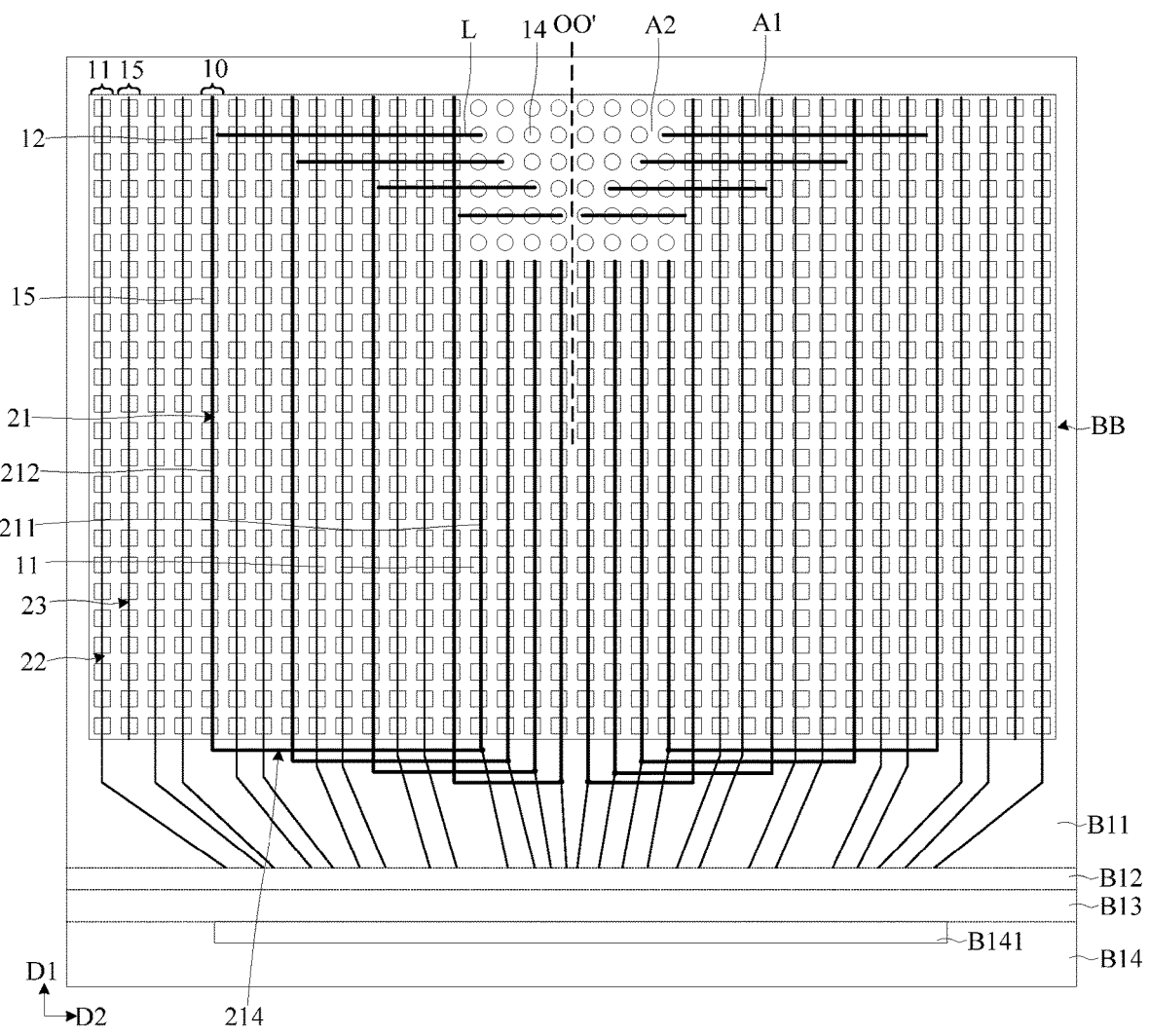
FIG. 7 is another partial trace schematic diagram of a display substrate according to at least one embodiment of the present disclosure.

In some examples, as shown in FIG. 6, the gate electrode MT13 of the first multiplexing transistor MT1, the gate electrode MT23 of the second multiplexing transistor MT2, the multiplexing data line 32, the first multiplexing connection electrode 401 and the second multiplexing connection electrode 402 may be located in a first gate metal layer. The first electrode MT11 and the second electrode MT12 of the first multiplexing transistor MT1, the first electrode MT21 and the second electrode MT22 of the second multiplexing transistor MT2, the first multiplexing control line MX1, the second multiplexing control line MX2, the first sub-data line 211, the second sub-data line 212, and the first power supply line PL1 may be located in a first source-drain metal layer. In this example, the first multiplexing connection electrode 401 and the second multiplexing connection electrode 402 may extend along the first direction D1, the second electrode MT12 of the first multiplexing transistor MT1 and the first sub-data line 211 are electrically connected through the first multiplexing connection electrode 401, the second electrode MT22 of the second multiplexing transistor MT2 and the second sub-data line 212 are electrically connected through the second multiplexing connection electrode 402, which can avoid affecting the trace arrangement of the first power supply line PL1. In this example, the first transfer line may include a first multiplexing connection electrode 401 and a second multiplexing connection electrode 402. The first sub-data line 211 and the second sub-data line 212 may be electrically connected with the multiplexing circuit through the first transfer line. In some other examples, the first transfer line (including a first multiplexing connection electrode and a second multiplexing connection electrode) may be located in a second gate metal layer or a second source-drain metal layer. However, this embodiment is not limited thereto. In some other examples, the first multiplexing connection electrode and the second multiplexing connection electrode may be located on different conductive layers. For example, the first multiplexing connection electrode may be located on the first gate metal layer, and the second multiplexing connection electrode may be located on the second gate metal layer; alternatively, the first multiplexing connection electrode may be located on the second source-drain metal layer, and the second multiplexing connection electrode may be located on the first gate metal layer. FIG. 7 is another partial trace schematic diagram of a display substrate according to at least one embodiment of the present disclosure. In some exemplary implementations, as shown in FIG. 7, the first display region A1 surrounds three sides (e.g., left side, right side, and lower side) of the second display region A2. The upper side of the second display region A2 may be directly adjacent to the peripheral region BB. In the second display region A2, a second light-emitting element 14 close to a first center line OO' of the second display region A2 in the second direction D2 may be electrically connected with a second active pixel circuit 12 close to the second display region A2 in the first display region A1 through a transparent conductive line L, and a second light-emitting element 14 close to an edge of the second display region A2 (i.e., away from the first center line OO' of the second display region A2) may be electrically connected with a second active pixel circuit 12 away from the second display region A2 in the first display region A1 through the transparent conductive line L. In this example, the first sub-data line 211 and the second sub-data line 212 of the first data line 21 may be electrically connected through a first transfer line 214, and the first transfer line 214 may be located on the first trace lead-out region B11. The first sub-data line 211 with which the second sub-data line 212 close to the second display region A2 is electrically connected may be located on a side of the first sub-data line 211 close to the first center line OO' with which the second sub-data line 212 away from the second display region A2 is electrically connected. In a region on a side of the first center line OO' along the second direction D2, the second sub-data line 212 close to the second display region A2 is electrically connected with a first sub-data line 211 close to the first center line OO', and a second sub-data line 212 away from the second display region A2 is electrically connected with a first sub-data line 211 away from the first center line OO'. For rest structures of the embodiment, reference may be made to the description of the embodiment shown in FIG. 3, and thus repetition will not be made herein.

Figure 8:
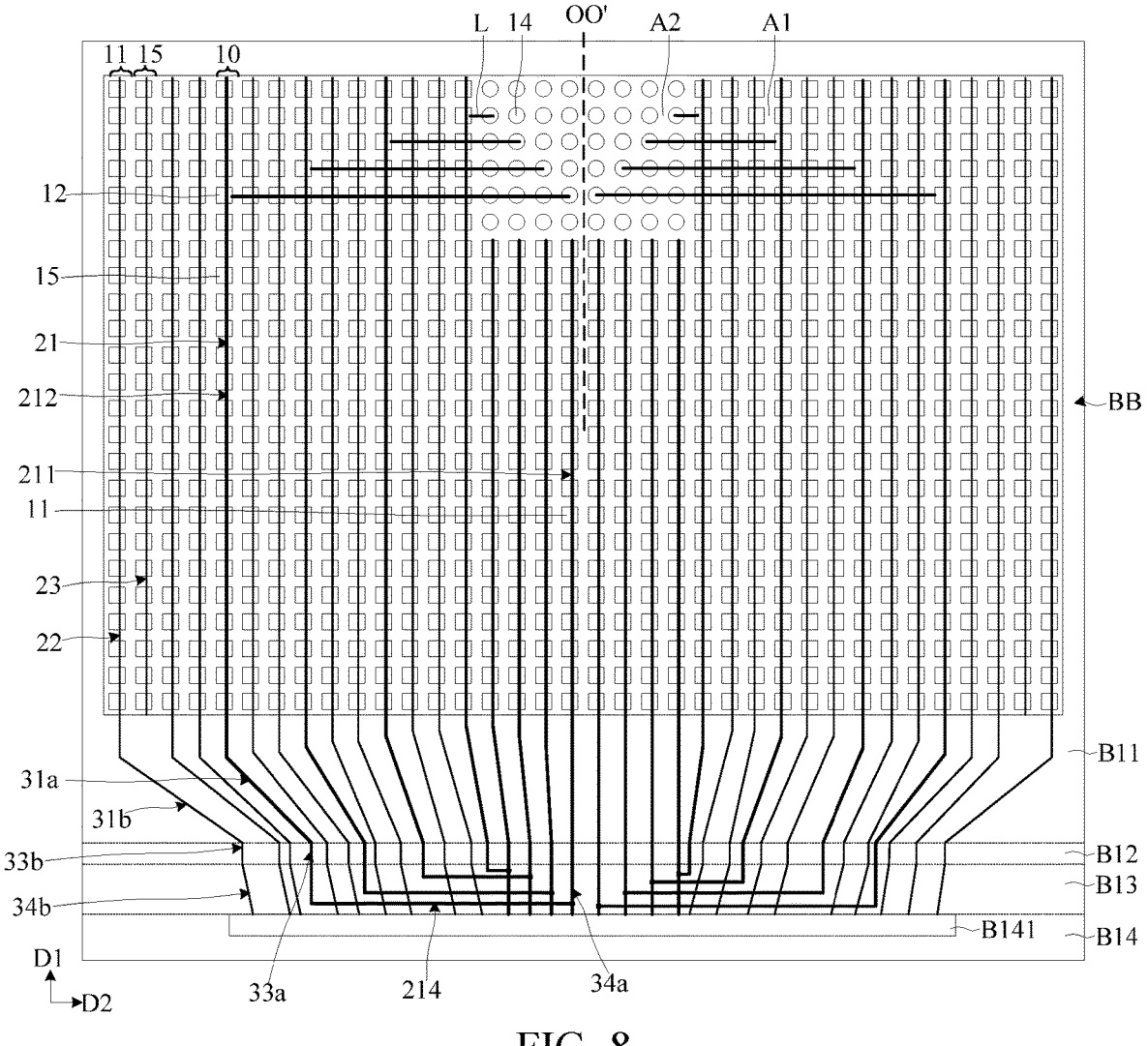
FIG. 8 is another partial trace schematic diagram of a display substrate according to at least one embodiment of the present disclosure.

FIG. 8 is another partial trace schematic diagram of a display substrate according to at least one embodiment of the present disclosure. In some exemplary implementations, as shown in FIG. 8, in the first trace lead-out region B11, the first sub-data line 211 and the second sub-data line 212 of the first data line 21 may be electrically connected with the first data lead-out line 31a, respectively, the first data lead-out line 31a is electrically connected with the data bending line 33a of the bending region B12, and the data bending line 33a is electrically connected with the second data lead-out line 34a of the second trace lead-out region B13. The second data lead-out line 34a electrically connected with the first sub-data line 211 may be electrically connected with the second data lead-out line 34a electrically connected with the second sub-data line 212 through the first transfer line 214, thereby achieving an electrical connection between the first sub-data line 211 and the second sub-data line 212. In this example, the first transfer line 214 may be located in the second trace lead-out region B13. The second data line 22 may be electrically connected with the first data lead-out line 31b in the first trace lead-out region B11, the first data lead-out line 31b may be electrically connected with the data bending line 33b in the bending region B12, and the data bending line 33b may be electrically connected with the second data lead-out line 34b in the second trace lead-out region B13. The second data lead-out lines 34a and 34b may be electrically connected with pins in the drive IC region B141 to achieve electrical connection with the drive IC.

In some examples, the first data lead-out lines 31a and 31b may be in a same layer structure as the first data line 21 and the second data line 22, the data bending lines 33a and 33b may be in a different layer structure from the first data lead-out lines 31a and 31b, and the second data lead-out lines 34a and 34b may be in a same layer structure as the first data lead-out lines 31a and 31b. The first transfer line 214 may be in a different layer structure from the second data lead-out lines 34a and 34b. However, this embodiment is not limited thereto. In some other examples, the first transfer line may be located on the bending region.

For the rest structures of the display substrate of the embodiment, reference may be made to the description of the embodiment shown in FIG. 3, and thus repetition will not be made herein.

Figure 9:
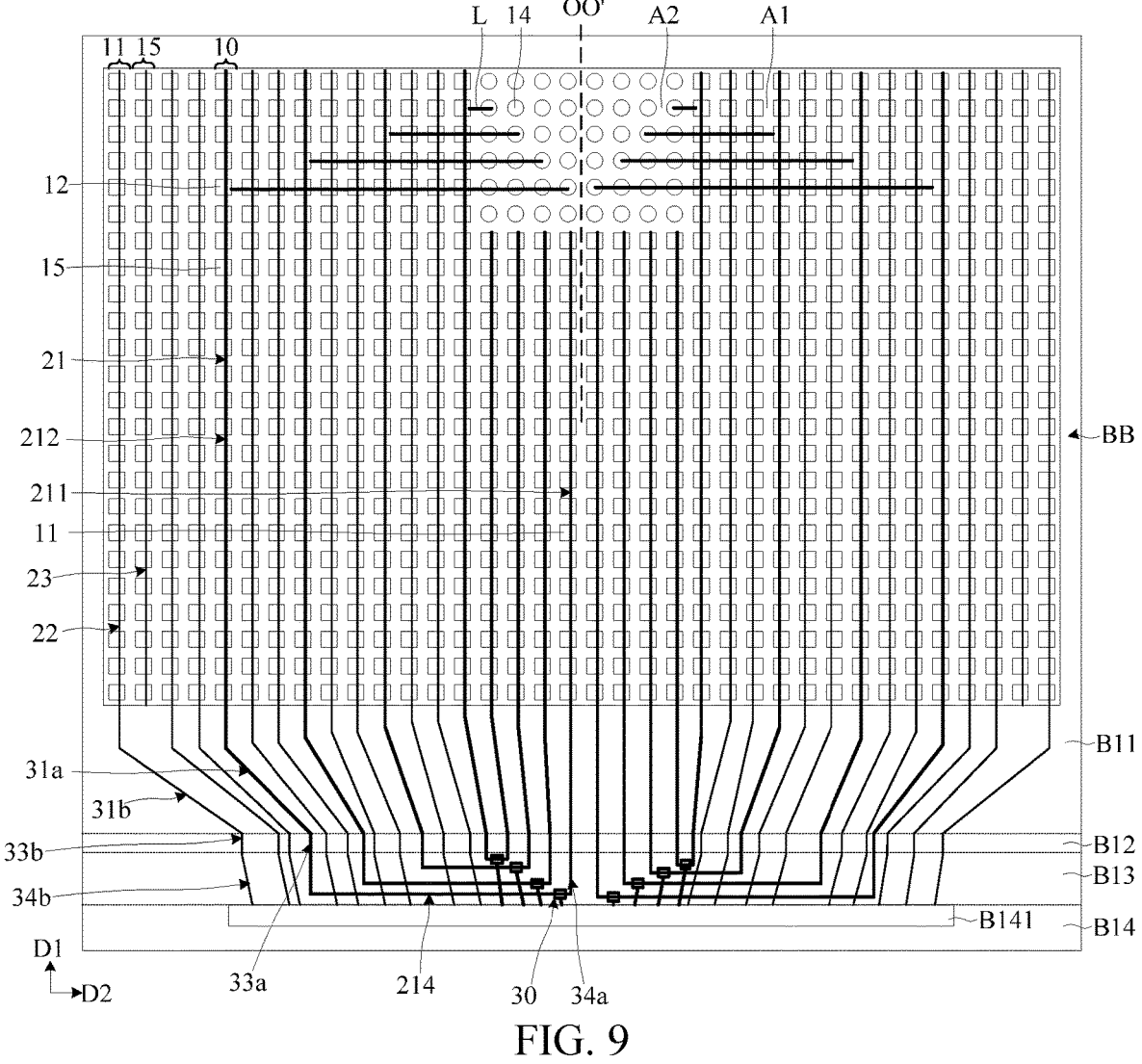
FIG. 9 is another partial trace schematic diagram of a display substrate according to at least one embodiment of the present disclosure.

FIG. 9 is another partial trace schematic diagram of a display substrate according to at least one embodiment of the present disclosure. In some exemplary implementations, as shown in FIG. 9, the second trace lead-out region B13 may be disposed with a multiplexing circuit 30. The multiplexing circuit 30 may be electrically connected with the first sub-data line 211 and the second sub-data line 212 through the second data lead-out line 34a, the data bending line 33a, and the first data lead-out line 31a. The multiplexing circuit 30 may be configured to transmit the data signal to different sub-data lines in a time division manner, for example, to transmit the data signal to the first sub-data line 211 and the second sub-data line 212 in a time division manner. For the structure of the multiplexing circuit 30 and the rest traces of the display substrate, reference may be made to the description of the aforementioned embodiment, and thus repetition will not be made here.

Figure 10:
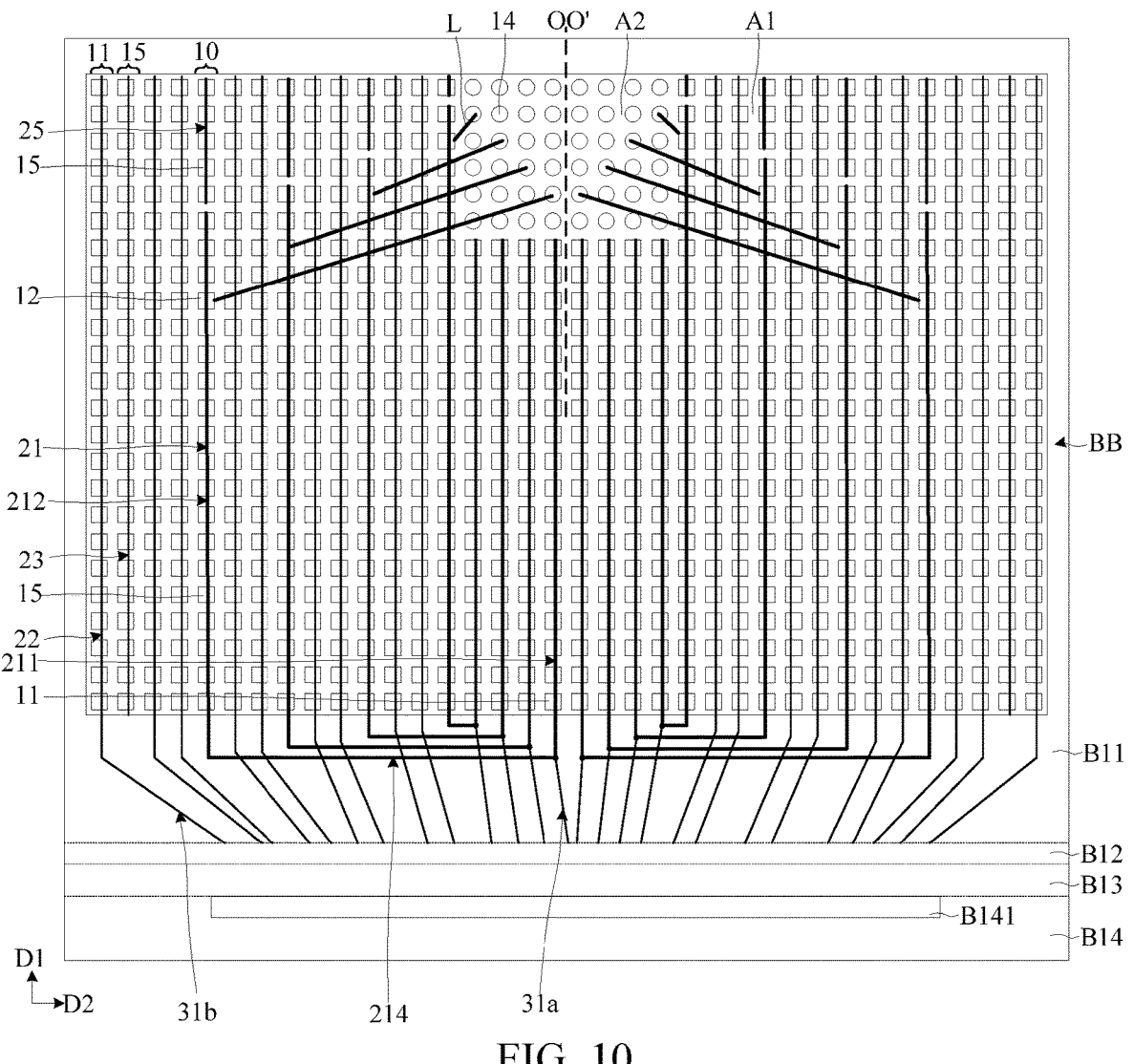
FIG. 10 is another partial trace schematic diagram of a display substrate according to at least one embodiment of the present disclosure.

FIG. 10 is another partial trace schematic diagram of a display substrate according to at least one embodiment of the present disclosure. In some exemplary implementations, as shown in FIG. 10, the first display region A1 surrounds three sides (e.g. left side, right side, and lower side) of the second display region A2. The second light-emitting element 14 in the second display region A2 may be electrically connected with the second active pixel circuit 12 in the first display region A1 through a transparent conductive line L, and the second light-emitting element 14 may not be in a same row as the second active pixel circuit 12 electrically connected thereto. For example, the second light-emitting element 14 may be electrically connected with the second active pixel circuit 12 away from the upper bezel in the first display region A1. The transparent conductive line L may extend in a direction in which the first direction D1 intersects with the second direction D2, and an orthographic projection of the transparent conductive line L on the base substrate may be overlapped with an orthographic projection of the pixel circuit on the base substrate. In this example, a second sub-data line 212 of the first data line 21 may be electrically connected with a column of second active pixel circuits 12, at least one dummy pixel circuit 15 arranged along the first direction D1 on a side of the column of the second active pixel circuit 12 away from the first lead-out region B11 may be electrically connected with a fifth data line 25, and the fifth data line 25 may not be electrically connected with the second sub-data line 212. The dummy pixel circuit 15 electrically connected with the fifth data line 25 and the second active pixel circuit 12 electrically connected with the second sub-data line 212 may be located in a same column, and the fifth data line 25 and the second sub-data line 212 may be disconnected. In some other examples, the fifth data line 25 may be overlapped and not electrically connected with at least one dummy pixel circuit 15 arranged along the first direction D1 on a side of the column of the second active pixel circuits 12 away from the first trace lead-out region B11. However, this embodiment is not limited thereto. For the rest structures of the display substrate according to this embodiment, reference may be made to descriptions of the aforementioned embodiments, and repetition will not be made here.

Figure 11:
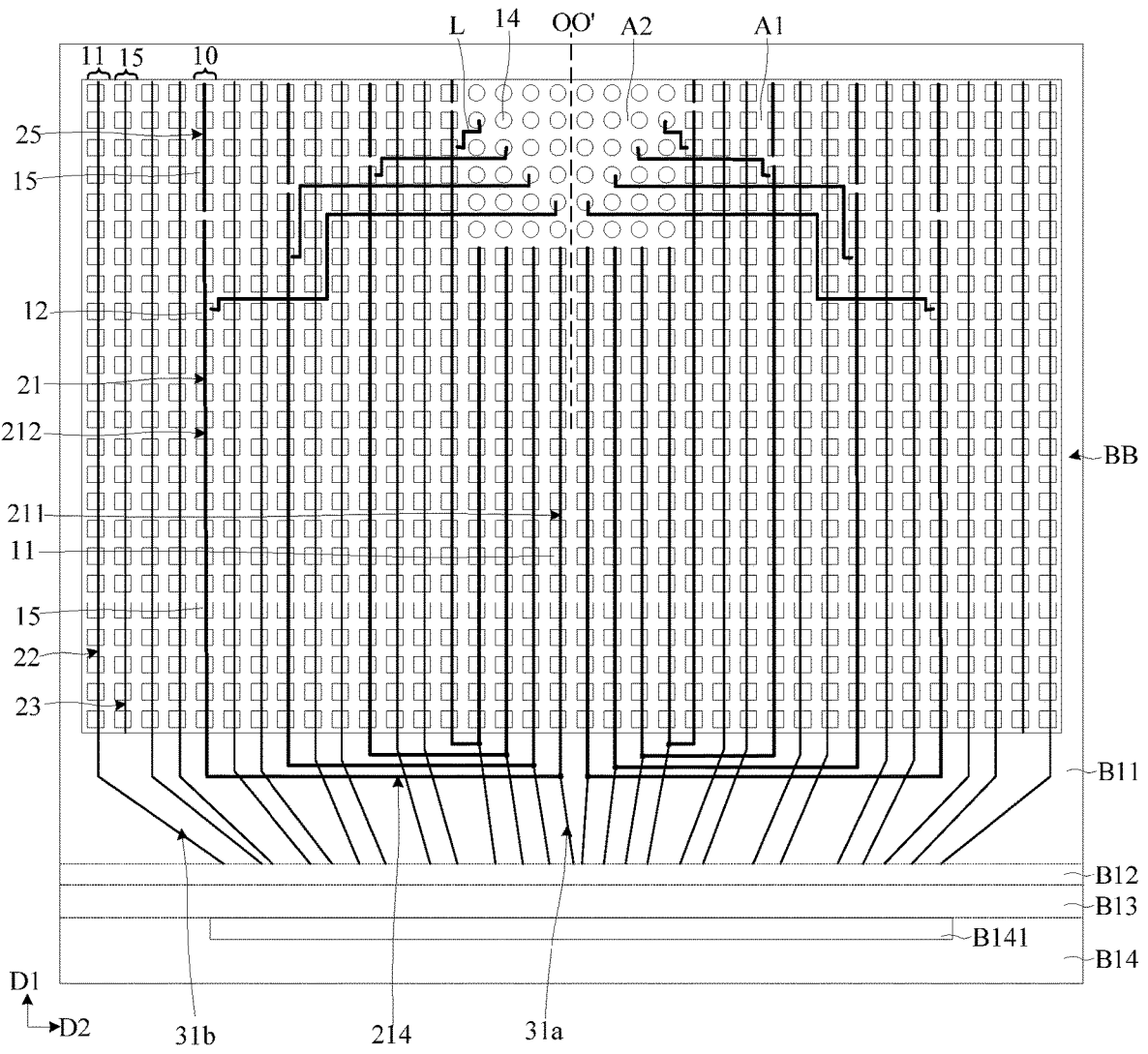
FIG. 11 is another partial trace schematic diagram of a display substrate according to at least one embodiment of the present disclosure.

FIG. 11 is another partial trace schematic diagram of a display substrate according to at least one embodiment of the present disclosure. In some exemplary implementations, as shown in FIG. 11, the second light-emitting element 14 in the second display region A2 may be electrically connected with the second active pixel circuit 12 in the first display region A1 through a transparent conductive line L, and the second light-emitting element 14 and the second active pixel circuit 12 electrically connected thereto may not be located in a same row. For example, the transparent conductive line L may extend in the first direction D1 and the second direction D2 sequentially, in order to electrically connect the second light-emitting element 14 and the second active pixel circuit 12. An orthographic projection of the transparent conductive line L on the base substrate may not be overlapped with an orthographic projection of the pixel circuit on the base substrate. An orthographic projection of the transparent conductive line L on the base substrate may be located in a gap between adjacent pixel circuits. However, this embodiment is not limited thereto. For the rest structures of the display substrate according to this embodiment, reference may be made to descriptions of the above embodiments, and repetition will not be made here.

Figure 12:
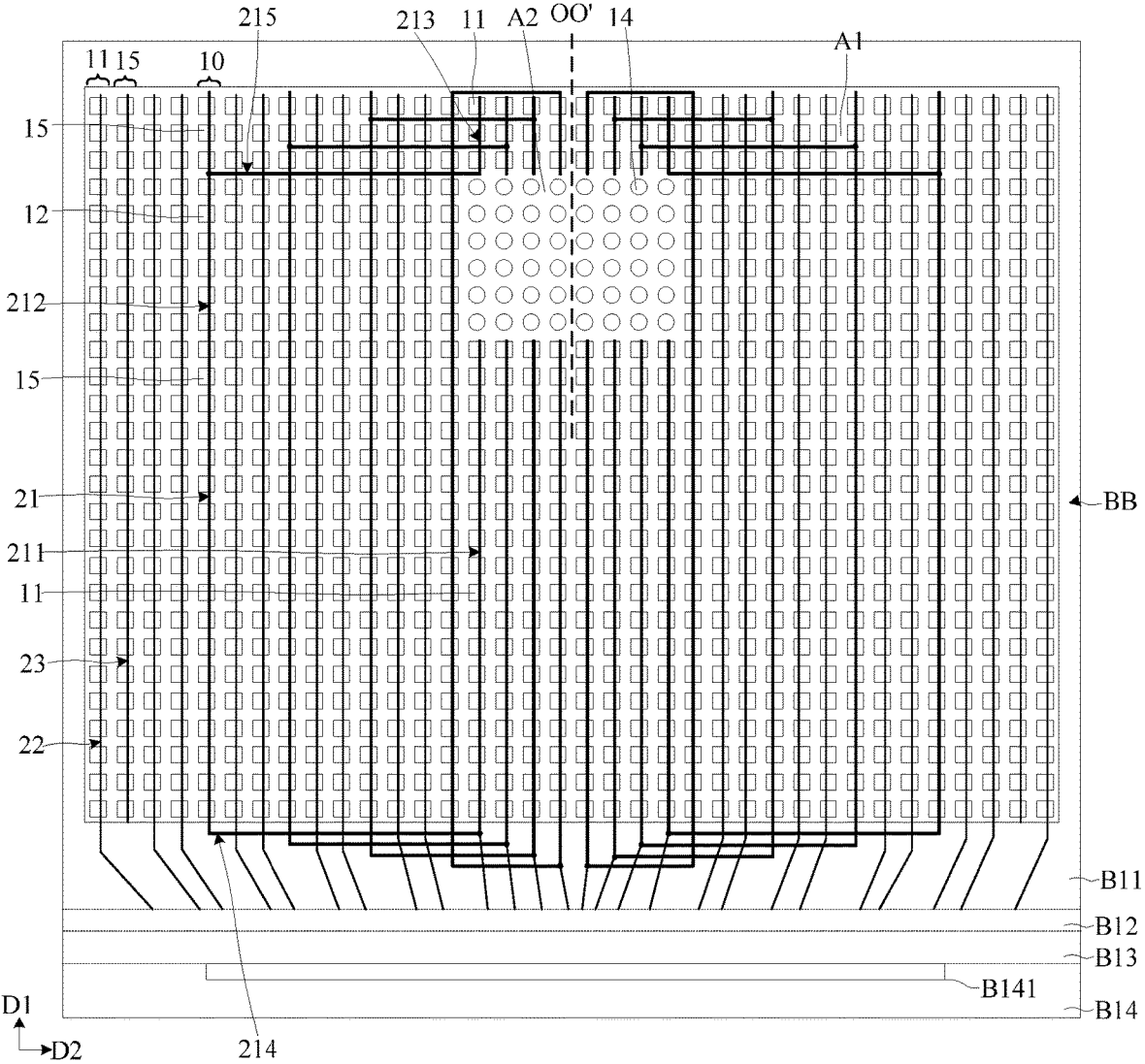
FIG. 12 is another partial trace schematic diagram of a display substrate according to at least one embodiment of the present disclosure.

FIG. 12 is another partial trace schematic diagram of a display substrate according to at least one embodiment of the present disclosure. In some exemplary implementations, as shown in FIG. 12, the first display region A1 surrounds the second display region A2. The first data line 21 may include a first sub-data line 211, a second sub-data line 212, and a third sub-data line 213 extending along the first direction D1. The first sub-data line 211 may be electrically connected with a column of first pixel circuits 11 in the first display region A1 at the lower side of the second display region A2. The third sub-data line 213 may be electrically connected with a column of first pixel circuits 11 in the first display region A1 on the upper side of the second display region A2. The first pixel circuit 11 with which the first sub-data line 211 is electrically connected and the first pixel circuit 11 with which the third sub-data line 213 is electrically connected may be located in a same column. The second sub-data line 212 may be electrically connected with a column of second pixel circuits 10 (e.g., including multiple second active pixel circuits 12 and multiple dummy pixel circuits 15, or including multiple second active pixel circuits 12) in the first display region A1 on the left side or right side of the second display region A2. The first sub-data line 211 and the second sub-data line 212 of the first data line 21 may be electrically connected through a first transfer line 214, and the second sub-data line 212 and the third sub-data line 213 may be electrically connected through a second transfer line 215. For example, the first transfer line 214 and the second transfer line 215 may both extend along the second direction D2. The first transfer line 214 and the second transfer line 215 may be of a same layer structure. The first transfer line 214 may be located in the first trace lead-out region B11 of the first bezel region. The second transfer line 215 may be located in the first display region A1 on the upper side of the second display region A2. For the rest structures of the display substrate according to this embodiment, reference may be made to descriptions of the aforementioned embodiments, and repetition will not be made here.

Figure 13:
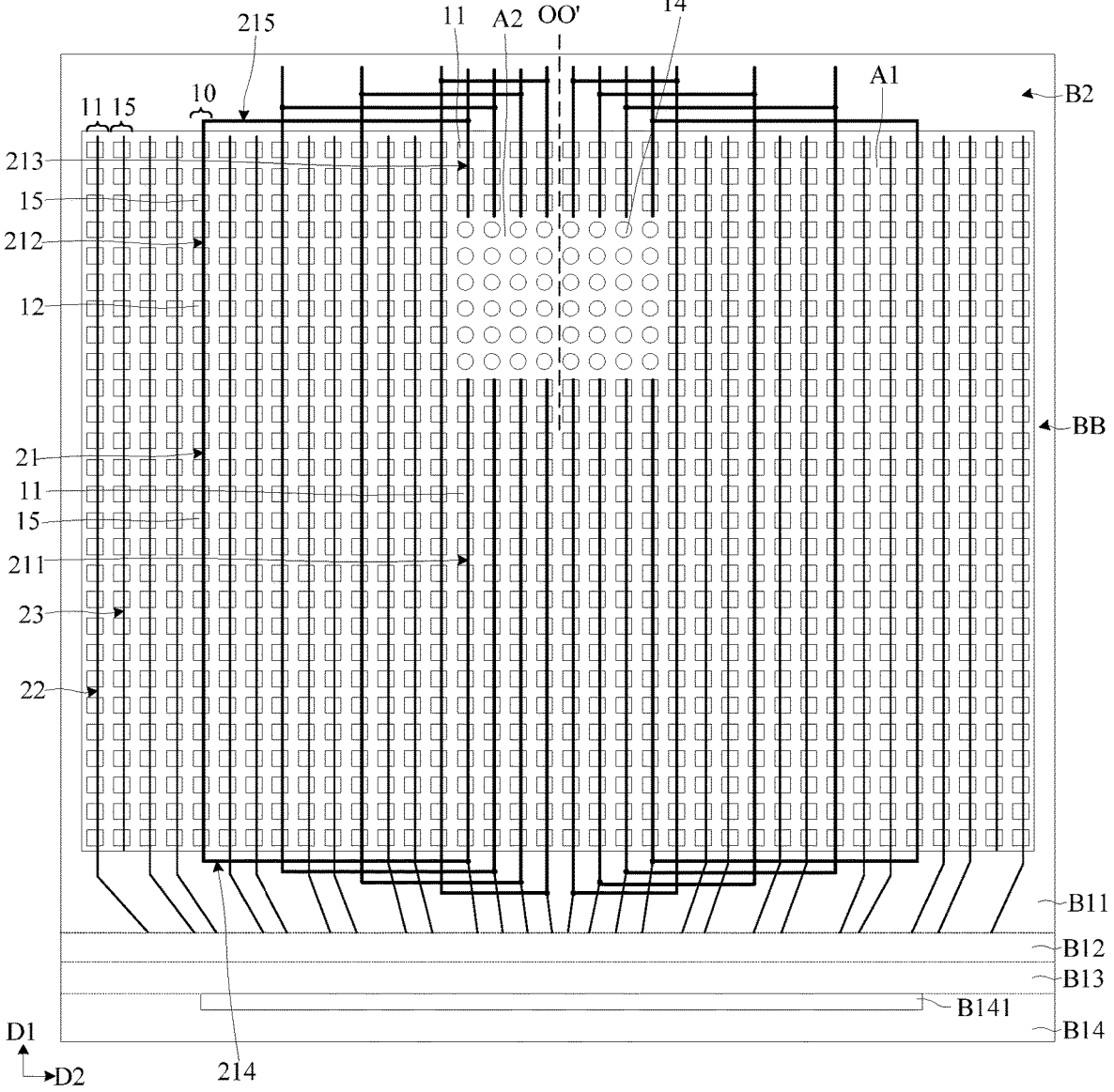
FIG. 13 is another partial trace schematic diagram of a display substrate according to at least one embodiment of the present disclosure.

FIG. 13 is another partial trace schematic diagram of a display substrate according to at least one embodiment of the present disclosure. In some exemplary implementations, as shown in FIG. 13, the first display region A1 surrounds the second display region A2. The first data line 21 may include a first sub-data line 211, a second sub-data line 212, and a third sub-data line 213 extending along the first direction D1. The first sub-data line 211 and the second sub-data line 212 of the first data line 21 may be electrically connected through a first transfer line 214, and the first transfer line 214 may be located in the first trace lead-out region B11 and extend along the second direction D2. The second sub-data line 212 and the third sub-data line 213 of the first data line 21 may be electrically connected through a second transfer line 215. The second transfer line 215 may be located on the second bezel region B2. In some examples, the second transfer line 215 may extend along the second direction D2, one end of the second transfer line 215 may be electrically connected with the second sub-data line 212 extending into the second bezel region B2, and the other end may be electrically connected with the third sub-data line 213 extending into the second bezel region B2. In some other examples, the second sub-data line 212 and the third sub-data line 213 may not extend into the second bezel region B2 to avoid affecting other traces, in this case the second transfer line 215 may include a first part extending along the first direction D1, a second part extending along the second direction D2, and a third part extending along the first direction D1. The first part, the second part, and the third part are sequentially connected, the first part may be electrically connected with the second sub-data line 212, and the third part may be electrically connected with the third sub-data line 213. Herein, the first part and the second part may be of a same layer structure, and the second part may be in a different layer structure from the third part. However, this embodiment is not limited thereto. For the rest structures of the display substrate according to this embodiment, reference may be made to descriptions of the aforementioned embodiments, and repetition will not be made here.

Figure 14:
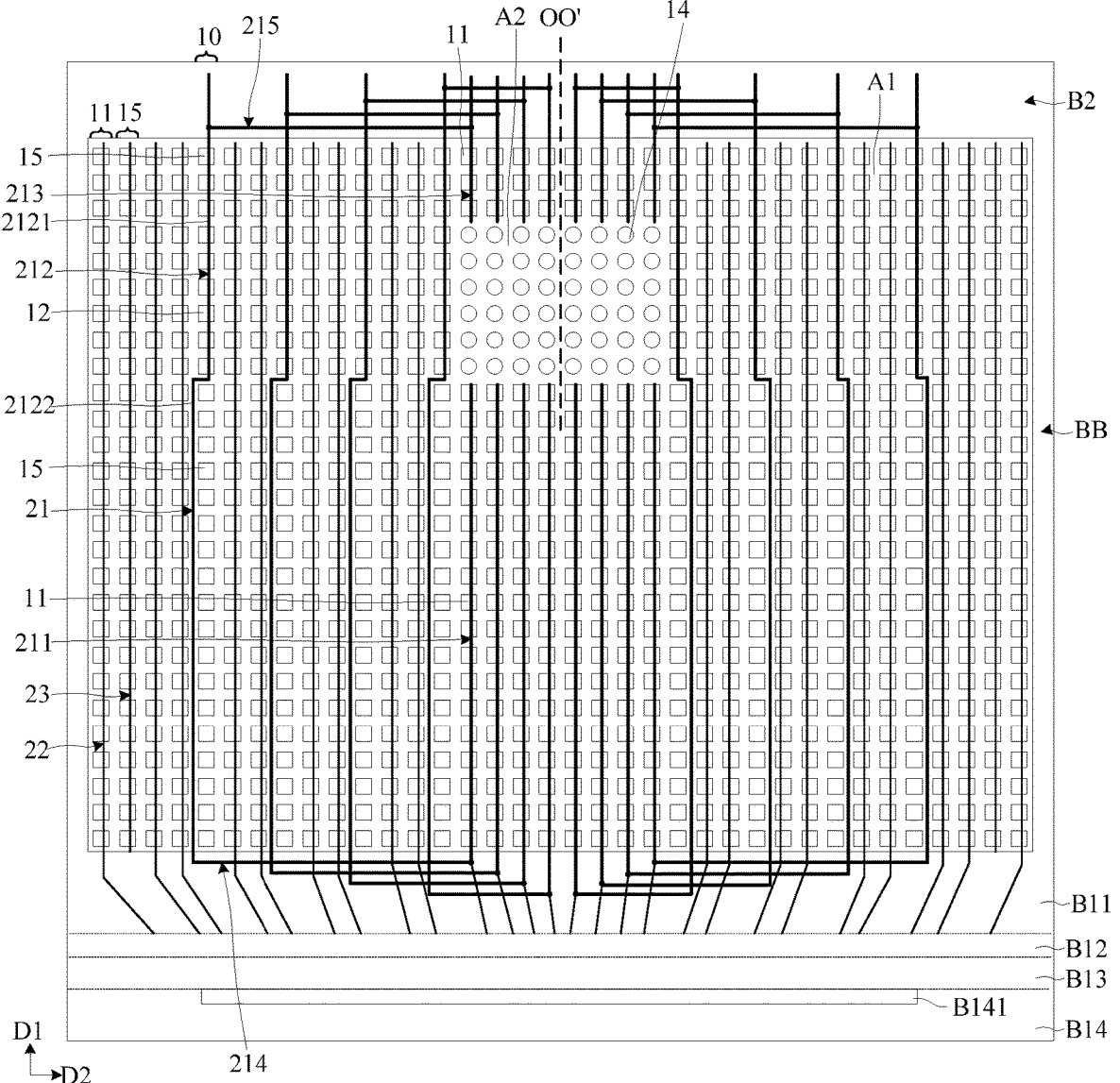
FIG. 14 is another partial trace schematic diagram of a display substrate according to at least one embodiment of the present disclosure.

FIG. 14 is another partial trace schematic diagram of a display substrate according to at least one embodiment of the present disclosure. In some exemplary implementations, as shown in FIG. 14, the first data line 21 may include a first sub-data line 211, a second sub-data line 212, and a third sub-data line 213 that extend along the first direction D1. The second sub-data line 212 may include a first line segment 2121 and a second line segment 2122. The first line segment 2121 and the second line segment 2122 may extend along the first direction D1. The first line segment 2121 may be electrically connected with the third sub-data line 213 through the second transfer line 215. The second line segment 2122 may be electrically connected with the first sub-data line 211 through the first transfer line 214. The first line segment 2121 of the second sub-data line 212 may be electrically connected with multiple second active pixel circuits 12 arranged along the first direction D1. The first line segment 2121 of the second sub-data line 212 may also be overlapped with multiple dummy pixel circuits 15 located in a same column as the multiple second active pixel circuits 12 in the first display region A1 on the upper side of the second display region A2, and may not be electrically connected or may be electrically connected. The second line segment 2122 of the second sub-data line 212 may not be electrically connected with the pixel circuit. In some examples, an orthographic projection of the second line segment 2122 on the base substrate may not be overlapped with orthographic projections of multiple dummy pixel circuits 15 on the base substrate, and may not be electrically connected. In some other examples, the orthographic projection of the second line segment 2122 on the base substrate may be overlapped with orthographic projections of multiple dummy pixel circuits 15 in a same column as the second active pixel circuit 12 electrically connected with the first line segment 2121 on the base substrate, and may not be electrically connected. In this example, the resistance of the second sub-data line 212 can be reduced by reducing the number of dummy pixel circuits 15 connected with the second sub-data line 212. However, this embodiment is not limited thereto. In some other examples, the first line segment of the second sub-data line may only be electrically connected with the second active pixel circuit, but not electrically connected with the dummy pixel circuit.

In some other examples, the second line segment 2122 of the second sub-data line 212 of the first data line 21 may be of a double-layer trace structure to reduce the resistance of the second sub-data line 212. For example, the second line segment 2122 may include a first trace and a second trace electrically connected to each other, and an orthographic projection of the second trace on the base substrate may be overlapped with an orthographic projection of the first trace on the base substrate. The first line segment 2121 and the first trace or the second trace of the second line segment 2122 may be of a same layer structure. However, this embodiment is not limited thereto. In some other examples, the second sub-data line may be of a double-layer trace structure; alternatively, the first sub-data line, the second sub-data line, and the third sub-data line may all be of a double-layer trace structure.

Figure 15:
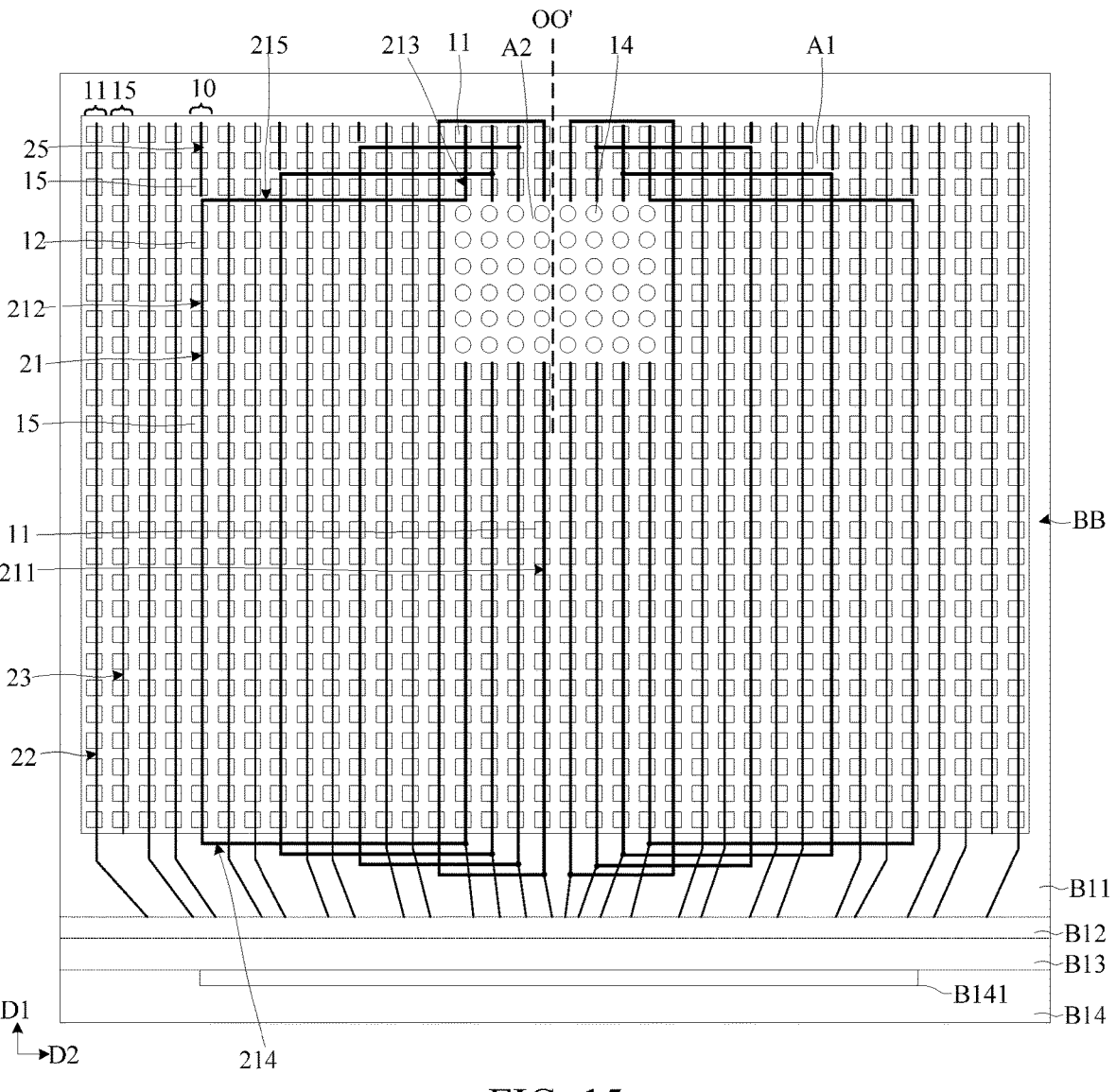
FIG. 15 is another partial trace schematic diagram of a display substrate according to at least one embodiment of the present disclosure.

FIG. 15 is another partial trace schematic diagram of a display substrate according to at least one embodiment of the present disclosure. In some exemplary implementations, as shown in FIG. 15, the first display region A1 surrounds the second display region A2. The fifth data line 25 may be electrically connected with multiple dummy pixel circuits 15 arranged along the first direction D1 in the first display region A1 located on a side of the second display region A2 away from the first bezel region. In the first display region A1 on a side of the second display region A2 away from the first bezel region, multiple dummy pixel circuits 15 located in a same column as multiple second pixel circuits 10 electrically connected with the first data line 21 may be electrically connected by a fifth data line 25. The dummy pixel circuits 15 with which the fifth data line 25 is electrically connected and multiple second active pixel circuits 12 with which the second sub-data line 212 of the first data line 21 is electrically connected may be located in a same column, and the second sub-data line 212 and the fifth data line 25 may be disconnected. In some other examples, the fifth data line 25 may not be provided i.e., the dummy pixel circuit 15 may not be electrically connected or overlapped with the data line. However, this embodiment is not limited thereto. For the other descriptions for the display substrate according to this embodiment, reference may be made to descriptions of the aforementioned embodiments, and repetition will not be made here.

Figure 16:
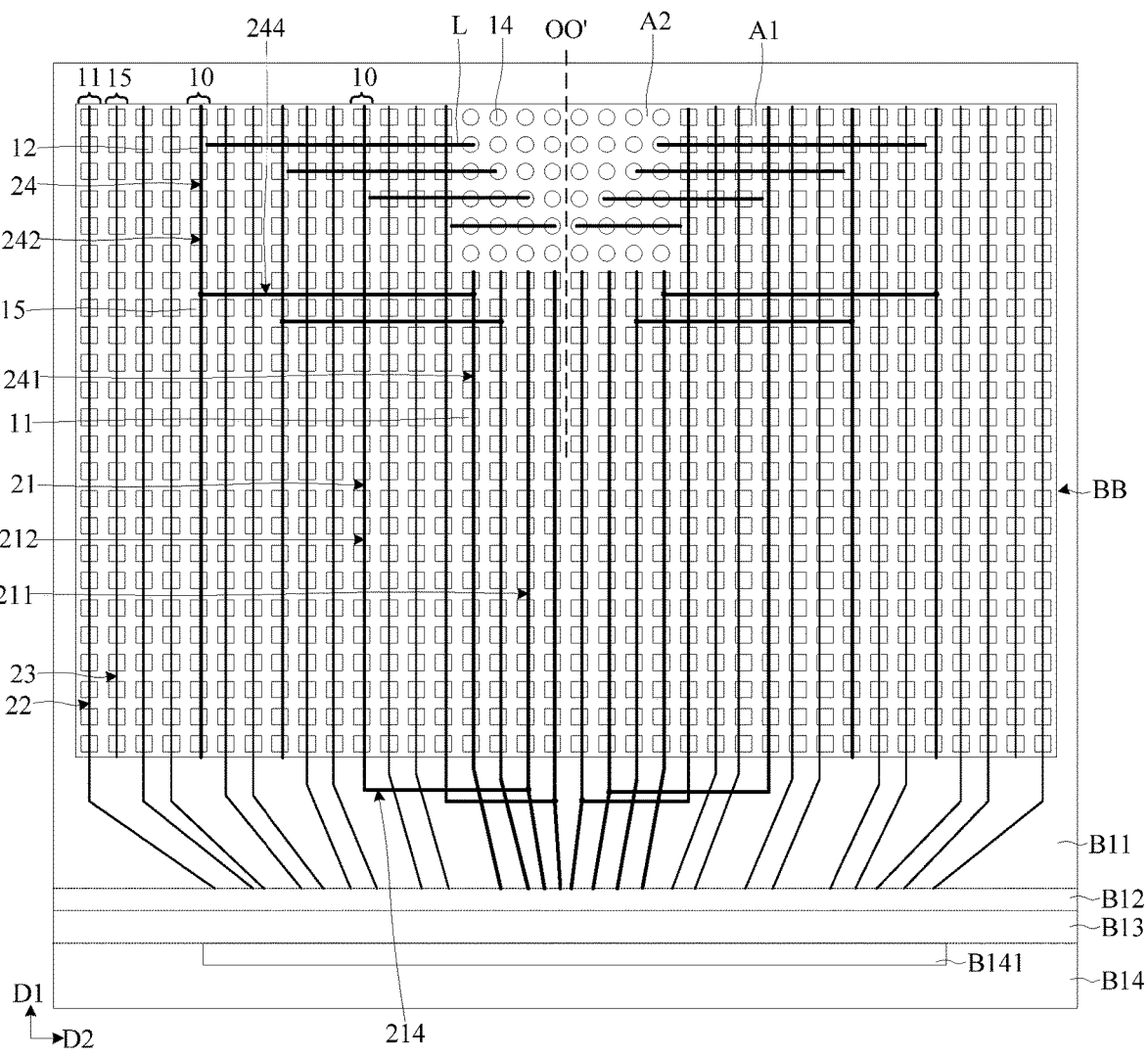
FIG. 16 is another partial trace schematic diagram of a display substrate according to at least one embodiment of the present disclosure.

FIG. 16 is another partial trace schematic diagram of a display substrate according to at least one embodiment of the present disclosure. In some exemplary embodiments, as shown in FIG. 16, the first display region A1 surrounds three sides (e.g. left side, right side, and lower side) of the second display region A2. The upper side of the second display region A2 may be directly adjacent to the peripheral region BB. The display substrate may be provided with multiple first data lines 21, multiple second data lines 22, multiple third data lines 23, and multiple fourth data lines 24. The multiple first data lines 21 may be located on a side of the multiple fourth data lines 24 close to the first center line of the second display region A2. There may be no fourth data line 24 between adjacent first data lines 21, and there may be no first data line 21 between adjacent fourth data lines 24. However, this embodiment is not limited thereto. For example, the multiple first data lines 21 may be located on a side of the multiple fourth data lines 24 away from the first center line of the second display region A2.

In some examples, as shown in FIG. 16, the first data line 21 may include a first sub-data line 211 and a second sub-data line 212 extending along the first direction D1, and the first sub-data line 211 and the second sub-data line 212 may be electrically connected through a first transfer line 214 extending along the second direction D2. The first transfer line 214 may be located on the first trace lead-out region B11. The fourth data line 24 may include a fourth sub-data line 241 and a fifth sub-data line 242 extending along the first direction D1, and the fourth sub-data line 241 and the fifth sub-data line 242 may be electrically connected through a third transfer line 244 extending along the second direction D2. The third transfer line 244 may be located in the first display region A1 on the lower side of the second display region A2. The fourth sub-data line 241 may be electrically connected with a column of first pixel circuits 11 in the first display region A1 located on the lower side of the second display region A2. The fifth sub-data line 242 may be electrically connected with a column of second pixel circuits (including multiple second active pixel circuits 12 and multiple dummy pixel circuits 15) located in the first display region A1 on the left side or right side of the second display region A2. The first light-emitting element electrically connected with the first pixel circuit 11 with which the fourth sub-data line 241 is connected may be in a same column as the second light-emitting element 14 electrically connected with the second active pixel circuit 12 with which the fifth sub-data line 242 is connected. In this example, a distance between the third transfer line 244 and the second display region A2 may be smaller than a distance between the third transfer line 244 and the first bezel region. That is, the third transfer line 244 may be located in the first display region A1 close to the second display region A2. However, this embodiment is not limited thereto. In some other examples, a distance between the third transfer line 244 and the second display region A2 may be greater than a distance between the third transfer line 244 and the first bezel region. That is, the third transfer line 244 may be located in the first display region A1 close to the first bezel region.

In some examples, the second sub-data line 212 of the first data line 21 may be electrically connected with a column of second pixel circuits 10 (e.g., including a second active pixel circuit 12 and a dummy pixel circuit 15). In some other examples, the second sub-data line 212 may be electrically connected with only one column of the second active pixel circuits 12, and may be overlapped and not electrically connected with the dummy pixel circuits 15 remained in a same column as the second active pixel circuits 12. In some examples, the fifth sub-data line 242 of the fourth data line 24 may be electrically connected with a column of second pixel circuits 10 (e.g., including a second active pixel circuit 12 and a dummy pixel circuit 15). In some other examples, the fifth sub-data line 242 may be electrically connected with a column of second active pixel circuits 12, and not electrically connected with the dummy pixel circuits 15 located in a same column as the second active pixel circuits 12, and only overlapped with multiple dummy pixel circuits 15 located in a same column as the second active pixel circuits 12. However, this embodiment is not limited thereto. For the rest description for the display substrate according to this embodiment, reference may be made to descriptions of the aforementioned embodiments, and repetition will not be made here.

Figure 17:
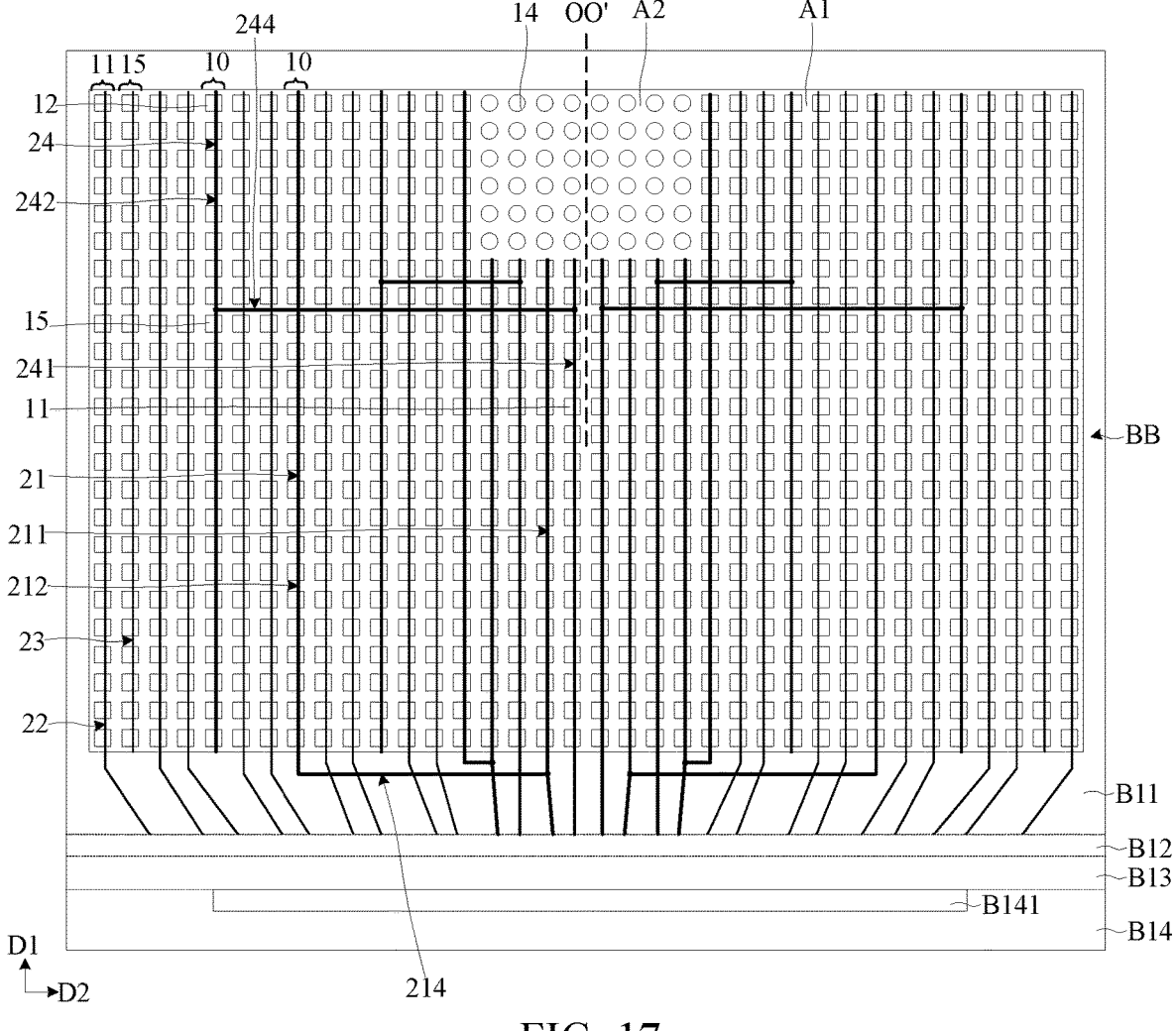
FIG. 17 is another partial trace schematic diagram of a display substrate according to at least one embodiment of the present disclosure.

FIG. 17 is another partial trace schematic diagram of a display substrate according to at least one embodiment of the present disclosure. In some exemplary implementations, as shown in FIG. 17, the first data line 21 and the fourth data line 24 are arranged at intervals. There may be no other first data line and other fourth data line between adjacent first data lines 21 and between adjacent fourth data lines 24. Multiple second data lines 22 (e.g., two second data lines 22) may be arranged between adjacent first data line 21 and fourth data line 24. For the rest description for the display substrate according to this embodiment, reference may be made to descriptions of the aforementioned embodiments, and repetition will not be made here.

Figure 18:
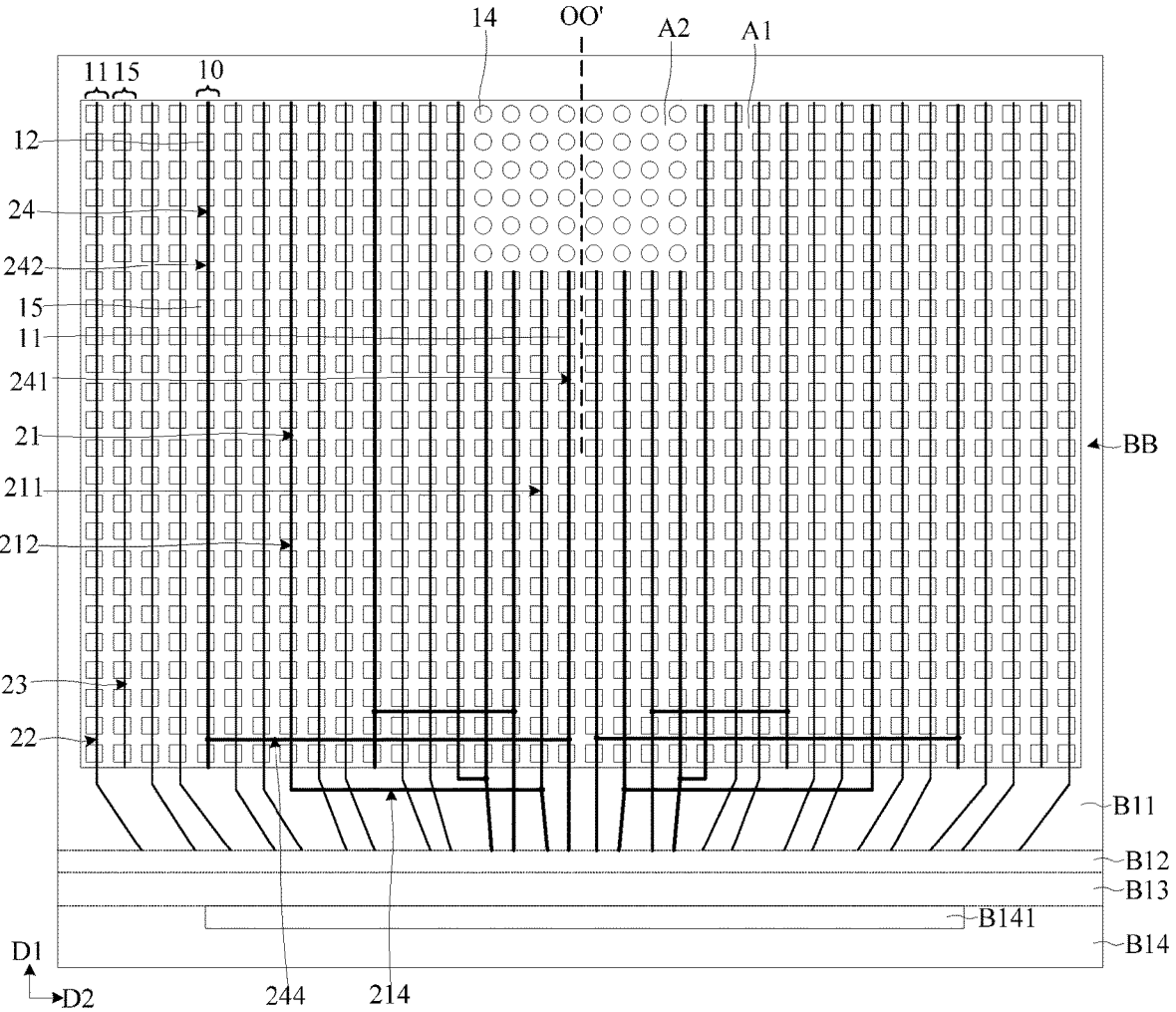
FIG. 18 is another partial trace schematic diagram of a display substrate according to at least one embodiment of the present disclosure.

FIG. 18 is another partial trace schematic diagram of a display substrate according to at least one embodiment of the present disclosure. In some exemplary implementations, as shown in FIG. 18, the fourth sub-data line 241 and the fifth sub-data line 242 of the fourth data line 24 may be electrically connected through the third transfer line 244. The third transfer line 244 may extend along the second direction D2, and is located in a part of the first display region A1 close to the first trace lead-out region B11. For the rest description for the display substrate according to this embodiment, reference may be made to descriptions of the aforementioned embodiments, and repetition will not be made here.

Figure 19:
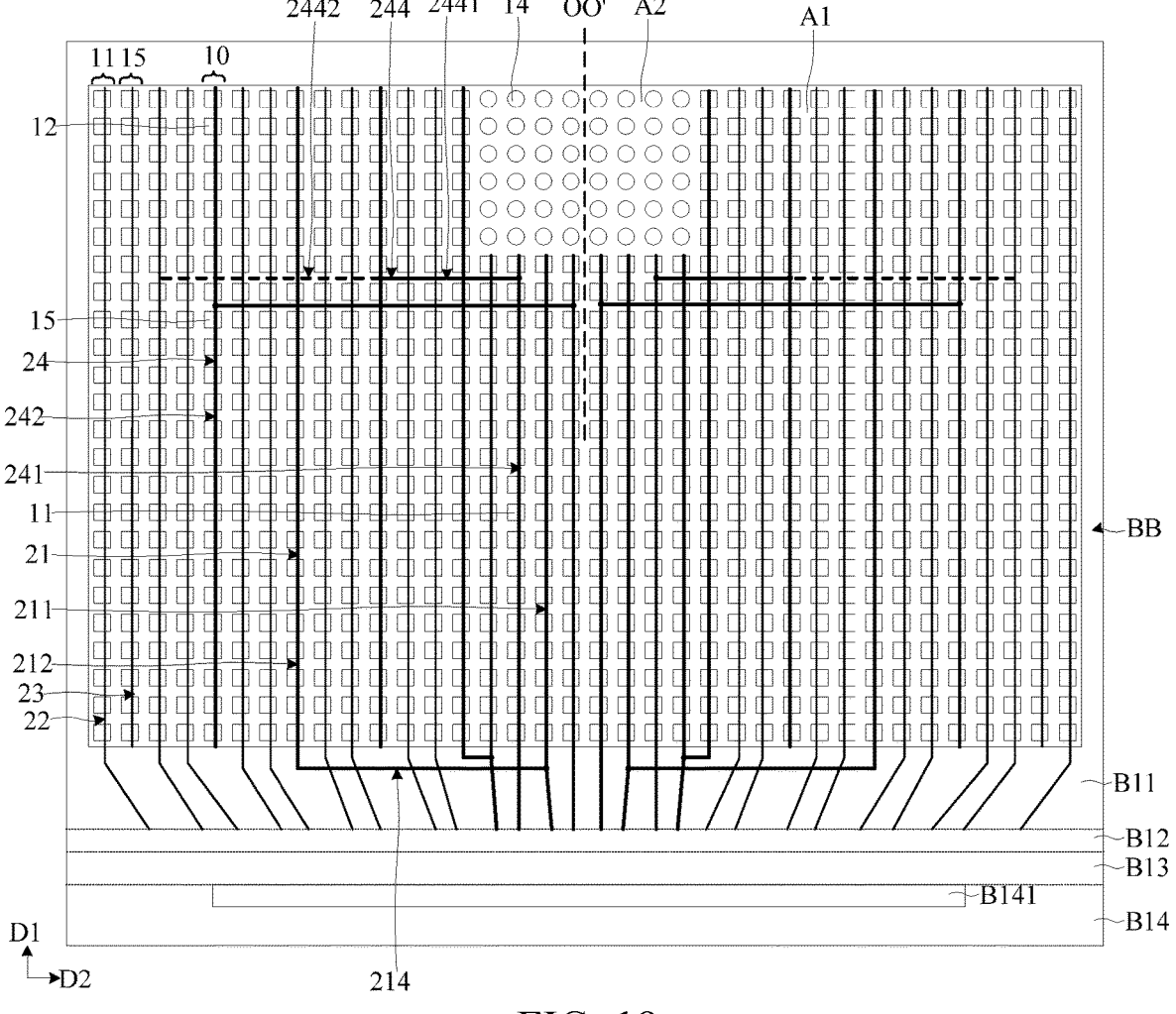
FIG. 19 is another partial trace schematic diagram of a display substrate according to at least one embodiment of the present disclosure.

FIG. 19 is another partial trace schematic diagram of a display substrate according to at least one embodiment of the present disclosure. In some exemplary implementations, as shown in FIG. 19, the fourth sub-data line 241 and the fifth sub-data line 242 of the fourth data line 24 may be electrically connected through the third transfer line 244. Lengths of multiple third transfer lines 244 connected with multiple fourth data lines 24 of the first display region A1 along the second direction D2 may be substantially the same. At least one third transfer line 244 may include a first connection part 2441 and an extension part 2442 (illustrated in dashed lines in FIG. 19). The first end of the first connection part 2441 may be electrically connected with the fourth sub-data line 241, the second end of the first connection part 2441 may be electrically connected with the fifth sub-data line 242, and the second end of the first connection part 2441 may be electrically connected with the extension part 2442. In this example, the first connection part 2441 and the extension part 2442 may be of an integrated structure. By extending the third transfer line 244 along the second direction D2 to increase the length of the third transfer line 244 along the second direction D2, the lengths of multiple third transfer lines along the second direction D2 may be substantially the same, thereby ensuring the consistency of signals transmitted by the fourth data line 24. For the rest description for the display substrate according to this embodiment, reference may be made to descriptions of the aforementioned embodiments, and repetition will not be repeated here.

Figure 20:
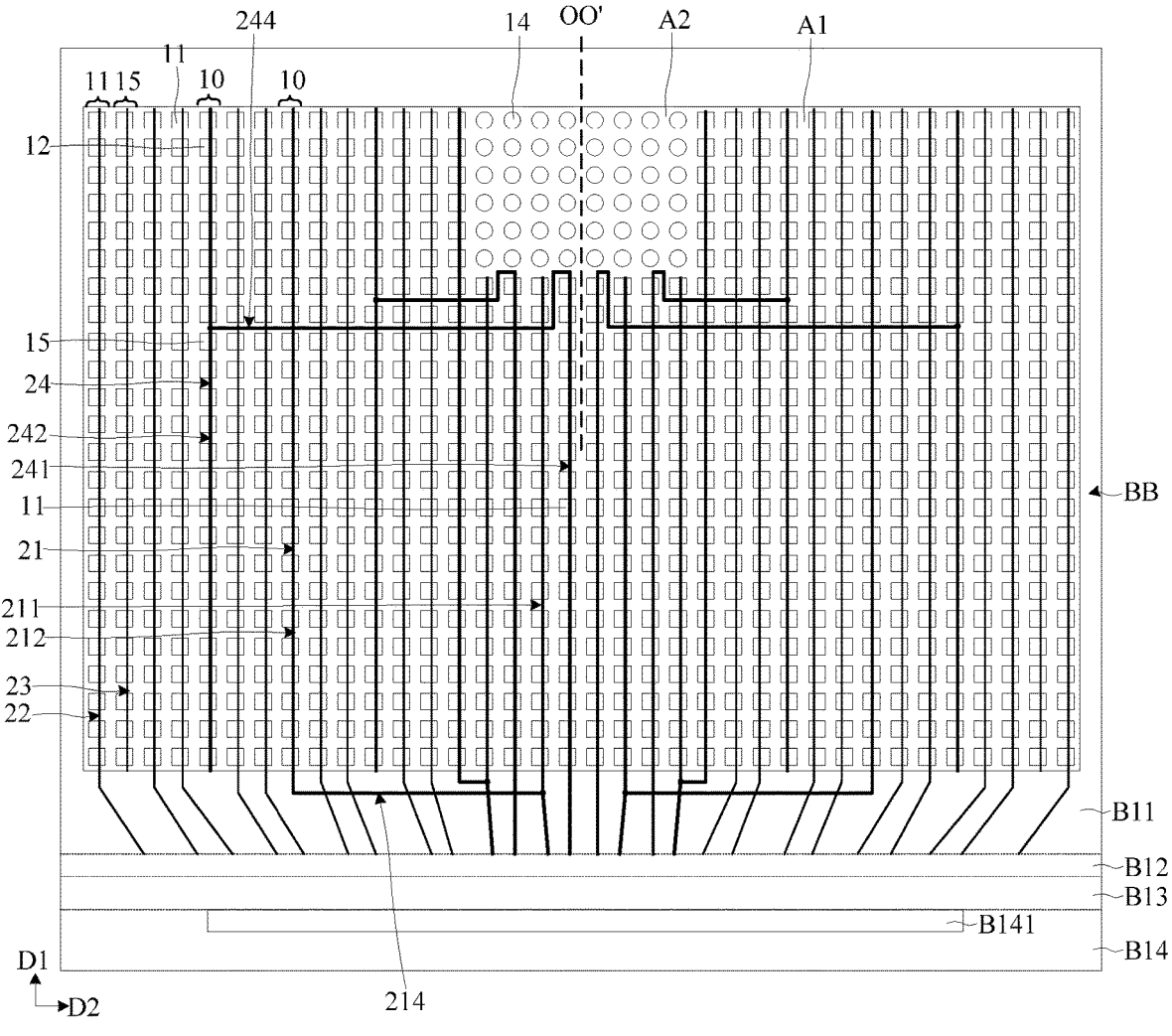
FIG. 20 is another partial trace schematic diagram of a display substrate according to at least one embodiment of the present disclosure.

FIG. 20 is another partial trace schematic diagram of a display substrate according to at least one embodiment of the present disclosure. In some exemplary implementations, as shown in FIG. 20, the fourth sub-data line 241 and the fifth sub-data line 242 of the fourth data line 24 are electrically connected through the third transfer line 244. One end of the third transfer line 244 is electrically connected with the fifth sub-data line 242, the other end of the third transfer line 244 is electrically connected with the fourth sub-data line 241, and the third transfer line 244 may be electrically connected with a first pixel circuit 11 closest to the second display region A2 (i.e., one of the first pixel circuits 11 located in the first row in the first display region A1 on the lower side of the second display region A2) among the multiple first pixel circuits 11 electrically connected with the fourth sub-data line 241. The third transfer line 244 is electrically connected with the first pixel circuit 11 closest to the second display region A2 by winding between rows and columns of the pixel circuits to ensure consistency of data signal transmission. In this example, only one third transfer line 244 may be arranged between adjacent pixel circuit rows in the first direction D1 in a region on a side of the first center line of the second display region A2 along the second direction D2. For the rest description for the display substrate according to this embodiment, reference may be made to descriptions of the aforementioned embodiments, and repetition will not be made here.

Figure 21:
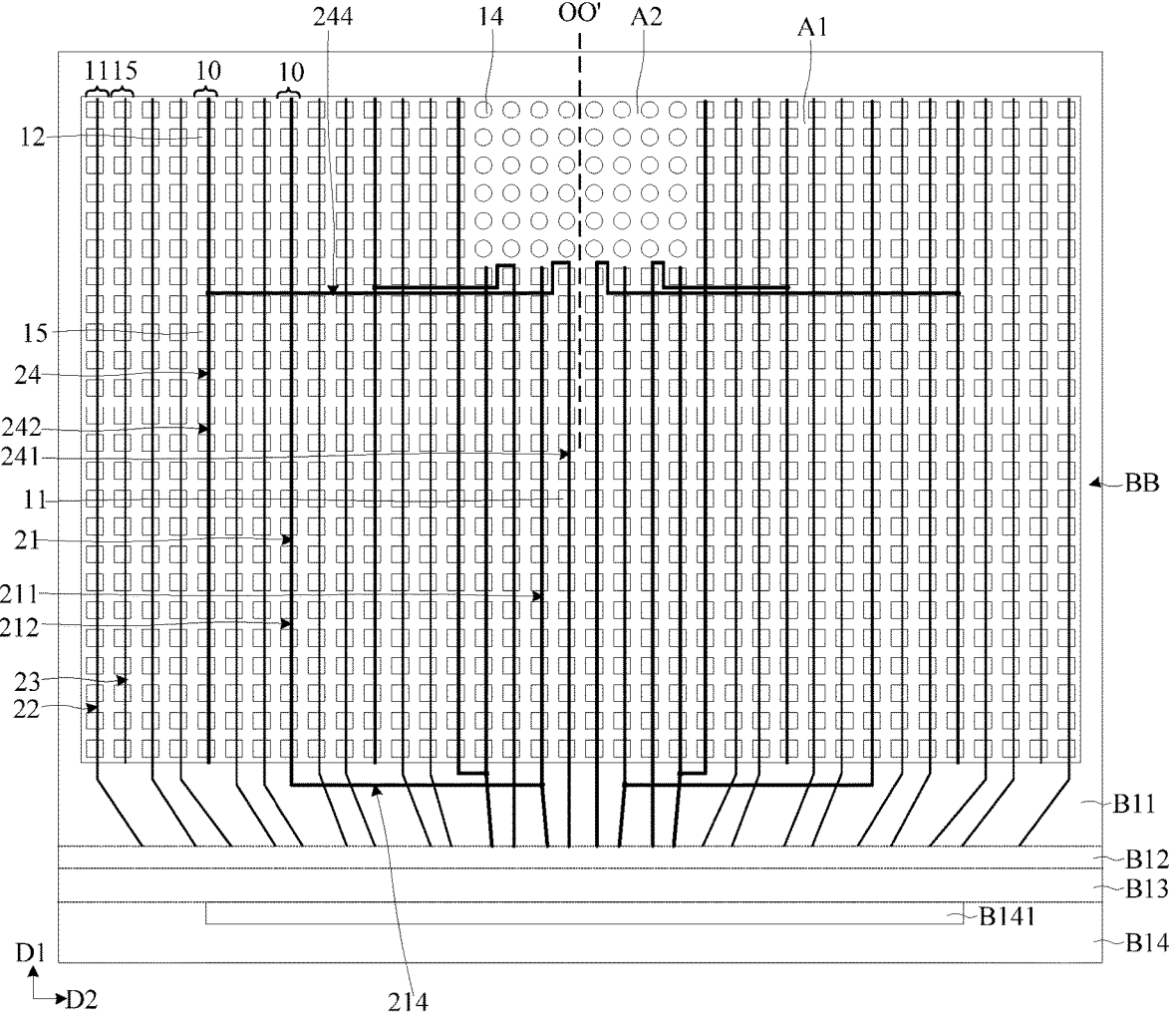
FIG. 21 is another partial trace schematic diagram of a display substrate according to at least one embodiment of the present disclosure.

FIG. 21 is another partial trace schematic diagram of a display substrate according to at least one embodiment of the present disclosure. In some exemplary implementations, as shown in FIG. 21, multiple (e.g., two) third transfer lines 244 may be arranged between adjacent pixel circuit rows in the first direction D1 in a region on a side of the first center line of the second display region A2 along the second direction D2. For the rest description for the display substrate according to this embodiment, reference may be made to descriptions of the aforementioned embodiments, and repetition will not be made here.

Figure 22:
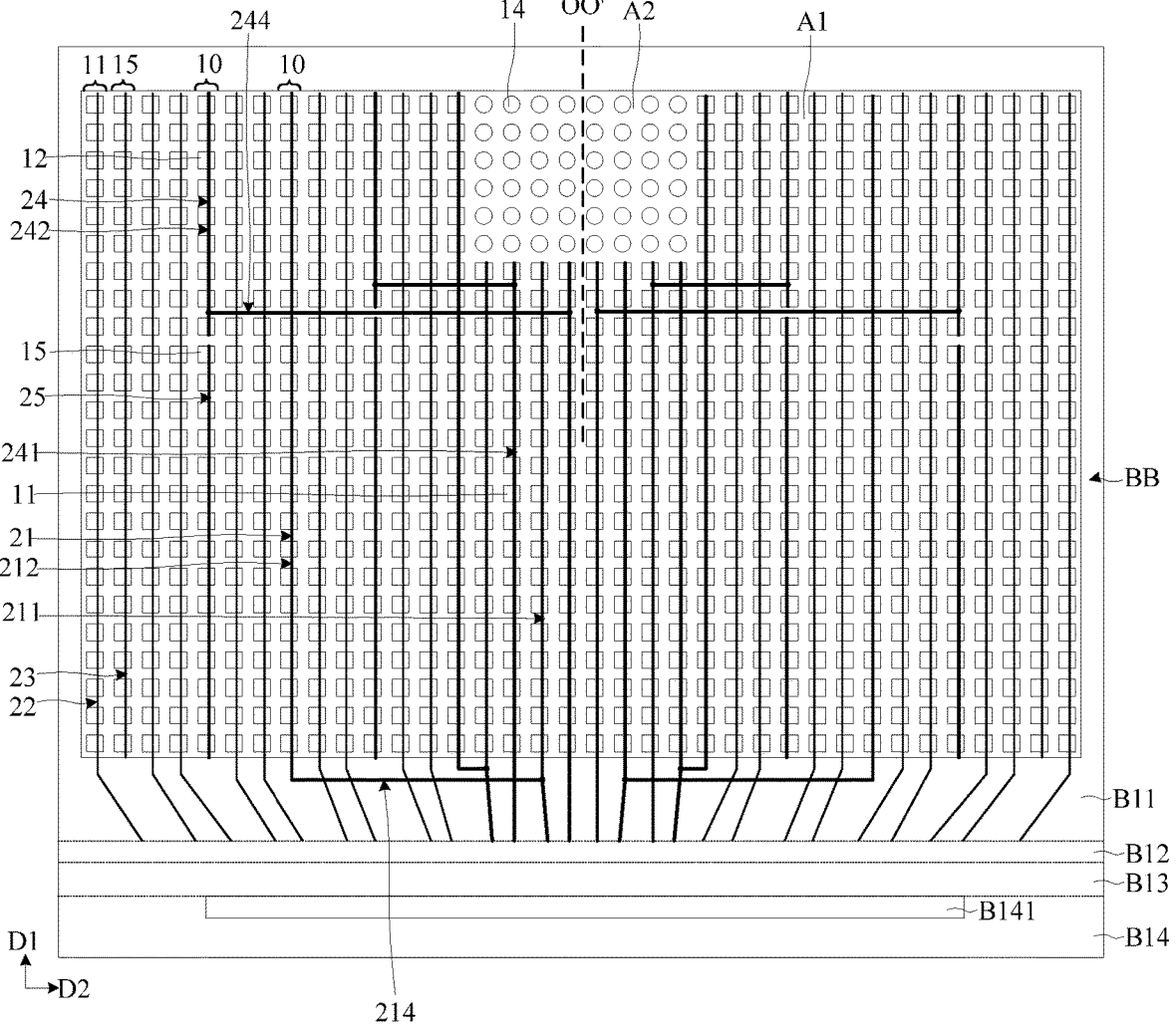
FIG. 22 is another partial trace schematic diagram of a display substrate according to at least one embodiment of the present disclosure.

FIG. 22 is another partial trace schematic diagram of a display substrate according to at least one embodiment of the present disclosure. In some exemplary implementations, as shown in FIG. 22, the first display region A1 may further be provided with multiple fifth data lines 25. The fifth data line 25 may be electrically connected with multiple dummy pixel circuits 15 arranged along the first direction D1 in the first display region A1 located on a side of the second display region A2 close to the first bezel region. Multiple dummy pixel circuits 15 located in a same column as multiple second pixel circuits 10 electrically connected with the fourth sub-data line 241 of the fourth data line are electrically connected by a fifth data line 25. There may be no electrical connection between the fifth data line 25 and the fourth data line 24. In some other examples, the fifth data line 25 may not be electrically connected with multiple dummy pixel circuits 15 arranged along the first direction D1, but there is only overlapping between the fifth data line 25 and the multiple dummy pixel circuits 15. However, this embodiment is not limited thereto. For the rest description for the display substrate according to this embodiment, reference may be made to descriptions of the aforementioned embodiments, and repetition will not be made here.

Figure 23:
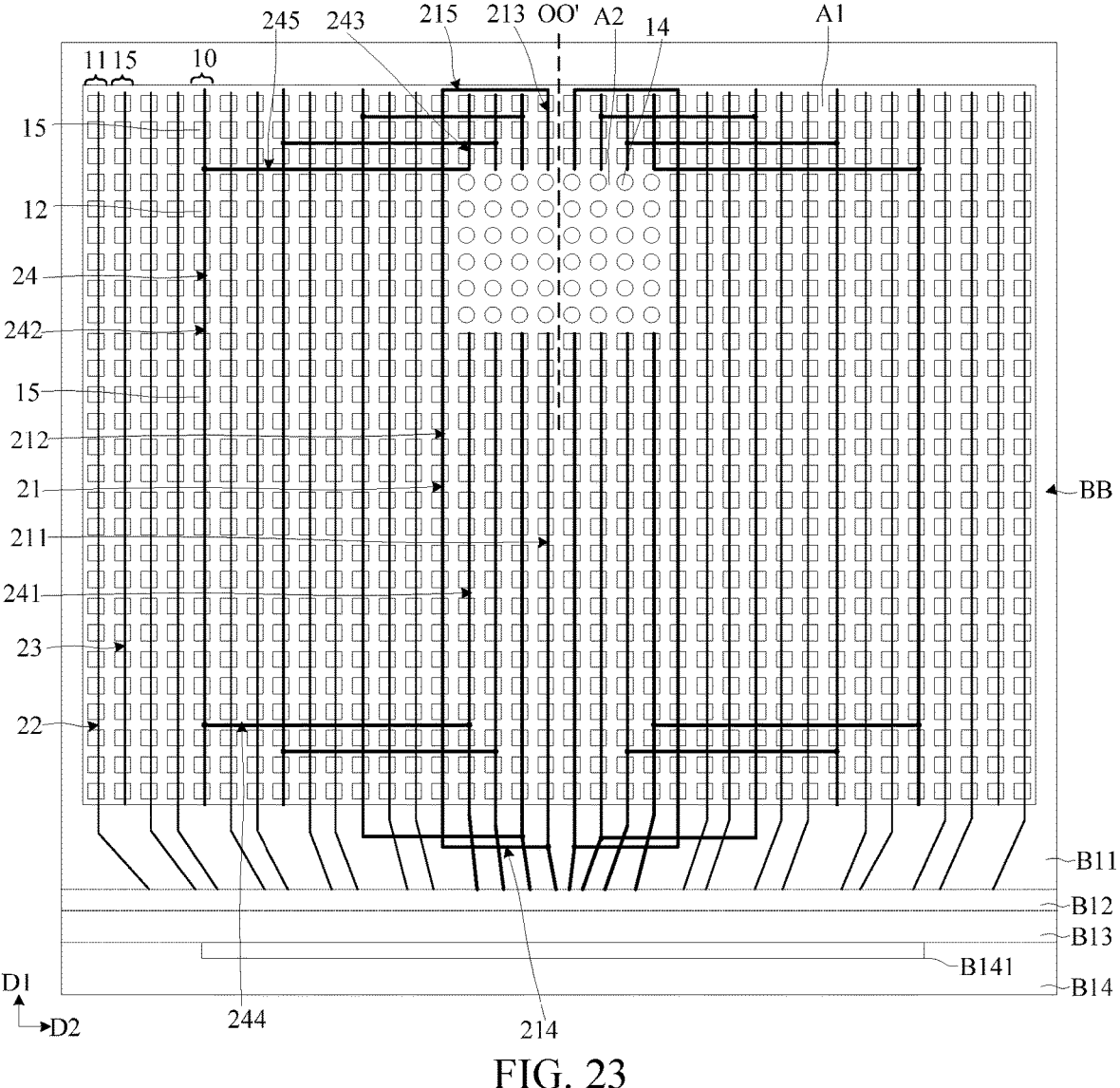
FIG. 23 is another partial trace schematic diagram of a display substrate according to at least one embodiment of the present disclosure.

FIG. 23 is another partial trace schematic diagram of a display substrate according to at least one embodiment of the present disclosure. In some exemplary implementations, as shown in FIG. 23, the first display region A1 surrounds the second display region A2. The display substrate may include a first data line 21, a second data line 22, a third data line 23, and a fourth data line 24. The fourth data line 24 may include a fourth sub-data line 241, a fifth sub-data line 242, and a sixth sub-data line 243. The fourth sub-data line 241 and the fifth sub-data line 242 of the fourth data line 24 may be electrically connected through the third transfer line 244, and the fifth sub-data line 242 and the sixth sub-data line 243 may be electrically connected through the fourth transfer line 245. The third transfer line 244 and the fourth transfer line 245 may be located in the first display region A1. The third transfer line 244 may be located in the first display region A1 and close to the first trace lead-out region B11, and the fourth transfer 245 may be located at a side of in the first display region A1 at which the second display region A2 is away from the first trace lead-out region B11. For the rest description for the display substrate according to this embodiment, reference may be made to descriptions of the aforementioned embodiments, and repetition will not be made here.

Figure 24:
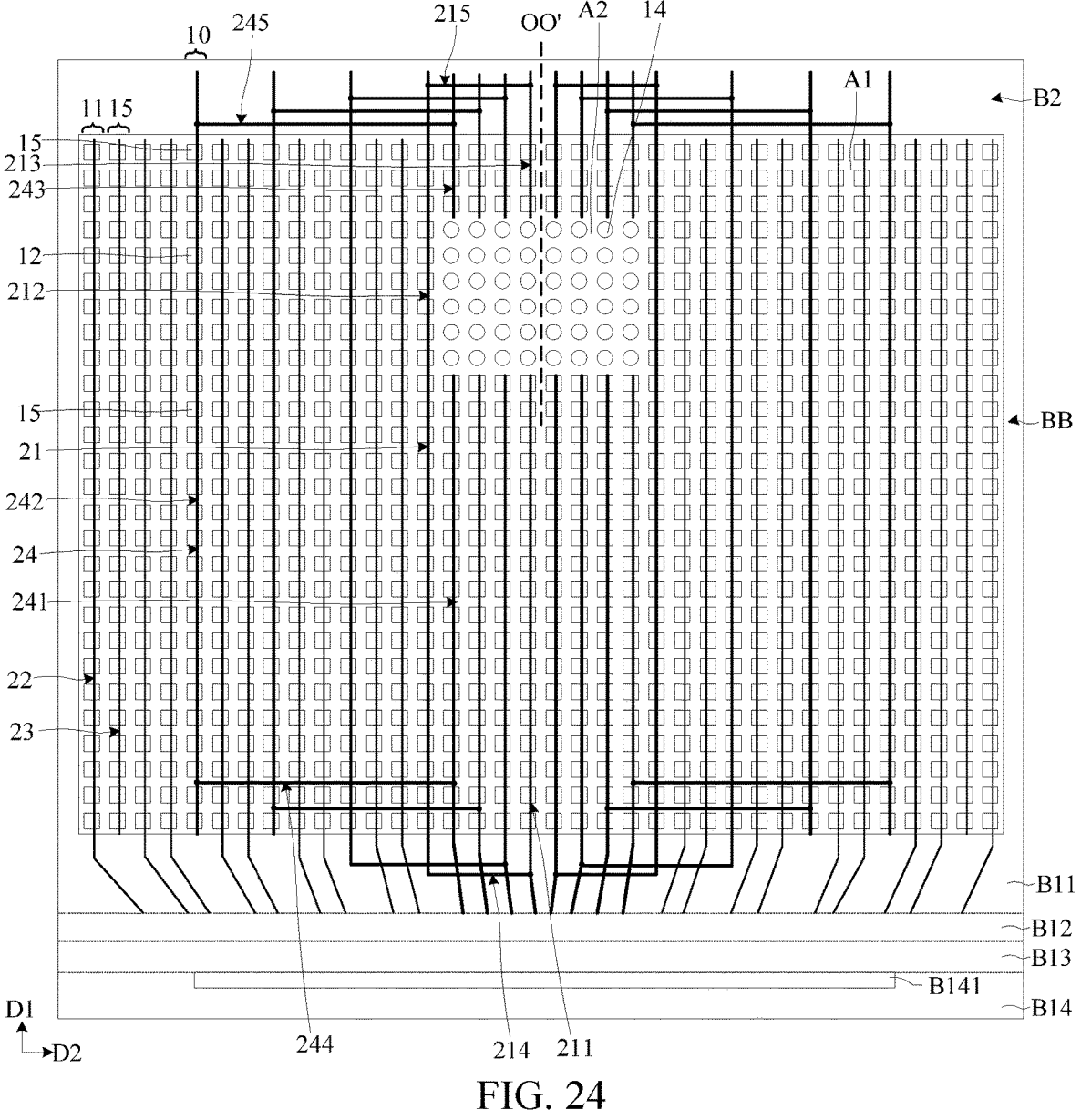
FIG. 24 is another partial trace schematic diagram of a display substrate according to at least one embodiment of the present disclosure.

FIG. 24 is another partial trace schematic diagram of a display substrate according to at least one embodiment of the present disclosure. In some exemplary implementations, as shown in FIG. 24, the first display region A1 surrounds the second display region A2. The display substrate may include a first data line 21, a second data line 22, a third data line 23, and a fourth data line 24. The fourth data line 24 may include a fourth sub-data line 241, a fifth sub-data line 242, and a sixth sub-data line 243. The fourth sub-data line 241 and the fifth sub-data line 242 of the fourth data line 24 may be electrically connected through the third transfer line 244, and the fifth sub-data line 242 and the sixth sub-data line 243 may be electrically connected through the fourth transfer line 245. The third transfer line 244 and the fourth transfer line 245 may be located in the first display region A1. The third transfer line 244 may be located in the first display region A1 and close to the first trace lead-out region B11, and the fourth transfer line 245 may be located in the second bezel region B2. For the rest description for the display substrate according to this embodiment, reference may be made to descriptions of the aforementioned embodiments, and repetition will not be made here.

Figure 25:
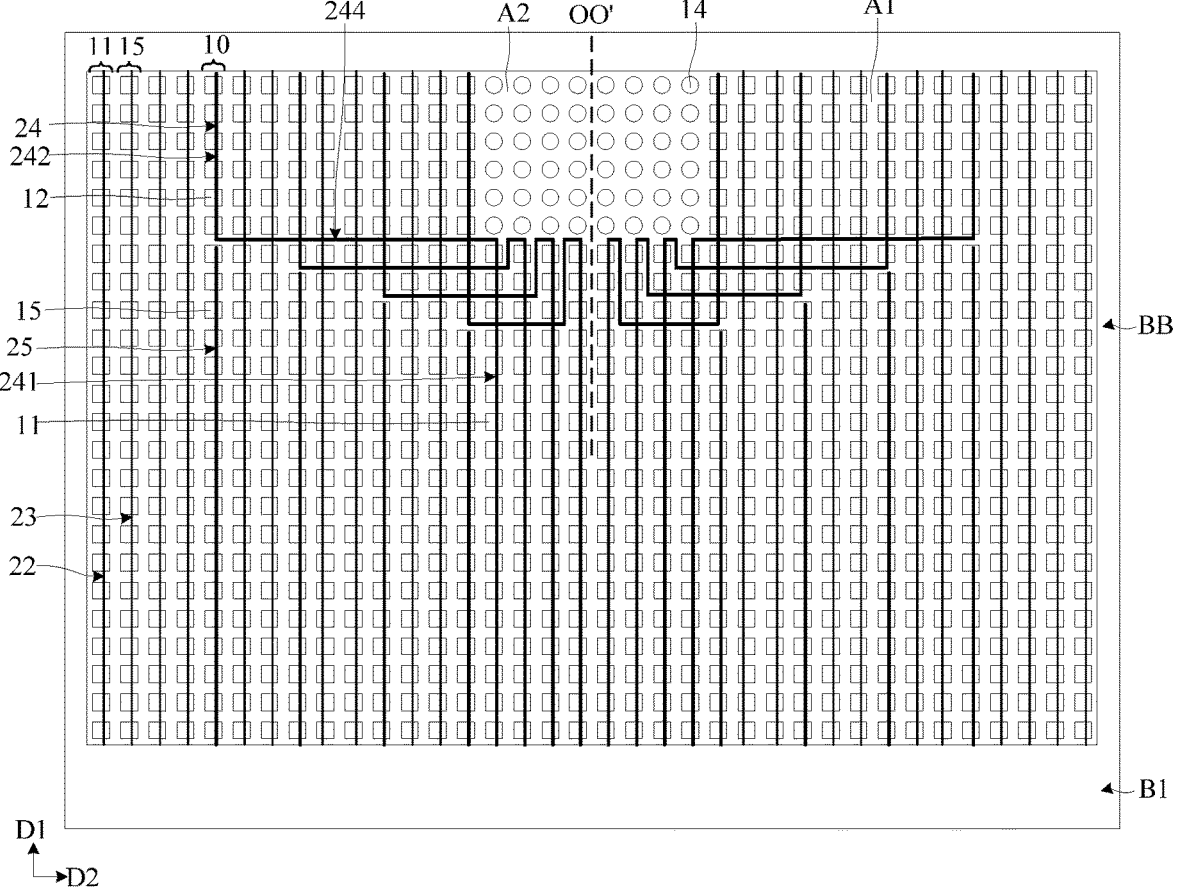
FIG. 25 is another partial trace schematic diagram of a display substrate according to at least one embodiment of the present disclosure.

FIG. 25 is another partial trace schematic diagram of a display substrate according to at least one embodiment of the present disclosure. In some exemplary implementations, as shown in FIG. 25, the display substrate may include a second data line 22, a third data line 23, a fourth data line 24, and a fifth data line 25. The fourth data line 24 may include a fourth sub-data line 241 and a fifth sub-data line 242. The fourth sub-data line 241 and the fifth sub-data line 242 may be electrically connected through the third transfer line 244. The third transfer line 244 is electrically connected with a first pixel circuit 11 closest to the second display region A2 in a column of first pixel circuits 11 with which the fourth sub-data line 241 is connected. The dummy pixel circuit 15 with which the fifth data line 25 is electrically connected and the second active pixel circuit 12 with which the fifth sub-data line 242 of the fourth data line 24 is electrically connected may be located in a same column. Alternatively, the dummy pixel circuit 15 which is not electrically connected with the fifth data line 25 and which is overlapped with the fifth data line 25 may be in a same column as the second active pixel circuit 12 which is electrically connected with the fifth sub-data line 242 of the fourth data line 24. However, this embodiment is not limited thereto. For the rest description for the display substrate according to this embodiment, reference may be made to descriptions of the aforementioned embodiments, and repetition will not be made here.

Figure 26:
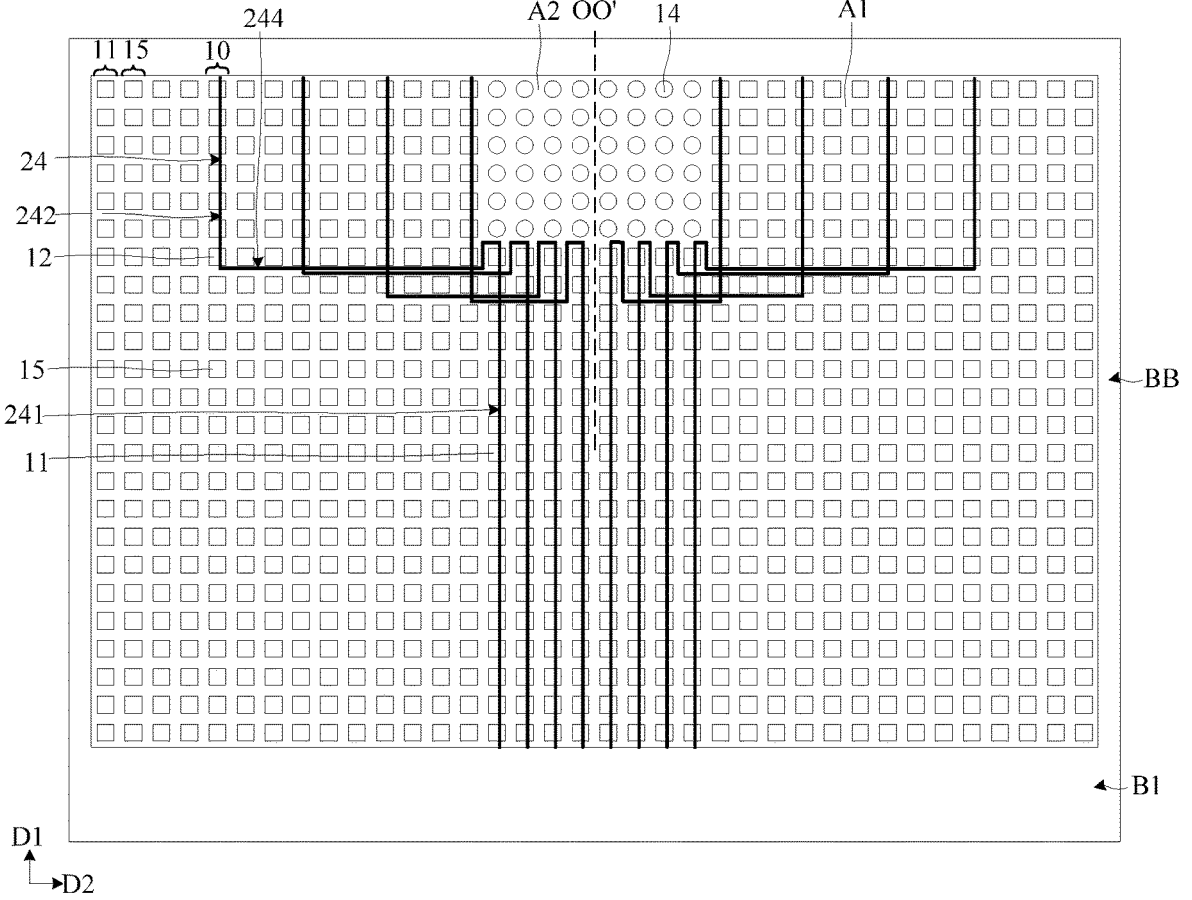
FIG. 26 is another partial trace schematic diagram of a display substrate according to at least one embodiment of the present disclosure.

FIG. 26 is another partial trace schematic diagram of a display substrate according to at least one embodiment of the present disclosure. In some exemplary implementations, as shown in FIG. 26, the fourth data line 24 may include a fourth sub-data line 241 and a fifth sub-data line 242, and the fourth sub-data line 241 and the fifth sub-data line 242 may be electrically connected through a third transfer line 244. The third transfer line 244 may be located in the first display region A1. The third transfer line 244 is electrically connected with a first pixel circuit 11 closest to the second display region A2 in a column of first pixel circuits 11 with which the fourth sub-data line 241 is connected. Multiple third transfer lines 244 may be arranged between two adjacent rows of pixel circuits in the first direction D1 in a region on a side of the first center line of the second display region A2 along the second direction D2. For the rest description for the display substrate according to this embodiment, reference may be made to descriptions of the aforementioned embodiments, and repetition will not be made here.

Figure 27:
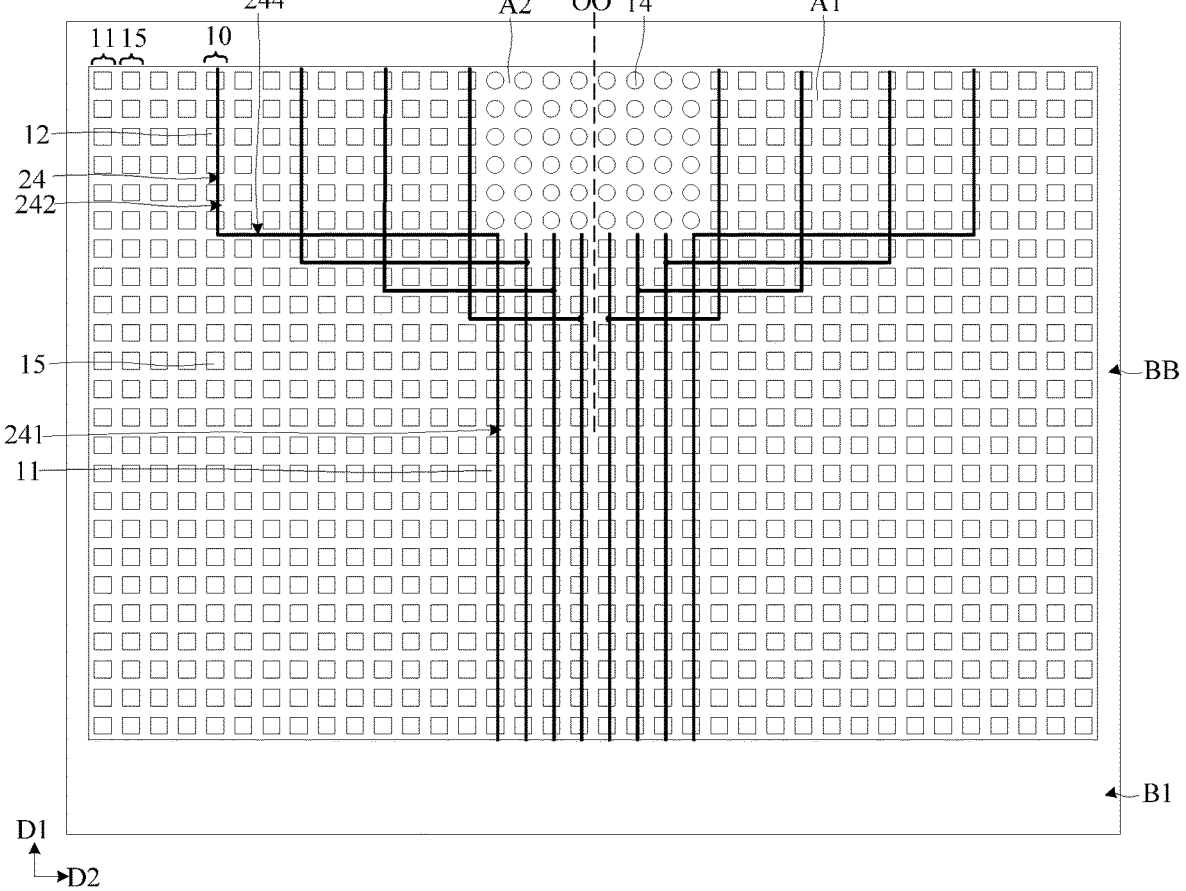
FIG. 27 is another partial trace schematic diagram of a display substrate according to at least one embodiment of the present disclosure.

FIG. 27 is another partial trace schematic diagram of a display substrate according to at least one embodiment of the present disclosure. In some exemplary implementations, as shown in FIG. 27, the fourth data line 24 may include a fourth sub-data line 241 and a fifth sub-data line 242, and the fourth sub-data line 241 and the fifth sub-data line 242 may be electrically connected through a third transfer line 244. The third transfer line 244 may extend along the second direction D2. In a region on a side of the first center line of the second display region A2 along the second direction D2, the third transfer line 244 may be arranged between two adjacent rows of pixel circuits in the first direction D1. The second active pixel circuit 12 away from the second display region A2 may be electrically connected with the second light-emitting element 14 close to an edge of the second display region A2, and the second active pixel circuit 12 close to the second display region A2 may be electrically connected with the second light-emitting element 14 close to the center of the second display region A2. The third transfer line 244 electrically connected with the fifth sub-data line 242 close to the second display region A2 is located on a side of the third transfer line 244, which is electrically connected with the fifth sub-data line 242 away from the second display region A2, away from the second display region A2. For the rest description for the display substrate according to this embodiment, reference may be made to descriptions of the aforementioned embodiments, and repetition will not be made here.

Figure 28:
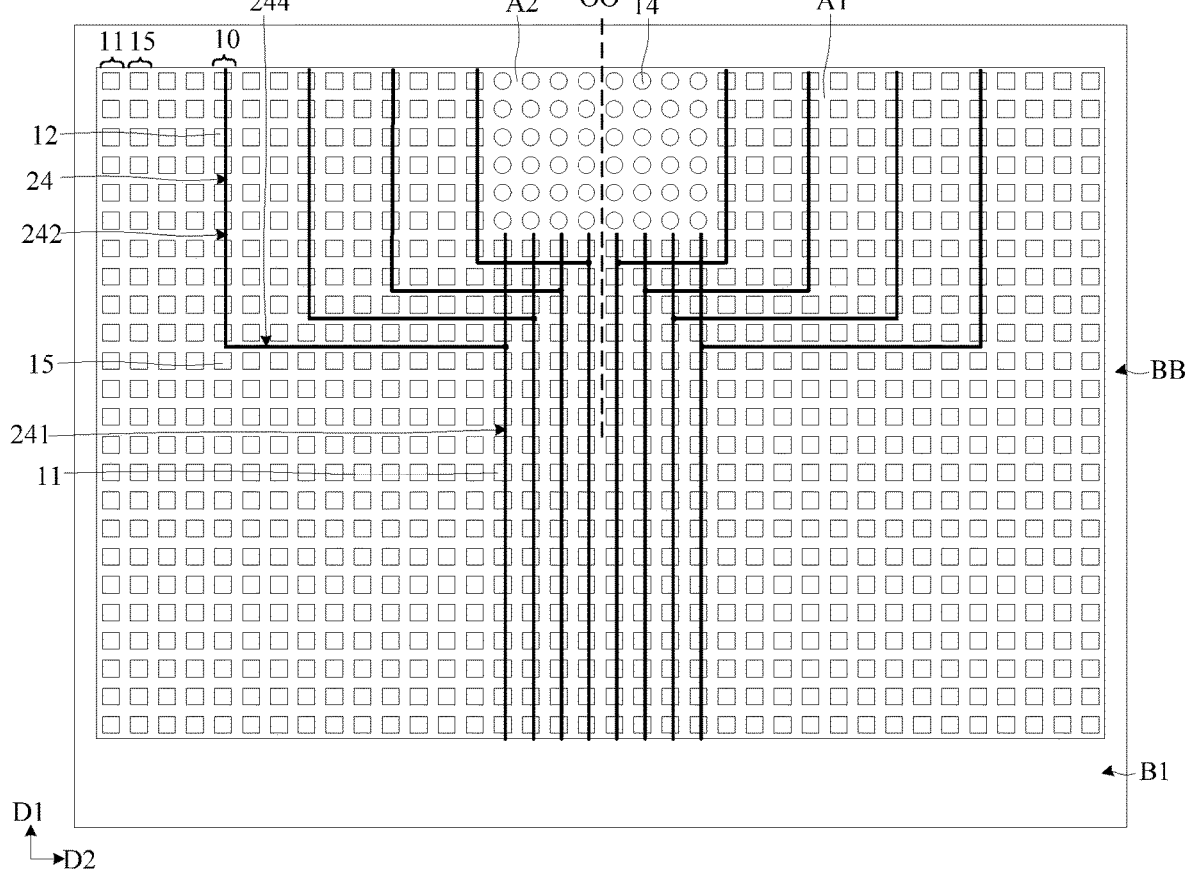
FIG. 28 is another partial trace schematic diagram of a display substrate according to at least one embodiment of the present disclosure.

FIG. 28 is another partial trace schematic diagram of a display substrate according to at least one embodiment of the present disclosure. In some exemplary implementations, as shown in FIG. 28, the fourth data line 24 may include a fourth sub-data line 241 and a fifth sub-data line 242, and the fourth sub-data line 241 and the fifth sub-data line 242 may be electrically connected through a third transfer line 244. The third transfer line 244 may extend along the second direction D2. A third transfer line 244 may be arranged between two adjacent rows of pixel circuits in the first direction D1. The third transfer line 244 electrically connected with the fifth sub-data line 242 close to the second display region A2 is located on a side of the third transfer line, which is electrically connected with the fifth sub-data line 242 away from the second display region A2, close to the second display region A2. For the rest description for the display substrate according to this embodiment, reference may be made to descriptions of the aforementioned embodiments, and repetition will not be made here.

Figure 29:
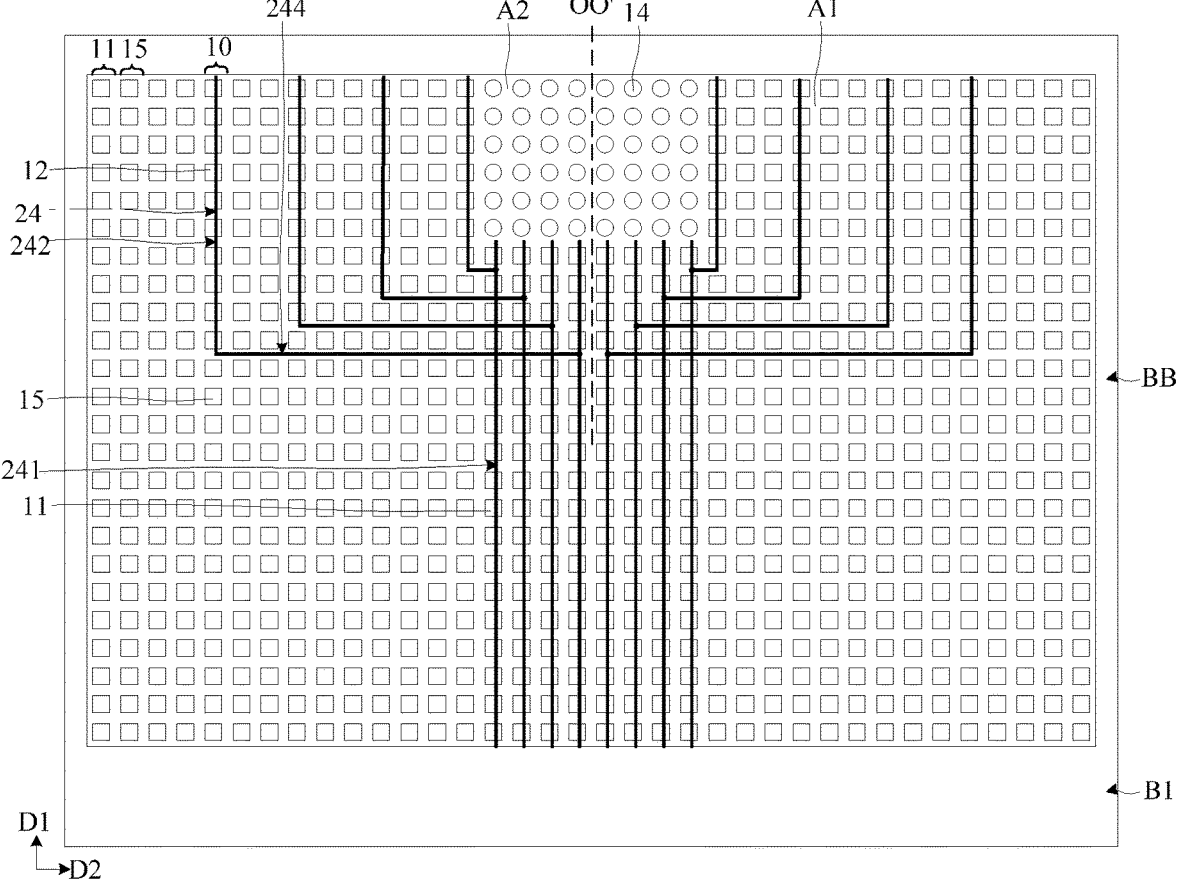
FIG. 29 is another partial trace schematic diagram of a display substrate according to at least one embodiment of the present disclosure.

FIG. 29 is another partial trace schematic diagram of a display substrate according to at least one embodiment of the present disclosure. In some exemplary implementations, as shown in FIG. 29, the fourth data line 24 may include a fourth sub-data line 241 and a fifth sub-data line 242, and the fourth sub-data line 241 and the fifth sub-data line 242 may be electrically connected through a third transfer line 244. The third transfer line 244 may extend along the second direction D2. A third transfer line 244 may be arranged between two adjacent rows of pixel circuits in the first direction D1. A second active pixel circuit 12 close to the second display region A2 may be electrically connected with a second light-emitting element 14 close to an edge of the second display region A2, and a second active pixel circuit 12 away from the second display region A2 may be electrically connected with a second light-emitting element 14 close to the center of the second display region A2. The third transfer line 244 electrically connected with the fifth sub-data line 242 close to the second display region A2 is located on a side of the third transfer line, which is electrically connected with the fifth sub-data line 242 away from the second display region A2, close to the second display region A2. For the rest description for the display substrate according to this embodiment, reference may be made to descriptions of the aforementioned embodiments, and repetition will not be made here.

Figure 30:
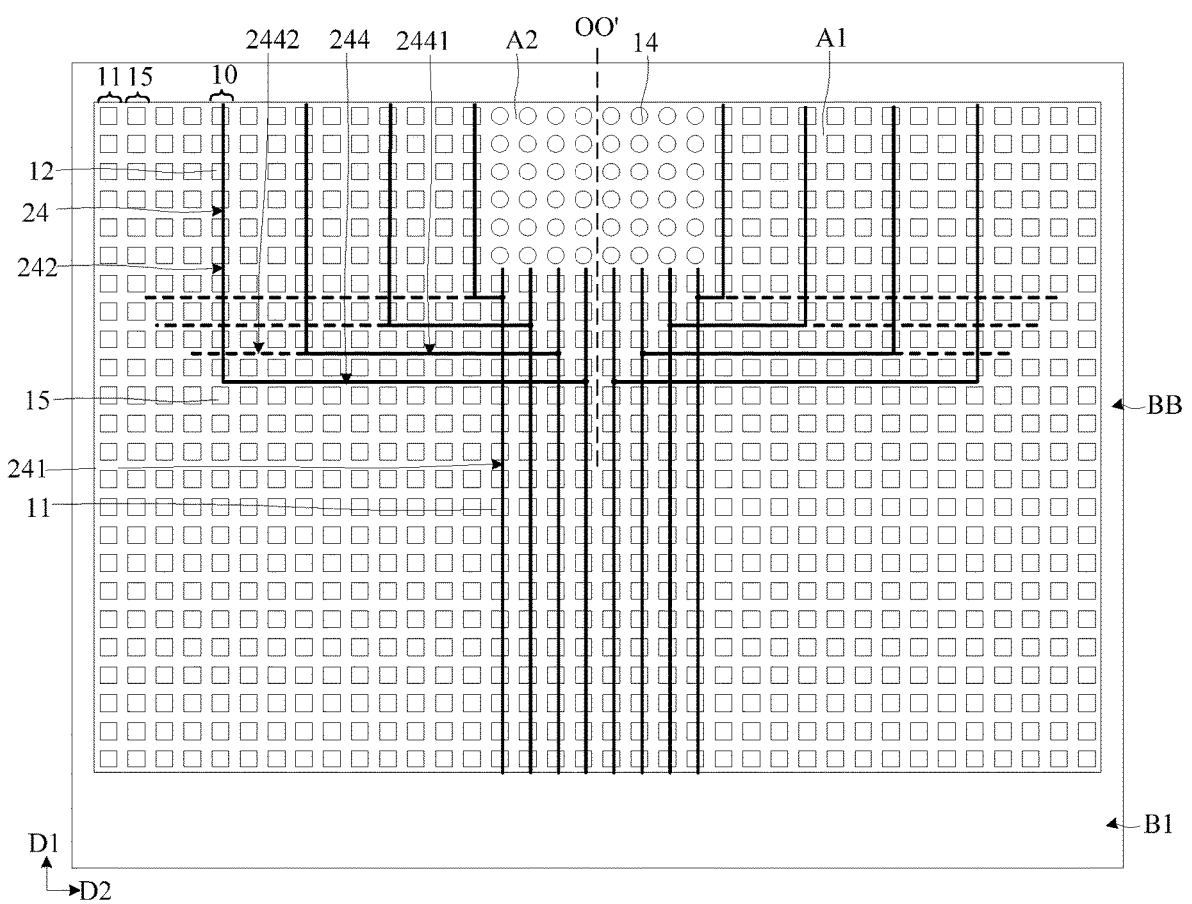
FIG. 30 is another partial trace schematic diagram of a display substrate according to at least one embodiment of the present disclosure.

FIG. 30 is another partial trace schematic diagram of a display substrate according to at least one embodiment of the present disclosure. In some exemplary implementations, as shown in FIG. 30, the fourth data line 24 may include a fourth sub-data line 241 and a fifth sub-data line 242, and the fourth sub-data line 241 and the fifth sub-data line 242 may be electrically connected through a third transfer line 244. The third transfer line 244 may extend along the second direction D2. A third transfer line 244 may be arranged between two adjacent rows of pixel circuits in the first direction D1. At least one third transfer wire 244 may include a first connection part 2441 and an extension part 2442. The first end of the first connection part 2441 may be electrically connected with the fourth sub-data line 241, the second end of the first connection part 2441 may be electrically connected with the fifth sub-data line 242, and the extension part 2442 may be electrically connected with the second end of the first connection part 2441. In this example, by providing the extension part, the lengths of the multiple third transfer lines 244 along the second direction D2 can be substantially the same, so that the loads of the multiple fourth data lines tend to be consistent, and the consistency of the transmitted data signals can be ensured. For the rest description for the display substrate according to this embodiment, reference may be made to descriptions of the aforementioned embodiments, and repetition will not be made here.

In FIG. 26 to FIG. 30, only the fourth data line 24 is illustrated, and the second data line 22, the third data line 23, and the fifth data line 25 are omitted. In some examples, when the display substrate includes the first data line 21 and the fourth data line 24, the fourth data line 24 may be disposed in a manner as that adopted in the embodiments shown in FIG. 26 to FIG. 30. The trace arrangements of the aforementioned embodiments may be combined with each other, which is not limited in this embodiment.

A pixel circuit and a film layer structure of the display region will be illustrated as follows.

Figure 31:
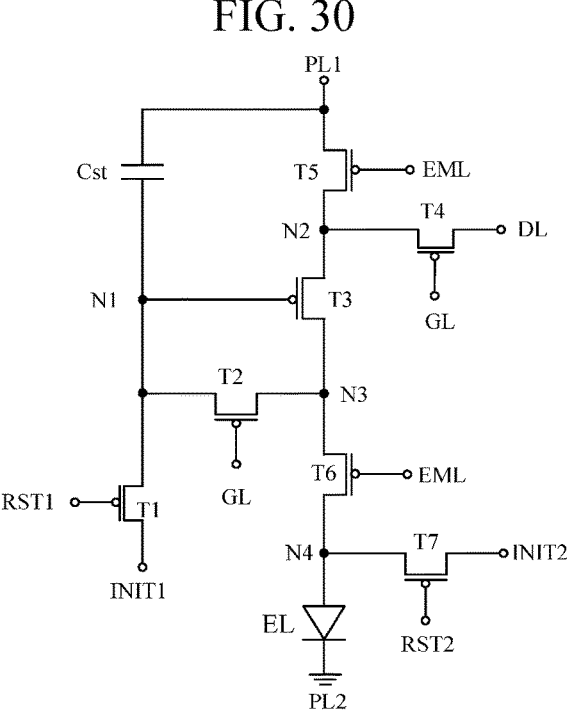
FIG. 31 is an equivalent circuit diagram of a pixel circuit according to at least one embodiment of the present disclosure.
Figure 32:
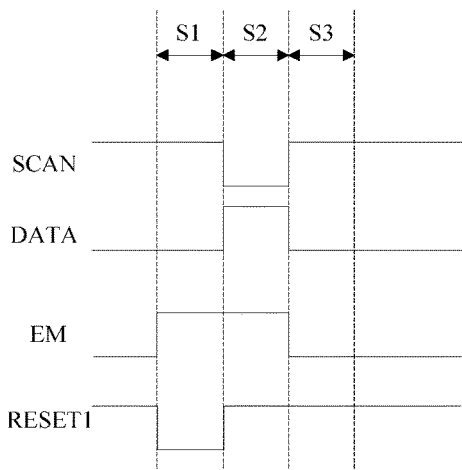
FIG. 32 is a working timing diagram of the pixel circuit provided in FIG. 31.

FIG. 31 is an equivalent circuit diagram of a pixel circuit according to at least one embodiment of the present disclosure. FIG. 32 is a working timing diagram of the pixel circuit provided in FIG. 31. The pixel circuit of this exemplary embodiment is described by taking the 7T1C structure as an example. However, this embodiment is not limited thereto.

In some exemplary implementations, as shown in FIG. 31, the pixel circuit of this example may include six switching transistors (T1, T2, and T4 to T7), a drive transistor T3, and a storage capacitor Cst. The six switching transistors are respectively a data writing transistor T4, a threshold compensation transistor T2, a first light-emitting control transistor T5, a second light-emitting control transistor T6, a first reset transistor T1, and a second reset transistor T7. The light emitting-element EL may include an anode, a cathode and an organic light-emitting layer disposed between the anode and the cathode.

In some exemplary implementations, the drive transistor and the six switching transistors may be P-type transistors or may be N-type transistors. Employing a same type of transistors in a pixel circuit may simplify a process flow, reduce a process difficulty of a display substrate, and improve a yield of products. In some exemplary implementations, the drive transistor and the six switching transistors may include the P-type transistor and the N-type transistor.

In some exemplary implementations, Low Temperature Poly-Crystalline-Silicon thin film transistors, or oxide thin film transistors, or a Low Temperature Poly-Crystalline-Silicon thin film transistor and an oxide thin film transistor may be employed for the drive transistor and the six switching transistors. An active layer of a Low Temperature Poly-Silicon thin film transistor is made of Low Temperature Poly-Silicon (LTPS), and an active layer of an oxide thin film transistor is made of an oxide semiconductor (Oxide). The Low-temperature Poly-Silicon thin film transistor has advantages such as a high mobility and fast charging, etc., while the oxide thin film transistor has advantages such as a low leakage current, etc. The Low Temperature Poly-Silicon thin film transistor and the oxide thin film transistor are integrated on one display substrate to form a Low Temperature Polycrystalline Oxide (LTPO) display substrate, and advantages of both the Low Temperature Poly-Silicon thin film transistor and the oxide thin film transistor can be utilized, which can achieve low frequency drive, reduce power consumption, and improve display quality.

In some exemplary implementations, as shown in FIG. 31, a display substrate may include a scan line GL, a data line DL (i.e., the aforementioned first data line, second data line, or fourth data line), a first power supply line PL1, a second power supply line PL2, a light-emitting control line EML, a first initial signal line INIT1, a second initial signal line INIT2, a first reset control line RST1, and a second reset control line RST2. In some examples, the first power supply line PL1 may be configured to provide a constant first voltage signal VDD to the pixel circuit, the second power supply line PL2 may be configured to provide a constant second voltage signal VSS to the pixel circuit, and the first voltage signal VDD is greater than the second voltage signal VSS. The scan line GL may be configured to provide a scan signal SCAN to the pixel circuit, the data line DL may be configured to provide a data signal DATA to the pixel circuit, the light-emitting control line EML may be configured to provide a light-emitting control signal EM to the pixel circuit, the first reset control line RST1 may be configured to provide a first reset control signal RESET1 to the pixel circuit, and the second reset control line RST2 may be configured to provide a second reset control signal RESET2 to the pixel circuit. In some examples, in pixel circuits of an n-th row, a first reset control line RST1 may be electrically connected with a scan line GL of the pixel circuits of an (n−1)-th row to be inputted with a scan signal SCAN(n−1), that is, a first reset control signal RESET1(n) is the same as the scan signal SCAN(n−1). A second reset control line RST2 may be electrically connected with a scan line GL of pixel circuits of an n-th row to be inputted with a scan signal SCAN(n), that is, a second reset control signal RESET2(n) is the same as the scan signal SCAN(n−1). In some examples, a second reset control line RST2 with which the pixel circuits of the n-th row is electrically connected and a first reset control line RST1 with which the pixel circuits of the (n+1)-th row is electrically connected may have an integrated structure. Herein, n is an integer greater than 0. Thus, signal lines of the display substrate can be reduced, and a narrow bezel of the display substrate can be achieved. However, this embodiment is not limited thereto.

In some exemplary implementations, the first initial signal line INIT1 may be configured to provide a first initial signal to the pixel circuit, and the second initial signal line INIT2 may be configured to provide a second initial signal to the pixel circuit. For example, the first initial signal may be different from the second initial signal. The first initial signal and the second initial signal may be constant voltage signals, and their magnitudes may be between a first voltage signal VDD and a second voltage signal VSS, but not limited to this. In some other examples, the first initial signal and the second initial signal may be the same, and only the first initial signal line may be disposed to provide the first initial signal.

In some exemplary implementations, as shown in FIG. 31, a drive transistor T3 is electrically connected with a light-emitting element EL, and outputs a drive current to drive the light-emitting element EL to emit light under control of a scan signal SCAN, a data signal DATA, a first voltage signal VDD, a second voltage signal VSS and etc. A gate of a data writing transistor T4 is electrically connected with a scan line GL, a first electrode of the data writing transistor T4 is electrically connected with a data line DL, and a second electrode of the data writing transistor T4 is electrically connected with a first electrode of the drive transistor T3. A gate of a threshold compensation transistor T2 is electrically connected with a scan line GL, a first electrode of the threshold compensation transistor T2 is electrically connected with a gate of the drive transistor T3, and a second electrode of the threshold compensation transistor T2 is electrically connected with a second electrode of the drive transistor T3. A gate of a first light emitting control transistor T5 is electrically connected with a light-emitting control line EML, a first electrode of the first light-emitting control transistor T5 is electrically connected with a first power supply line PL1, and a second electrode of the first light-emitting control transistor T5 is electrically connected with the first electrode of the drive transistor T3. A gate of a second light-emitting control transistor T6 is electrically connected with the light-emitting control line EML, a first electrode of the second light-emitting control transistor T6 is electrically connected with the second electrode of the drive transistor T3, and a second electrode of the second light-emitting control transistor T6 is electrically connected with an anode of the light-emitting element EL. A first reset transistor T1 is electrically connected with the gate of the drive transistor T3, and configured to reset the gate of the drive transistor T3, and a second reset transistor T7 is electrically connected with the anode of the light-emitting element EL and configured to reset the anode of the light-emitting element EL. A gate of the first reset transistor T1 is electrically connected with a first reset control line RST1, a first electrode of the first reset transistor T1 is electrically connected with a first initial signal line INIT1, and a second electrode of the first reset transistor T1 is electrically connected with the gate of the drive transistor T3. A gate of the second reset transistor T7 is electrically connected with a second reset control line RST2, a first electrode of the second reset transistor T7 is electrically connected with a second initial signal line INIT2, and a second electrode of the second reset transistor T7 is electrically connected with the anode of the light-emitting element EL. A first capacitance electrode plate of a storage capacitor Cst is electrically connected with the gate of the drive transistor T3, and a second capacitance electrode plate of the storage capacitor Cst is electrically connected with the first power supply line PL1.

In this example, a first node N1 is a connection point of the storage capacitor Cst, the first reset transistor T1, the drive transistor T3, and the threshold compensation transistor T2, a second node N2 is a connection point of the first light emitting control transistor T5, the data writing transistor T4, and the drive transistor T3, a third node N3 is a connection point of the drive transistor T3, the threshold compensation transistor T2, and the second light emitting control transistor T6, and a fourth node N4 is a connection point of the second light emitting control transistor T6, the second reset transistor T7, and the light emitting element EL.

A working process of the pixel circuit illustrated in FIG. 31 will be described below with reference to FIG. 32. The description is made by taking a case in which multiple transistors included in the pixel circuit shown in FIG. 31 are all P-type transistors as an example.

In some exemplary implementations, as shown in FIG. 32, during one frame display period, the working process of the pixel circuit may include a first stage S1, a second stage S2, and a third stage S3.

The first stage S1: which is referred to as a reset stage. A first reset control signal RESET1 provided by the first reset control line RST1 is a low-level signal, so that the first reset transistor T1 is turned on, and a first initial signal provided by the first initial signal line INIT1 is provided to the first node N1 to initialize the first node N1 and clear an original data voltage in the storage capacitor Cst. A scan signal SCAN provided by the scan line GL is a high-level signal, and a light emitting control signal EM provided by the light emitting control line EML is a high-level signal, so that the data writing transistor T4, the threshold compensation transistor T2, the first light-emitting control transistor T5, the second light-emitting control transistor T6, and the second reset transistor T7 are turned off. In this stage, the light-emitting element EL does not emit light.

The second stage S2: which is referred to as a data writing stage or a threshold compensation stage. A scan signal SCAN provided by the scan line GL is a low-level signal, a first reset control signal RESET1 provided by the first reset control line RST1 and a light-emitting control signal EM provided by the light-emitting control line EML are both high-level signals, and the data line DL outputs a data signal DATA. In this stage, the first capacitance electrode plate of the storage capacitor Cst is at a low level, such that the drive transistor T3 is turned on. The scan signal SCAN is a low-level signal, so that the threshold compensation transistor T2, the data writing transistor T4, and the second reset transistor T7 are turned on. The threshold compensation transistor T2 and the data writing transistor T4 are turned on, so that a data voltage Vdata output by the data line DL is provided to the first node N1 through the second node N2, the turned-on drive transistor T3, the third node N3, and the turned-on threshold compensation transistor T2, and the storage capacitor Cst is charged with a difference between the data voltage Vdata output by the data line DL and a threshold voltage of the drive transistor T3. A voltage of a first capacitance electrode plate (i.e., the first node N1) of the storage capacitor Cst is Vdata−|Vth|, wherein Vdata is the data voltage output by the data line DL, and Vth is the threshold voltage of the drive transistor T3. The second reset transistor T7 is turned on, so that a second initial signal provided by the second initial signal line INIT2 is provided to the anode of the light-emitting element EL to initialize (reset) the anode of the light-emitting element EL and clear a pre-stored voltage therein, so as to complete initialization, thereby ensuring that the light-emitting element EL does not emit light. The first reset control signal RESET1 provided by the first reset control line RST1 is a high-level signal, so that the first reset transistor T1 is turned off. The light-emitting control signal EM provided by the light-emitting control signal line EML is a high-level signal, so that the first light-emitting control transistor T5 and the second light-emitting control transistor T6 are turned off.

The third stage S3: which is referred to as a light-emitting stage. A light-emitting control signal EM provided by the light-emitting control signal line EML is a low-level signal, and a scan signal SCAN provided by the scan line GL and a first reset control signal RESET1 provided by the first reset control line RST1 are high-level signals. The light-emitting control signal EM provided by the light-emitting control signal line EML is a low-level signal, so that the first light-emitting control transistor T5 and the second light-emitting control transistor T6 are turned on, and a first voltage signal VDD output by the first power supply line PL1 provides a drive voltage to an anode of the light-emitting element EL through the turned-on first light-emitting control transistor T5, the drive transistor T3, and the second light-emitting control transistor T6, to drive the light-emitting element EL to emit light.

In a drive process of the pixel circuit, a drive current flowing through the drive transistor T3 is determined by a voltage difference between the gate and the first electrode of the drive transistor T3. Because the voltage of the first node N1 is Vdata−|Vth|, the drive current of the drive transistor T3 is as follows.

$$I = K \times (Vgs - Vth)^2 =$$
$$K \times [(VDD - Vdata + |Vth|) - Vth]^2 = K \times [VDD - Vdata]^2$$

Herein, I is the drive current flowing through the drive transistor T3, that is, the drive current for driving the light-emitting element EL; K is a constant; Vgs is the voltage difference between the gate and the first electrode of the drive transistor T3; Vth is the threshold voltage of the drive transistor T3; Vdata is the data voltage output by the data line DL; and VDD is the first voltage signal output by the first power supply line PL1.

It may be seen from the above formula that a current flowing through the light-emitting element EL is irrelevant with the threshold voltage of the drive transistor T3. Therefore, the pixel circuit of this embodiment may better compensate the threshold voltage of the drive transistor T3.

Figure 33:
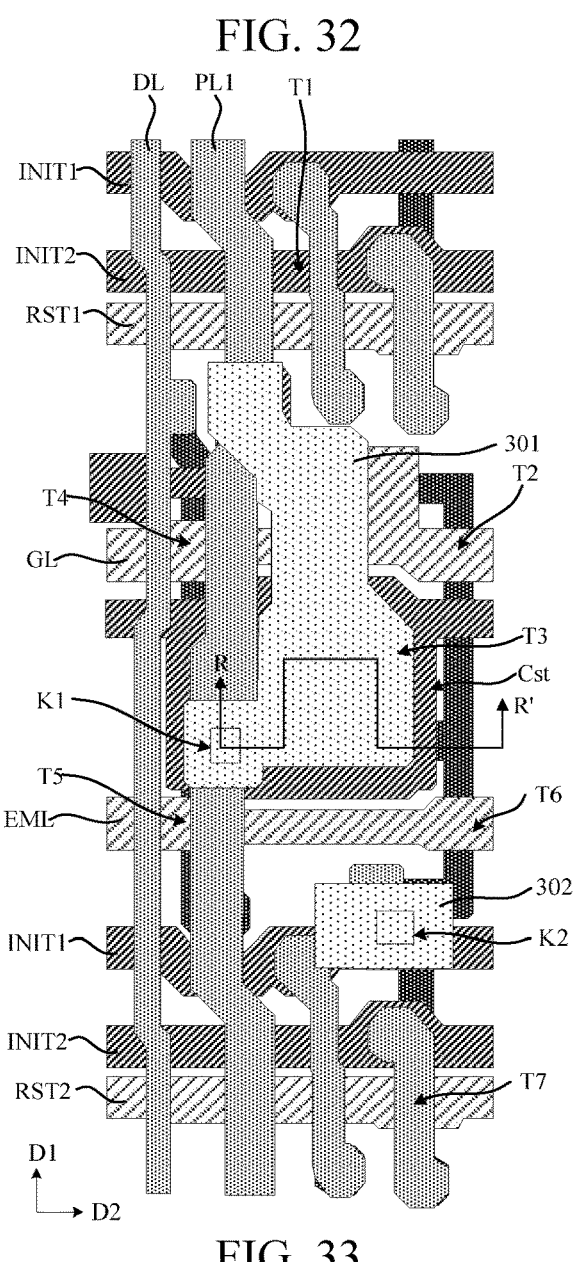
FIG. 33 is a schematic top view of a circuit structure layer of a first display region according to at least one embodiment of the present disclosure.
Figure 34:
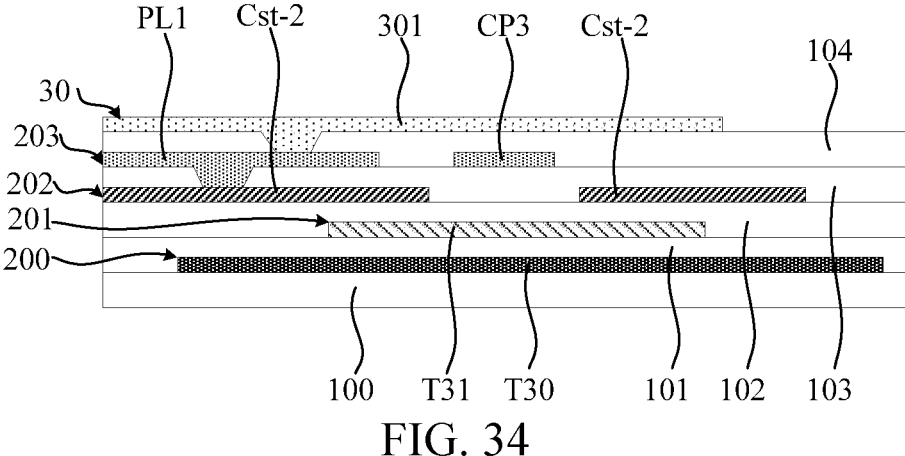
FIG. 34 is a partial sectional schematic view along an R-R' direction in FIG. 33.
Figure 35A:
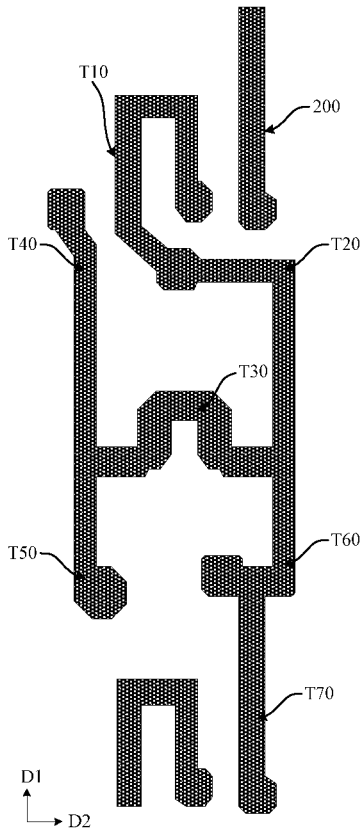
FIG. 35A is a schematic top view of a display substrate after a semiconductor layer is formed in FIG. 33.
Figure 35B:
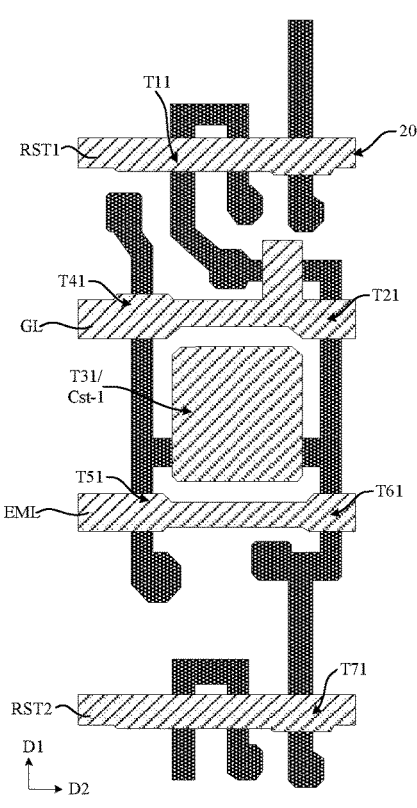
FIG. 35B is a schematic top view of a display substrate after a first gate metal layer is formed in FIG. 33.
Figure 35C:
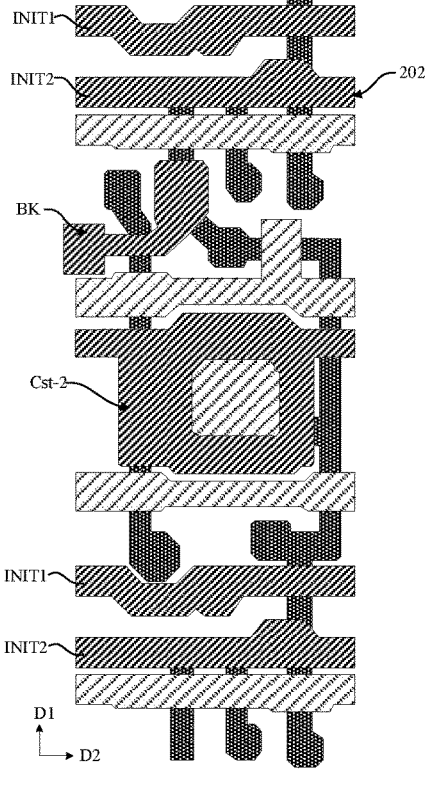
FIG. 35C is a schematic top view of a display substrate after a second gate metal layer is formed in FIG. 33.
Figure 35D:
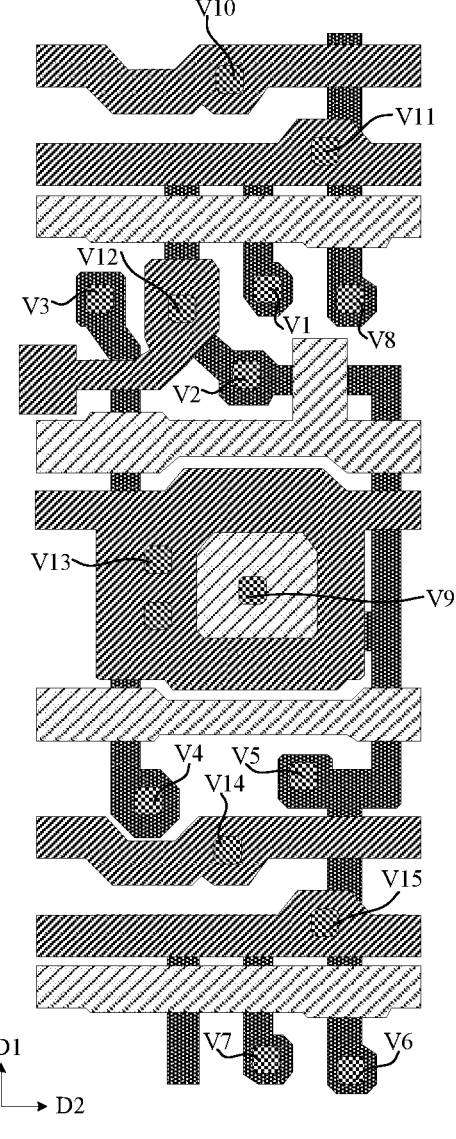
FIG. 35D is a schematic top view of a display substrate after a third insulation layer is formed in FIG. 33.
Figure 35E:
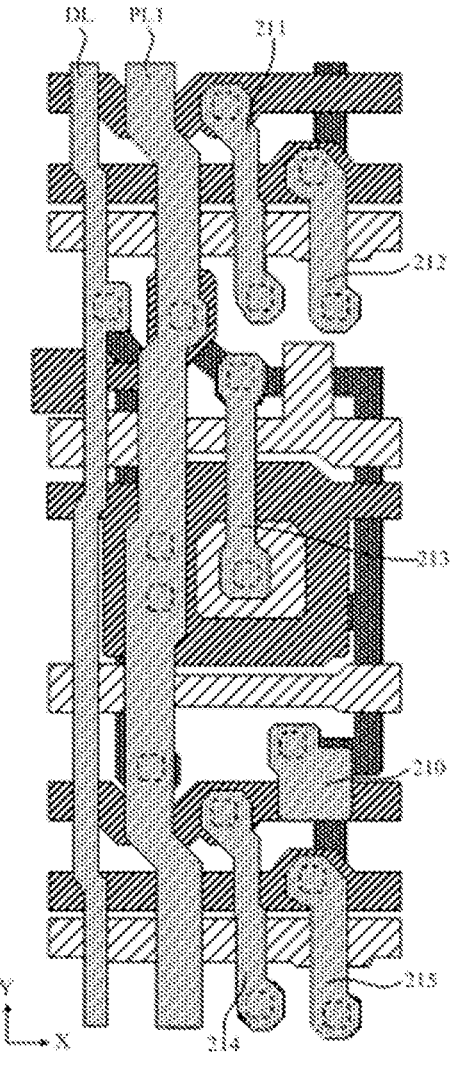
FIG. 35E is a schematic top view of a display substrate after a first source-drain metal layer is formed according to at least one embodiment of the present disclosure.

FIG. 33 is a schematic top view of a circuit structure layer of a first display region according to at least one embodiment of the present disclosure. FIG. 34 is a partial sectional schematic view along an R-R' direction in FIG. 33. FIG. 35A is a schematic top view of a display substrate after a semiconductor layer is formed in FIG. 33. FIG. 35B is a schematic top view of a display substrate on which a first gate metal layer is formed in FIG. 33. FIG. 35C is a schematic top view of a display substrate on which a second gate metal layer is formed in FIG. 33. FIG. 35D is a schematic top view of a display substrate on which a third insulation layer is formed in FIG. 33. FIG. 35E is a schematic top view of a display substrate on which a first source-drain metal layer is formed according to at least one embodiment of the present disclosure.

In some exemplary implementations, as shown in FIG. 33 and FIG. 34, a circuit structure layer of the first display region A1 may include: a semiconductor layer 200, a first insulation layer 101, a first gate metal layer 201, a second insulation layer 102, a second gate metal layer 202, a third insulation layer 103, and a first source-drain metal layer 203, and a fourth insulation layer 104 that are disposed sequentially on the base substrate 100. The circuit structure layer 20 of the first display region A1 may include: the first insulation layer 101, the second insulation layer 102, the third insulation layer 103, and the fourth insulation layer 104 stacked sequentially on the base substrate 100. In some examples, the first insulation layer 101 to the fourth insulation layer 104 may be inorganic material layers; alternatively, the first insulation layer 101 to the third insulation layer 103 may be inorganic material layers and the fourth insulation layer 104 may be an organic material layer. However, this embodiment is not limited thereto.

The structure of the display substrate will be described below through an example of a preparation process of the display substrate. The "patterning process" mentioned in the embodiments of the present disclosure includes processings, such as photoresist coating, mask exposure, development, etching and photoresist stripping for metal materials, inorganic materials or transparent conductive materials, and includes organic material coating, mask exposure and development for organic materials. Deposition may be any one or more of sputtering, evaporation, and chemical vapor deposition. Coating may be any one or more of spray coating, spin coating, and ink-jet printing. Etching may be any one or more of dry etching and wet etching, which is not limited in present disclosure. A "thin film" refers to a layer of thin film formed by a material on a base substrate through deposition, coating, or other processes. If the "thin film" does not need a patterning process in an entire preparation process, the "thin film" may also be called a "layer". If the "thin film" needs a patterning process in an entire preparation process, it is called a "thin film" before the patterning process, and called a "layer" after the patterning process. The "layer" after the patterning process includes at least one "pattern".

In some exemplary implementations, a preparation process of a display substrate may include following acts. Herein, illustration is made by taking one pixel circuit of the first display region A1 as an example. The circuit structure of this pixel circuit may be shown in FIG. 31.

(1) A base substrate is provided.

In some exemplary implementations, the base substrate 100 may be a rigid substrate, e.g., a glass substrate. However, this embodiment is not limited thereto. For example, the base substrate 100 may be a flexible substrate.

(2) A semiconductor layer 200 is formed.

In some exemplary implementations, a semiconductor thin film is deposited on a base substrate 100 of the first display region A1, and is patterned through a patterning process to form a semiconductor layer 200 in the first display region A1. As shown in FIG. 33 and FIG. 35A, the semiconductor layer 200 may include: active layers of multiple transistors of a pixel circuit (including, for example, an active layer T10 of a first reset transistor T1, an active layer T20 of a threshold compensation transistor T2, an active layer T30 of a drive transistor T3, an active layer T40 of a data writing transistor T4, an active layer T50 of a first light-emitting control transistor T5, an active layer T60 of a second light-emitting control transistor T6, and an active layer T70 of a second reset transistor T7). The active layers of the seven transistors of a pixel circuit may be of an integrated structure in which the active layers are connected with each other.

In some exemplary implementations, a material of the semiconductor layer 200 may include, for example, poly-crystalline-silicon. An active layer may include at least one channel region and multiple doped regions. The channel region may not be doped with an impurity, and has characteristics of a semiconductor. The multiple doped regions may be on two sides of the channel region and doped with impurities, and thus have conductivity. The impurities may be changed according to a type of a transistor. In some examples, a doped region of the active layer may be interpreted as a source or a drain of a transistor. A part of the active layer between the transistors may be interpreted as a wiring doped with an impurity, and may be used for electrically connecting the transistors.

(3) A first gate metal layer is formed.

In some exemplary implementations, a first insulation thin film and a first metal thin film are sequentially deposited on the base substrate 100, on which the aforementioned structure is formed, and the first metal thin film is patterned through a patterning process to form a first insulation layer 101 covering the semiconductor layer 200, and the first gate metal layer 201 disposed on the first insulation layer 101 of the first display region A1. As shown in FIG. 33 and FIG. 35B, the first gate metal layer 201 may include: gate electrodes of multiple transistors of the pixel circuit, and a first capacitance electrode plate Cst-1 of the storage capacitor Cst, a first reset control line RST1, a second reset control line RST2, a scan line GL and a light-emitting control line EML. The first reset control line RST1 and a gate electrode T11 of a first reset transistor T1 may be of an integrated structure. The scan line GL, a gate electrode T41 of a data writing transistor T4, and a gate electrode T21 of a threshold compensation transistor T2 may be of an integrated structure. A gate electrode T31 of the drive transistor T3 and the first capacitance electrode plate Cst-1 of the storage capacitor Cst may be of an integrated structure. The light-emitting control line EML, a gate electrode T51 of a first light-emitting control transistor T5, and a gate electrode T61 of a second light-emitting control transistor T61 may be of an integrated structure. The second reset control line RST2 and a gate electrode T71 of a second reset transistor T7 may be of an integrated structure.

(4) A second gate metal layer is formed.

In some exemplary implementations, a second insulation thin film and a second metal thin film are sequentially deposited on the base substrate 100, on which the aforementioned structure is formed, and the second metal thin film is patterned through a patterning process to form a second insulation layer 102 covering the first gate metal layer 201, and a second gate metal layer 202 disposed on the second insulation layer 102 of the first display region A1. As shown in FIG. 33 and FIG. 35C, the second gate metal layer 202 may include: a second capacitance electrode plate Cst-2 of a storage capacitor Cst of a pixel circuit, a shield electrode BK, the first initial signal line INIT1, and the second initial signal line INIT2. The shield electrode BK may be configured to shield an influence of a data voltage jump on a key node, avoid an influence of the data voltage jump on a potential of the key node of a pixel circuit, and improve a display effect.

(5) A third insulation layer and a first source-drain metal layer are formed.

In some exemplary implementations, a third insulation thin film is deposited on the base substrate 100, on which the aforementioned structure is formed, and a third insulation layer 103 is formed through a patterning process. The third insulation layer 103 is provided with multiple pixel vias. Subsequently, a third metal thin film is deposited, and the third metal thin film is patterned by a patterning process to form a first source-drain metal layer 203 disposed on the third insulation layer 103 of the first display region A1.

In some examples, as shown in FIG. 33 and FIG. 35D, the third insulation layer 103 of the first display region A1 is provided with multiple pixel vias, for example, may include the first pixel via V1 to the fifteen pixel via V15. The third insulation layers 103, the second insulation layers 102, and the first insulation layers 101 in the first via V1 to the eighth via V8 are removed to expose a surface of the semiconductor layer 200. The third insulation layer 103 and the second insulation layer 102 in the ninth via V9 are removed to expose a surface of the first gate metal layer 201. The third insulation layers 103 in the tenth via V10 to the fifteenth via V15 are removed to expose a surface of the second gate metal layer 202.

In some examples, as shown in FIG. 33 and FIG. 35E, the first source-drain metal layer 203 may include data lines DL (including, for example, a first data line 21, a second data line 22, a third data line 23, a fourth data line 24, and a fifth data line 25), a first power supply line PL1, and multiple connection electrodes (for example, a first connection electrode CP1 to a sixth connection electrode CP6). The first connection electrode CP1 may be electrically connected with a first doped region of an active layer T10 of the first reset transistor T1 through a first pixel via V1, and may also be electrically connected with the first initial signal line INIT1 through a tenth pixel via V10. The second connection electrode CP2 may be electrically connected with a first doped region of an active layer of the second reset transistor of the previous row of pixel circuits through an eighth via V8, and may also be electrically connected with the second initial signal line INIT2 through an eleventh pixel via V11. The third connection electrode CP3 may be electrically connected with a gate electrode T31 of a drive transistor T3 through a ninth pixel via V9, and may also be electrically connected with a first doped region of an active layer T20 of a threshold compensation transistor T2 through a second pixel via V2. The fourth connection electrode CP4 may be electrically connected with a second doped region of an active layer T60 of a second light-emitting control transistor T6 through a fifth pixel via V5. The fifth connection electrode CP5 may be electrically connected with a first doped region of an active layer T70 of the second reset transistor T7 through a sixth pixel via V6, and may also be electrically connected with a second initial signal line INIT2 through a fifteenth pixel via V15. The sixth connection electrode CP6 may be electrically connected with a first doped region of an active layer of the first reset transistor of the next row of pixel circuits through a seventh pixel via V7, and may also be electrically connected with another first initial signal line INIT1 through a fourteenth via V14. The data line DL is connected with a first doped region of an active layer T40 of the data writing transistor T4 through a third pixel via V3. The first power supply line PL1 may be electrically connected with a shield electrode BK through a twelfth pixel via V12, and may also be electrically connected with a first doped region of an active layer T50 of the first light-emitting control transistor T5 through a fourth pixel via V4, and may also be electrically connected with the second capacitance electrode plate Cst-2 of the storage capacitor Cst through two thirteenth pixel vias V13 disposed vertically.

In some exemplary implementations, a fourth insulation thin film is deposited on the base substrate 100, on which the aforementioned structure is formed, and a fourth insulation layer 104 is formed through a patterning process. The fourth insulation layer 104 of the first display region A1 is provided with multiple vias (including, for example, a first via K1 and a second via K2) exposing a surface of the first source-drain metal layer 203.

So far, preparation of the circuit structure layer of the first display region A1 is completed. A second display region A2 may include: the base substrate 100, and the first insulation layer 101, the second insulation layer 102, the third insulation layer 103, and the fourth insulation layer 104 stacked on the base substrate 100.

(6) A second source-drain metal layer is formed.

In some exemplary implementations, a fourth metal thin film is deposited on the base substrate 100, on which the aforementioned pattern is formed, the fourth metal thin film is patterned through a patterning process to form a second source-drain metal layer disposed on the fourth insulation layer 104 of the first display region A1, as shown in FIG. 33. In some examples, the second source-drain metal layer 30 may include a shield electrode 301, a seventh connection electrode 302, and multiple transfer lines (including, for example, a first transfer line, a second transfer line, a third transfer line, and a fourth transfer line). Herein, the first transfer line may be electrically connected with the first sub-data line and the second sub-data line of the first data line of the first source-drain metal layer through the vias provided in the fourth insulation layer 104. The shield electrode 301 may be electrically connected with a first power supply line PL1 through a first via K1. The seventh connection electrode 302 may be electrically connected with the fourth connection electrode CP4 through a second via K2. In this example, the shield electrode 301 may have an irregular shape and may be configured to cover the first node N1 of the pixel circuit to reduce crosstalk of the transparent conductive layer to the first node N1. However, this embodiment is not limited thereto. In some other examples, the shield electrode 301 may be in a regular shape, such as, a circle, or a pentagon, or a hexagon, etc.

(7) Multiple transparent conductive layers are formed.

In some exemplary implementations, a first planarization thin film is coated on the base substrate 100, on which the aforementioned pattern is formed, and the first planarization thin film is formed through a patterning process. Subsequently, a first transparent conductive thin film is deposited, and the first transparent conductive thin film is patterned through a patterning process to form a first transparent conductive layer disposed on the first planarization layer. Subsequently, a second planarization thin film is coated on the base substrate 100, on which the aforementioned pattern is formed, and a second planarization layer is formed by a patterning process. Then, a second transparent conductive thin film is deposited, and the second transparent conductive thin film is patterned through a patterning process to form a second transparent conductive layer disposed on the second planarization layer. After that, a third planarization thin film is coated on the base substrate 100, on which the aforementioned pattern is formed, and a third planarization layer is formed by a patterning process. Subsequently, a third transparent conductive thin film is deposited, and the third transparent conductive thin film is patterned through a patterning process to form a third transparent conductive layer disposed on the third planarization layer. The first transparent conductive layer, the second transparent conductive layer, and the third transparent conductive layer may each include multiple transparent conductive lines. However, the number of transparent conductive layers is not limited in this embodiment.

(8) A light-emitting structure layer is formed.

In some exemplary implementations, a fourth planarization thin film is coated on the base substrate 100, on which the aforementioned pattern is formed, and a fourth planarization layer is formed by a patterning process. Subsequently, an anode conductive thin film is deposited, and the anode conductive thin film is patterned through a patterning process to form an anode layer disposed on the fourth planarization layer. Then, a pixel define thin film is coated on the base substrate 100, on which the aforementioned pattern is formed, and a pixel define layer (PDL for short) is formed by masking, exposure and development processes. Multiple pixel openings exposing the anode layer are formed on the pixel define layer. An organic light-emitting layer is formed in the aforementioned pixel opening, and the organic light-emitting layer is connected with an anode. Then, a cathode thin film is deposited and patterned by a patterning process to form a pattern of a cathode. The cathode is electrically connected with the organic light-emitting layer and the second power supply line respectively. Then, an encapsulation layer is formed on the cathode. The encapsulation layer may include a stacked structure of an inorganic material/an organic material/an inorganic material.

In some exemplary implementations, the first gate metal layer 201, the second gate metal layer 202, the first source-drain metal layer 203, the second source-drain metal layer 30, and a capacitance compensation layer 51 may be made of a metal material, such as any one or more of argentum (Ag), copper (Cu), aluminum (Al), and molybdenum (Mo), or an alloy material of the above metals, such as an Aluminum Neodymium alloy (AlNd) or a Molybdenum Niobium alloy (MoNb), and may be of a single-layer structure or a multi-layer composite structure, such as Mo/Cu/Mo. The first transparent conductive layer to the third transparent conductive layer may be made of a transparent conductive material, such as Indium Tin Oxide (ITO). The first insulation layer 101, the second insulation layer 102, the third insulation layer 103, and the fourth insulation layer 104 may be made of any one or more of Silicon Oxide (SiOx), Silicon Nitride (SiNx), and Silicon Oxynitride (SiON), and may be a single layer, a multi-layer, or a composite layer. The first planarization layer to the fourth planarization layer may be made of an organic material, such as polyimide, acrylic, or polyethylene terephthalate. The pixel define layer may be made of an organic material, such as polyimide, acrylic, or polyethylene terephthalate. The anode layer may be made of a reflective material such as a metal, and the cathode may be made of a transparent conductive material. However, this embodiment is not limited thereto.

A structure and the preparation processing of the display substrate of the embodiment are merely illustrative. In some exemplary implementations, a corresponding structure may be changed according to actual needs and a patterning process may be increased or decreased according to actual needs. The preparation process of the exemplary embodiment may be implemented using an existing mature preparation device, and may be compatible well with an existing preparation process, simple in process implementation, easy to implement, high in a production efficiency, low in a production cost, and high in a yield.

The display substrate provided by this embodiment, by arranging the transfer lines of the sub-data lines connecting with the data lines in the first bezel region, or arranging in the first bezel region and the second bezel region, or arranging in the first bezel region, the second bezel region and the first display region, a large number of traces can be avoided to be concentratively arranged in the display region, thereby ensuring the display effect of the display region. Furthermore, by disposing the transfer lines at a position away from the second display region, the light transmission rate of the second display region can be improved, and the occurrence of diffraction and glare phenomena can be prevented.

At least one embodiment of the present disclosure further provides a display apparatus which includes the display substrate as described above.

Figure 36:
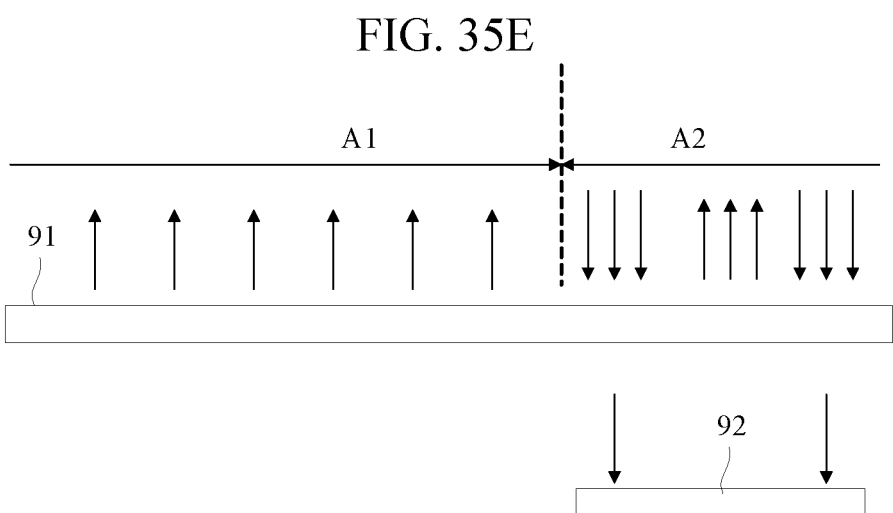
FIG. 36 is a schematic diagram of a display apparatus according to at least one embodiment of the present disclosure.

FIG. 36 is a schematic diagram of a display apparatus according to at least one embodiment of the present disclosure. As shown in FIG. 36, a display apparatus is provided in this embodiment, which includes a display substrate 91 and a photosensitive sensor 92 located on a light exit side of a display structure layer away from the display substrate 91. The photosensitive sensor 92 is located on a side of the non-display surface of the display substrate 91. An orthographic projection of the photosensitive sensor 92 on the display substrate 91 is overlapped with an orthographic projection of the first display region A1. For example, the photosensitive sensor 92 may be a camera.

In some exemplary implementations, the display substrate 91 may be a flexible OLED display substrate, a QLED display substrate, a Micro-LED display substrate or a Mini-LED display substrate. The display apparatus may be any product or component with a display function, such as an OLED display, a mobile phone, a tablet, a television, a display, a laptop, a digital photo frame, a navigator, and so on, which is not limited in the embodiments of the present disclosure.

The drawings of the present disclosure only involve structures involved in the present disclosure, and other structures may refer to conventional designs. The embodiments in the present disclosure, i.e., features in the embodiments, may be combined with each other to obtain new embodiments if there is no conflict. Those of ordinary skills in the art should understand that modifications or equivalent replacements of the technical solutions of the present disclosure may be made without departing from the spirit and scope of the technical solutions of the present disclosure, and shall all fall within the scope of the claims of the present disclosure.

The invention claimed is:

1. A display substrate, comprising:

a base substrate, comprising a display region and a peripheral region located on a periphery of the display region, wherein the display region comprises a first display region and a second display region, the first display region is located on at least one side of the second display region; the peripheral region comprises a signal access region located on a side of the display region along a first direction;

a plurality of first pixel circuits, a plurality of second active pixel circuits, and a plurality of first light-emitting elements located in the first display region;

a plurality of second light-emitting elements located in the second display region; wherein at least one first pixel circuit of the plurality of first pixel circuits is electrically connected with at least one first light-emitting element of the plurality of first light-emitting elements, and the at least one first pixel circuit is configured to drive the at least one first light-emitting element to emit light; at least one second active pixel circuit of the plurality of second active pixel circuits is electrically connected with at least one second light-emitting element of the plurality of second light-emitting elements, and the at least one second active pixel circuit is configured to drive the at least one second light-emitting element to emit light; and at least one first data line, comprising a first sub-data line and a second sub-data line; wherein the first sub-data line is electrically connected with a plurality of first pixel circuits arranged along the first direction, and the second sub-data line is electrically connected with a plurality of second active pixel circuits arranged along the first direction; the first sub-data line and the second sub-data line are electrically connected through a first transfer line, and the first transfer line is located in the peripheral region and located between the signal access region and the display region, wherein the signal access region comprises a drive Integrated Circuit (IC) region and the drive IC region is disposed with a drive IC, wherein the peripheral region further comprises: a first trace lead-out region, a bending region, and a second trace lead-out region that are located on a side of the signal access region close to the display region, the first trace lead-out region, the bending region, and the second trace lead-out region are sequentially disposed along a side away from the display region, and the first transfer line is located in the first trace lead-out region or the second trace lead-out region.

2. The display substrate according to claim 1, wherein the first transfer line extends along a second direction; and the second direction intersects with the first direction.

3. The display substrate according to claim 1, wherein the at least one first data line further comprises: a third sub-data line; the third sub-data line is located on a side of the second display region away from the signal access region in the first direction; the third sub-data line is electrically connected with a plurality of first pixel circuits arranged along the first direction; and the third sub-data line is electrically connected with the second sub-data line through a second transfer line.

4. The display substrate according to claim 3, wherein the first pixel circuits with which the third sub-data line is electrically connected is in a same column as the first pixel circuits with which the first sub-data line is electrically connected.

5. The display substrate according to claim 3, wherein the second transfer line is located in the first display region; or, the second transfer line is located in a second bezel region, and the second bezel region is located on a side of the display region away from the signal access region in the first direction.

6. The display substrate according to claim 1, further comprising: a plurality of dummy pixel circuits located in the first display region; a second sub-data line of the at least one first data line is at least partially overlapped with the plurality of dummy pixel circuits, and a plurality of second active pixel circuits electrically connected with the second sub-data line and the plurality of dummy pixel circuits overlapped with the second sub-data line are sequentially arranged along the first direction.

7. The display substrate according to claim 1, wherein the second sub-data line of the at least one first data line comprises a first trace and a second trace, the first trace is electrically connected with the second trace, the second trace is located on a side of the first trace away from the base substrate, and an orthographic projection of the first trace on the base substrate is overlapped with an orthographic projection of the second trace on the base substrate.

8. The display substrate according to claim 1, further comprising: at least one fourth data line, wherein the fourth data line comprises a fourth sub-data line and a fifth sub-data line; the fourth sub-data line is electrically connected with a plurality of first pixel circuits arranged along the first direction, and the fifth sub-data line is electrically connected with a plurality of second active pixel circuits arranged along the first direction; the fourth sub-data line and the fifth sub-data line of the fourth data line are electrically connected through a third transfer line; the third transfer line is located in the first display region.

9. The display substrate according to claim 8, wherein the display substrate comprises a plurality of fourth data lines, a plurality of third transfer lines electrically connected with the plurality of fourth data lines have a same length.

10. The display substrate according to claim 8, wherein the third transfer line extends along a second direction, and the second direction intersects with the first direction.

11. The display substrate according to claim 10, wherein at least one third transfer line comprises a first connection part and an extension part, a first end of the first connection part is electrically connected with the fourth sub-data line, a second end of the first connection part is electrically connected with the fifth sub-data line, and one end of the extension part is electrically connected with the second end of the first connection part.

12. The display substrate according to claim 8, wherein the third transfer line is electrically connected with a first pixel circuit closest to the second display region in the plurality of first pixel circuits electrically connected with the fourth sub-data line.

13. The display substrate according to claim 8, wherein at least two third transfer lines in the first direction are arranged between two adjacent rows of pixel circuits in the first display region.

14. The display substrate according to claim 8, wherein in the first display region, at least one row of pixel circuits is arranged between two adjacent third transfer lines in the first direction.

15. The display substrate according to claim 8, wherein lengths of a plurality of third transfer lines are gradually increased along a direction away from a side of the second display region in the first direction.

16. The display substrate according to claim 1, wherein the second display region has a first center line in a second direction, and a first sub-data line close to the first center line is electrically connected with a second sub-data line close to the second display region; or, a first sub-data line close to the first center line is electrically connected with a second sub-data line away from the second display region; the second direction intersects with the first direction.

17. The display substrate according to claim 1, wherein the first transfer line is located on a side of the first data line away from the base substrate.

18. The display substrate according to claim 1, further comprising: a multiplexing circuit configured to transmit data signals to the first sub-data line and the second sub-data line in a time division manner.

19. A display apparatus, comprising the display substrate according to claim 1, and a photosensitive sensor located on a side of a non-display surface of the display substrate, wherein an orthographic projection of the photosensitive sensor on the display substrate is overlapped with the first display region of the display substrate.

* * * * *